US012218166B2

(12) United States Patent
Kao et al.

(10) Patent No.: US 12,218,166 B2
(45) Date of Patent: Feb. 4, 2025

(54) CSI WITH CONTROLLABLE ISOLATION STRUCTURE AND METHODS OF MANUFACTURING AND USING THE SAME

(71) Applicant: Taiwan Semiconductor Manufacturing Co., Ltd., Hsinchu (TW)

(72) Inventors: Min-Feng Kao, Chiayi (TW); Dun-Nian Yaung, Taipei (TW); Jen-Cheng Liu, Hsin-Chu (TW); Wen-Chang Kuo, Tainan (TW); Shih-Han Huang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 344 days.

(21) Appl. No.: 17/372,888

(22) Filed: Jul. 12, 2021

(65) Prior Publication Data

US 2022/0336505 A1 Oct. 20, 2022

Related U.S. Application Data

(60) Provisional application No. 63/176,465, filed on Apr. 19, 2021.

(51) Int. Cl.
*H01L 27/14* (2006.01)
*H01L 27/146* (2006.01)

(52) U.S. Cl.
CPC .... *H01L 27/1463* (2013.01); *H01L 27/14623* (2013.01); *H01L 27/14636* (2013.01); *H01L 27/1464* (2013.01); *H01L 27/14685* (2013.01)

(58) Field of Classification Search
CPC ........... H01L 27/1463; H01L 27/14623; H01L 27/1464
See application file for complete search history.

(56) References Cited

U.S. PATENT DOCUMENTS

2005/0221601 A1 10/2005 Kawano
2010/0244175 A1 9/2010 Park
2015/0255495 A1* 9/2015 Park .................... H01L 27/1464
2018/0151615 A1* 5/2018 Weh .................... H01L 27/1464
2019/0096929 A1 3/2019 Chiang et al.
2020/0350345 A1 11/2020 Hiramatsu
2020/0402854 A1 12/2020 Shigetoshi
2021/0168336 A1* 6/2021 Kim .................... H04N 25/617

FOREIGN PATENT DOCUMENTS

JP 2005294577 A 10/2005
JP 2019145737 A 8/2019
WO 2019093150 A1 5/2019

* cited by examiner

*Primary Examiner* — Mounir S Amer
*Assistant Examiner* — Alexander Belousov
(74) *Attorney, Agent, or Firm* — Eschweiler & Potashnik, LLC

(57) ABSTRACT

A metal grid within a trench isolation structure on the back side of an image sensor is coupled to a contact pad so that a voltage on the metal grid is continuously variable with a voltage on the contact pad. One or more conductive structures directly couple the metal grid to a contact pad. The conductive structures may bypass a front side of the image sensor. A bias voltage on the metal grid may be varied through the contact pad whereby a trade-off between reducing cross-talk and increasing quantum efficiency may be adjusted dynamically in accordance with the application of the image sensor, its environment of use, or its mode of operation.

20 Claims, 56 Drawing Sheets

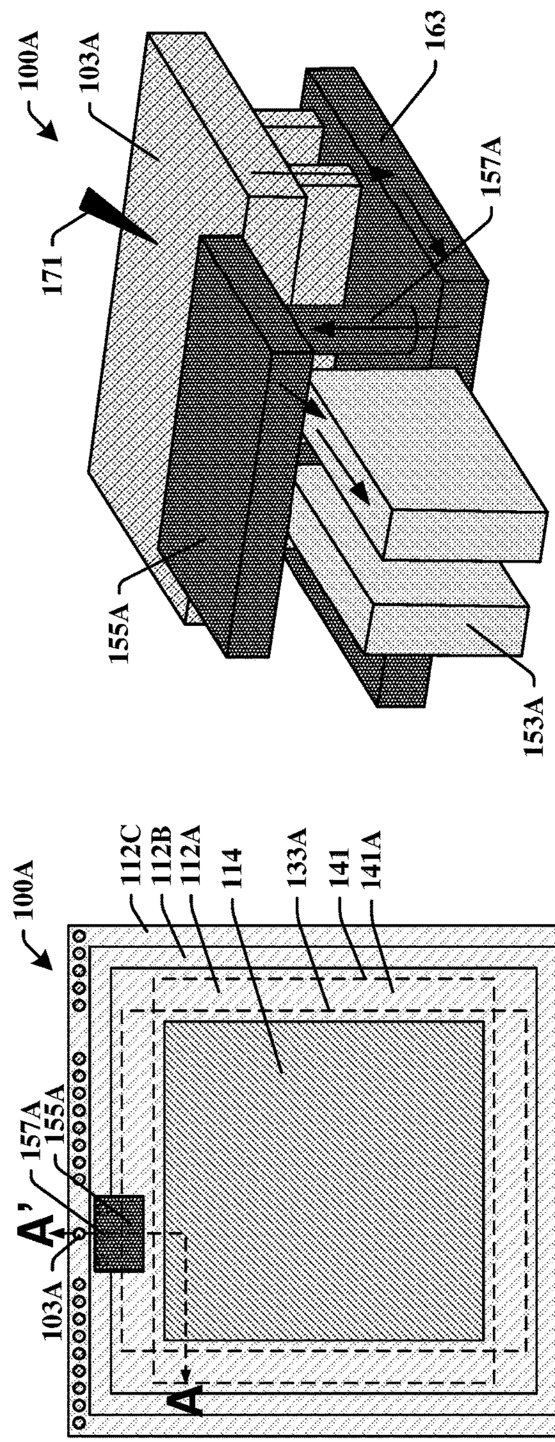
Fig. 1C
Fig. 1B
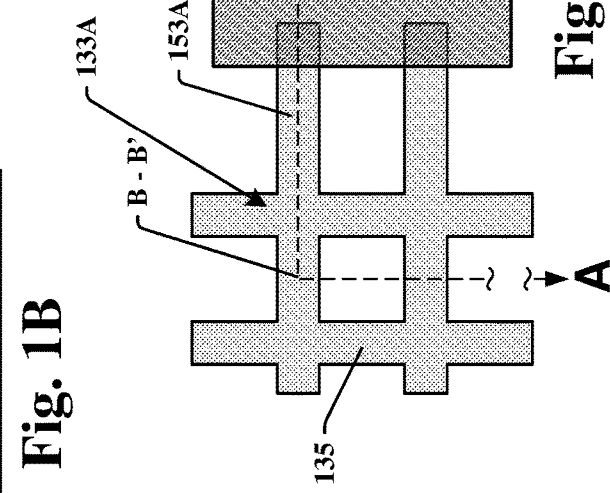
Fig. 1D

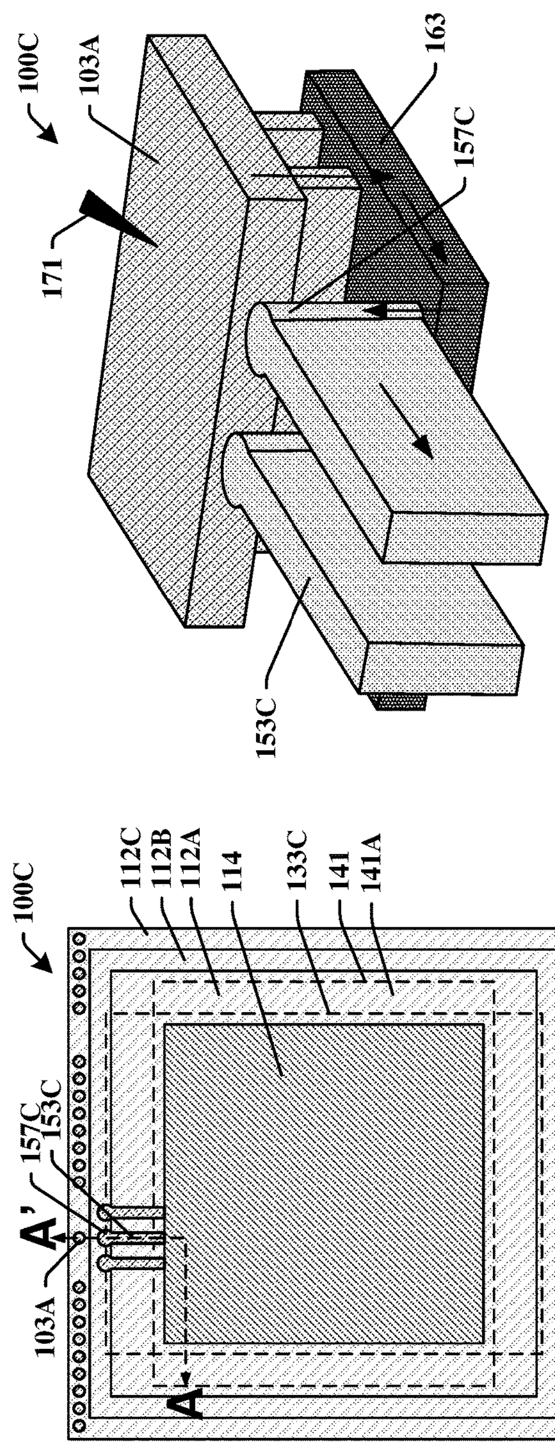
Fig. 3C
Fig. 3B
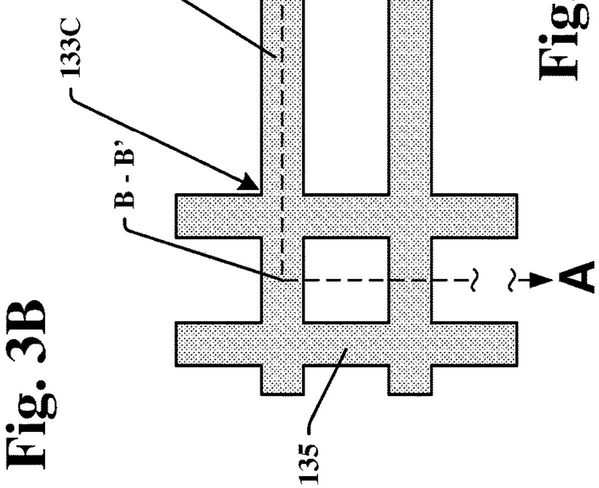
Fig. 3D

CSI WITH CONTROLLABLE ISOLATION STRUCTURE AND METHODS OF MANUFACTURING AND USING THE SAME

REFERENCE TO RELATED APPLICATION

This application claims the benefit of U.S. Provisional Application No. 63/176,465, filed on Apr. 19, 2021, the contents of which are incorporated herein by reference in their entirety.

BACKGROUND

Integrated circuits (IC) comprising image sensors are used in a wide range of modern-day electronic devices, such as cameras and cell phones. Complementary metal-oxide semiconductor (CMOS) devices have become popular IC image sensors. Compared to charge-coupled devices (CCD), CMOS image sensors (CIS) are increasingly favored due to low power consumption, small size, fast data processing, a direct output of data, and low manufacturing cost. As IC's shrink in size, the small pixel sizes in CMOS devices are desirable. With smaller pixel sizes, cross-talk between pixels may be a concern where unique solutions can improve the performance of CIS with small pixel sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B illustrates a layout for the IC device of FIG. 1A.

FIG. 1C illustrates the structures of the IC device of FIG. 1A through which the in-substrate metal grid is coupled to the contact pad.

FIG. 1D illustrates a layout of the in-substrate metal grid and the structures that couple the in-substrate metal grid to the contact pad in the IC device of FIG. 1A.

FIG. 3B illustrates a possible layout for the IC device of FIG. 3A.

FIG. 3C illustrates the structures of the IC device of FIG. 3A through which the in-substrate metal grid is coupled to the contact pad.

FIG. 3D illustrates a layout of the in-substrate metal grid and the structures that couple the in-substrate metal grid to the contact pad in the IC device of FIG. 3A.

DETAILED DESCRIPTION

Figure 1A:
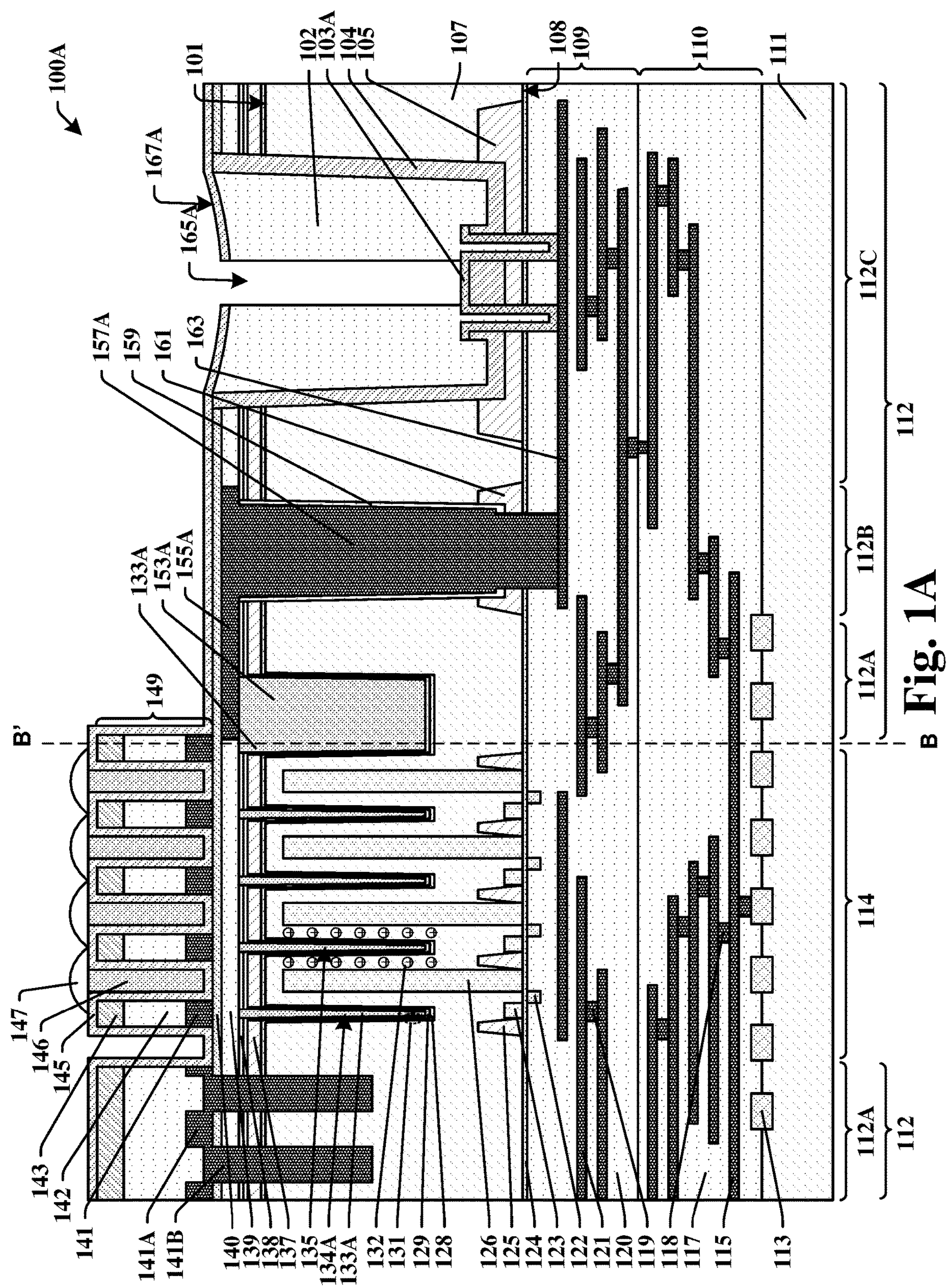
FIG. 1A illustrates a cross-sectional side view of an IC device according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors designed for back side illumination (BSI) are integrated circuit devices (ICs) that include an array of photodetector pixels and a back side isolation structure arranged within a semiconductor substrate. The back side isolation structure includes a grid of straight or curved segments that extend into the back side of semiconductor substrate and between adjacent photodetector pixels. The grid may include square-shaped or ring-shaped elements surrounding individual photodetector pixels. The back side isolation structure reduces cross-talk between the photodetector pixels. However, cross-talk may remain significant and increase as a pitch of the photodetector pixel array is reduced.

Cross-talk may be further reduced by incorporating a metal grid into the back side isolation structure and applying a suitable bias voltage to that metal grid. The in-substrate metal grid is separated from the semiconductor substrate by one or more dielectric layers. The metal grid may be referred to herein as an "in-substrate metal grid" to emphasize that the metal grid extends into the semiconductor substrate between adjacent photodetector pixels and to distinguish the in-substrate metal grid from a back side metal grid of the type entirely outside the semiconductor substrate. A suitable bias voltage is negative for a p-type semiconductor substrate and zero or positive for an n-type semiconductor substrate. The bias voltage reduces cross-talk; however, the bias voltage also reduces quantum efficiency for the image sensor. Accordingly, in selecting the bias voltage there is a trade-off between reducing cross-talk and increasing quantum efficiency.

The bias voltage may be provided by a suitable circuit within the IC device. In accordance with the present teachings, however, the IC device is configured for external analog control over the bias voltage on the in-substrate metal grid. In some embodiments, an in-substrate metal grid is coupled to a contact pad so that a voltage on the in-substrate metal grid is continuously variable with a voltage on the contact pad. In some embodiments, one or more conductive structures directly couple the in-substrate metal grid directly to the contact pad. In some embodiments, the one or more conductive structures are metal. These structures enable external control over the bias voltage on the in-substrate metal grid whereby the trade-off between reducing cross-talk and increasing quantum efficiency may be adjusted dynamically in accordance with the application of the IC device, its environment of use, or its mode of operation.

In some embodiments, the in-substrate metal grid is coupled to a back side contact pad through a connection that bypasses the front side of the substrate. This structure facilitates keeping voltages on the in-substrate metal grid close to voltages on the contact pad. In some embodiments, the back side contact pad is formed simultaneously with and comprises the same metal as a back side metal grid of the type entirely outside the semiconductor substrate. This structure simplifies manufacturing. In some embodiments, the back side contact pad is formed opposite an unused contact pad proximate a front side of the substrate. This allows the contact pad for the in-substrate metal grid to use much of the same structure as contact pads that make front side connections.

In some embodiments, the in-substrate metal grid is coupled to a back side contact pad through a metal interconnect on the front side of the substrate. In particular, the connection may include a metal pad within the metal interconnect that is electrically isolated from other circuits. In some embodiments, the contact metal pad is within an M1 metallization layer of the metal interconnect structure. The connection from the in-substrate metal grid to the metal interconnect may include a back side through substrate via (TSV). This structure allows the use of a standard contact pad of a type that forms connections with the metal interconnect.

In some embodiments, the in-substrate metal grid is coupled to the back side TSV through a conductive bridge formed on the back side. In these embodiments the conductive bridge and the back side TSV may be formed simultaneously. Accordingly, in some embodiments the conductive bridge and the back side TSV are a unitary structure of one material. This allows for a simplified manufacturing process.

In some embodiments, the in-substrate metal grid includes an extension that intersects the back side TSV within the semiconductor substrate. In these embodiments the in-substrate metal grid and the back side TSV may be formed simultaneously. Accordingly, in some embodiments the in-substrate metal grid and the back side TSV are a unitary structure of one material. This allows for a simplified manufacturing process and allows the connection between the in-substrate metal grid and the back side TSV to have a relatively large thickness.

In some embodiments, a back side TSV extends into the front side. In some embodiments, the back side TSV meets the metal pad or like structure in the metal interconnect. In some other embodiments, the back side TSV extends only part way through the substrate and the connection to the front side is completed by another structure. In some embodiments, that other structure is or comprises a front side TSV. In some embodiments, that other structure comprises a heavily doped region of the semiconductor substrate. These structures allow the back side TSV to have a lower aspect ratio, simplifying its formation. In some embodiments, the back side TSV has a hollow core. The hollow core allows the back side TSV to be formed with less metal deposition.

In some embodiments, the bias voltage on the in-substrate metal grid is selected in view of an application for the photodetector. The contact pad may be coupled to an external source that provides a predetermined bias voltage selected based on the application. In some embodiments, the bias voltage on the in-substrate metal grid is selected in view of the photodetector's mode of operation. The mode of operation may be user selectable, and the bias voltage varied accordingly. In some embodiments, the bias voltage is selected based on the environment of use. For example, the bias voltage may be selected based on a sensed temperature or ambient light level. In some embodiments, the bias voltage is selected dynamically in a feedback control loop. The control loop may adjust the bias voltage according to criteria for making tradeoffs between cross-talk and quantum efficiency.

FIG. 1A illustrates a cross-section of an image sensing IC device 100A according to some aspects of the present teachings. The IC device 100A include a first semiconductor substrate 107 having a pixel area 114 and a peripheral area 112. The peripheral area 112 may include an inner peripheral area 112A, a middle peripheral area 112B, and an outer peripheral area 112C. FIG. 1B provides a top-view illustration of the IC device 100A showing a possible layout of these areas on the IC device 100A. Photodetector pixels 126 may be disposed in the pixel area 114 and a contact pad 103A may be disposed in the outer peripheral area 112C.

The photodetector pixels 126 may comprise photodiodes or the like formed within the first semiconductor substrate 107. Floating diffusion regions 123 may be coupled to the photodetector pixels 126 through transfer gates 122. Front side isolation structures 125 may be disposed adjacent the floating diffusion regions 123. Although only one transfer gate 122 is illustrated for each of the photodetector pixels 126, a plurality of gates may be associated with each photodetector pixel 126.

A back side isolation structure 134A includes segments 135 that extend from the back side 101 into the first semiconductor substrate 107 and between adjacent photodetector pixels 126. The back side isolation structure 134A and its segments 135 include an in-substrate metal grid 133A separated from the first semiconductor substrate 107 by a dielectric liner structure 131 that may include a high-κ liner 128 and a second dielectric liner 129. Application of a negative bias voltage to the in-substrate metal grid 133A produces holes 132 in the first semiconductor substrate 107, which increase electrical isolation between adjacent photodetector pixels 126 if the first semiconductor substrate 107 is p-type.

The in-substrate metal grid 133A includes a segment 153A extending from the pixel area 114 and into the inner peripheral area 112A. The segment 153A has the same structure as the segments 135. The cross-section of FIG. 1A follows a line A-A' shown in FIG. 1D. The line A-A' bends at a point B-B' of FIG. 1D, which is the line B-B' of FIG. 1A. As a result of that bend, the cross-sectional view of FIG. 1A cuts across the lengths of most of the illustrated segments 135 but extends along a length of the segment 153A.

A back side TSV 157A extends through the first semiconductor substrate 107 from the back side 101 to the front side 108. The back side TSV 157A is a back side TSV in that it is formed on the back side 101 as is evident from the back side TSV 157A becoming narrower as it extends from the back side 101 to the front side 108. The back side TSV 157A is separated from the first semiconductor substrate 107 by a dielectric liner 159 and is coupled to the in-substrate metal grid 133A by a conductive bridge 155A on the back side 101.

The conductive bridge 155A is above the first semiconductor substrate 107. In some embodiments, the conductive bridge 155A is above the back side TSV 157A and the in-substrate metal grid 133A. In some embodiments, the conductive bridge 155A and the back side TSV 157A comprise a unitary structure of one composition. In some embodiments, the conductive bridge 155A is separated from the first semiconductor substrate 107 by at least the dielectric layers of the dielectric liner structure 131. The conductive bridge 155A may be further separated from the first semiconductor substrate 107 by one or more of a high-K capping layer 137, a second capping layer 138, or thicker versions of these layers to the extent they are part of the dielectric liner structure 131. In some embodiments, the conductive bridge 155A is inset within a thick oxide layer 139. In some embodiments, the conductive bridge 155A and the thick oxide layer 139 have the same thickness.

The back side TSV 157A is coupled to a contact pad 103A through a first metal interconnect 109 disposed on the front side 108. In some embodiments, the connection is made through a metal pad 163 within the first metal interconnect 109. As shown in FIG. 1C, the metal pad 163, the back side TSV 157A, and the conductive bridge 155A collectively couple the contact pad 103A directly to the in-substrate metal grid 133A whereby a voltage on the in-substrate metal grid 133A is continuously variable with an applied voltage 171 on the contact pad 103A. A negative bias applied to the contact pad 103A will result in a negative voltage on the in-substrate metal grid 133A with an analog relationship between the voltages.

The in-substrate metal grid 133A may have any suitable composition. In some embodiments, the in-substrate metal grid 133A comprises aluminum (Al), tungsten (W), or the like. In some embodiments, the in-substrate metal grid 133A comprises aluminum (Al) or the like. Aluminum and tungsten have the advantage of being amenable to deposition in high aspect ratio openings. Aluminum (Al) is particularly suitable for the in-substrate metal grid 133A due to its high conductivity.

The conductive bridge 155A may have any suitable composition. In some embodiments, the conductive bridge 155A comprises copper (Cu), aluminum (Al), or the like. In some embodiments, the conductive bridge 155A comprises copper (Cu) or the like. Copper (Cu), aluminum (Al) have a high conductivity that allows the conductive bridge 155A to be relatively thin. Copper (Cu) is particularly suitable due to its high conductivity.

Returning to FIG. 1A, the contact pad 103A may be disposed in the first semiconductor substrate 107 proximate the front side 108 and be spaced apart from the back side 101 by a pad dielectric 102. The pad dielectric 102 may be covered by an encapsulation layer 145. Access to the contact pad 103A from the back side 101 may be provided by an opening 165A that extends through the encapsulation layer 145 and the pad dielectric 102. The encapsulation layer 145 may have a concave surface 167A that facilitates bonding to the contact pad 103A through the opening 165A. The contact pad 103A may be considered a back side contact pad in that it is open to the back side 101 and adapted for bonding on the back side 101, however, the contact pad 103A is proximate the front side 108 and may extend into a first interlevel dielectric 120 on the front side 108.

Color filters 146 and micro-lenses 147 may be disposed directly above the photodetector pixels 126. A composite grid 149 may be disposed directly above the back side isolation structure 134A and between the color filters 146. The composite grid 149 may include a back side metal grid 141, a dielectric grid 142, and a hard mask grid 143. The encapsulation layer 145 may extend over the composite grid 149. The back side metal grid 141 reflects photons and improves separation of light between photodetector pixels 126.

As shown in FIGS. 1A and 1B, a portion 141A of the back side metal grid 141 extends laterally from the pixel area 114 to the inner peripheral area 112A. Within the inner peripheral area 112A, the back side metal grid 141 has ground bars 141B that extend into the first semiconductor substrate 107 to ground the back side metal grid 141. Like the back side metal grid 141, the in-substrate metal grid 133A extends across the pixel area 114 and into the inner peripheral area 112A, but at no point do the back side metal grid 141 and the in-substrate metal grid 133A touch. The ground bars 141B are in the inner peripheral area 112A at locations distinct from those of the segments 153A of the back side metal grid 141 and distinct from the location of the conductive bridge 155A. The back side TSVs 157A may be in the middle peripheral areas 112B and the contact pad 103A may be in the outer peripheral area 112C.

In addition to the first semiconductor substrate 107 and the first metal interconnect 109, the IC device 100A may include a second semiconductor substrate 111 and a second metal interconnect 110. A plurality of logic gates 113 may be disposed on the second semiconductor substrate 111. The second semiconductor substrate 111, the second metal interconnect 110, and associated devices may be manufactured separately from the first semiconductor substrate 107 and may provide image signal processing (ISP) circuitry, read and/or write circuitry, or other suitable circuitry for the operation of the photodetector pixels 126.

The first metal interconnect 109 comprises first wires 121 and first vias 119 in the first interlevel dielectric 120. These may be arranged as a plurality of metallization layer that may be referred as the M1 metallization layer, the M2 metallization layer, etc. in order of distance from the first semiconductor substrate 107. Any first wires 121 at the height of the transfer gates 122 may be referred to as an M0 metallization layer. The second metal interconnect 110 comprises second wires 115 and second vias 118 in a second interlevel dielectric 117. The connection between the back side TSV 157A and the contact pad 103A is shown being made in the M1 metallization layer, however, that connection may be made anywhere in the first metal interconnect 109, the second metal interconnect 110, or using both. The connection between the back side TSV 157A and the contact pad 103A is isolated from other circuits formed in the first metal interconnect 109 or the second metal interconnect 110.

Figure 2A:
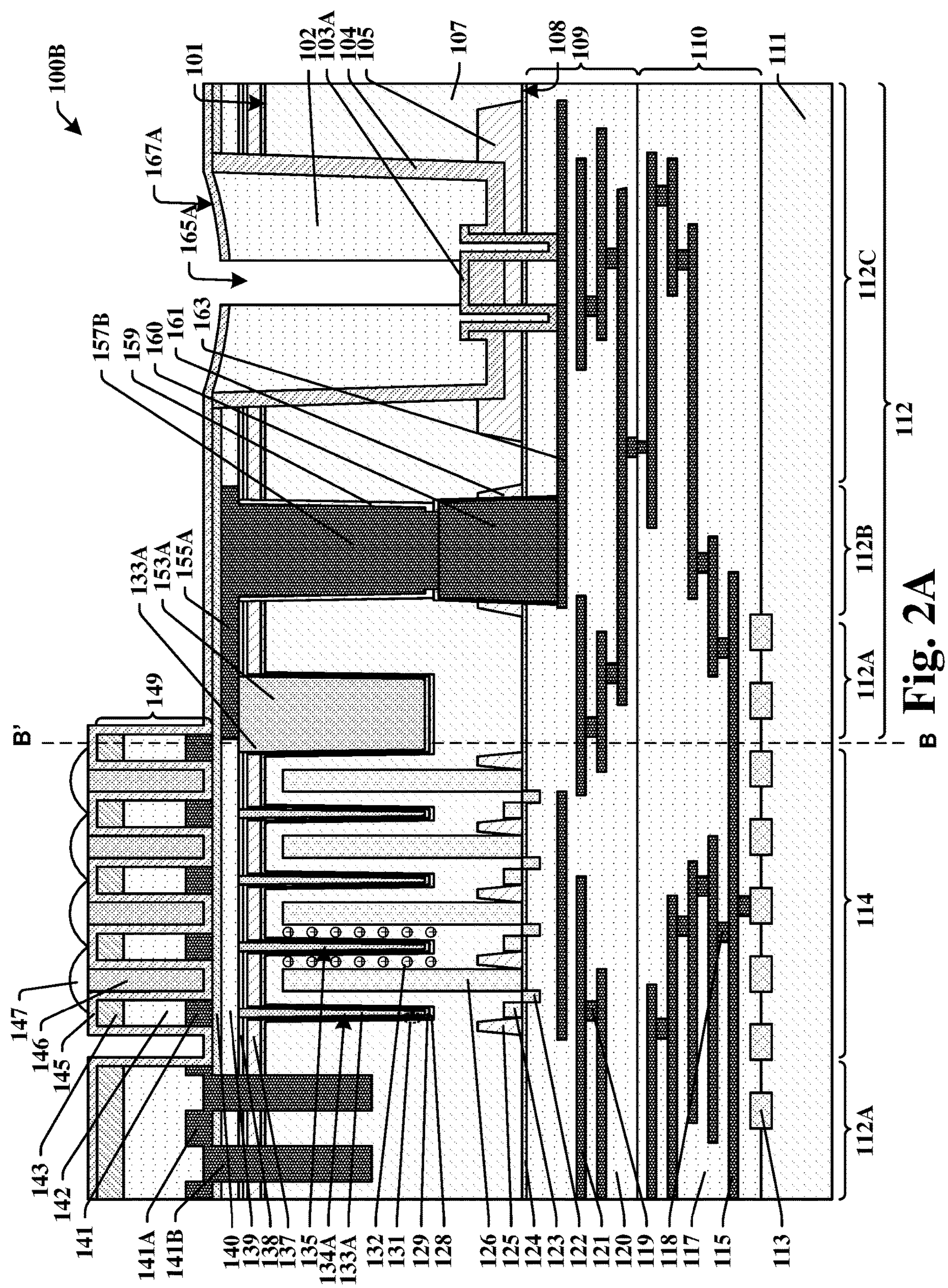
FIG. 2A illustrates a cross-sectional side view of an IC device according to some aspects of the present teachings.

FIG. 2A illustrates an image sensing IC device 100B according to some other aspects of the present teachings. The IC device 100B differs from the IC device 100A in that the IC device 100B has a front side TSV 160 opposite a back side TSV 157B. The back side TSV 157B is like the back side TSV 157A of FIG. 1A except that the back side TSV 157B extends only partway through the first semiconductor substrate 107. The conductive bridge 155A and the back side TSV 157B may be formed simultaneously and may be a unitary structure of one material. The front side TSV 160 completes a connection between the back side TSV 157B and the metal pad 163 or like structure in the first metal interconnect 109 or the second metal interconnect 110. The front side TSV 160 allows the first semiconductor substrate 107 to be thicker relative to a width of back side TSV 157B without the aspect ratio being such that the back side TSV 157B is difficult to fill. In the IC device 100B, the conductive bridge 155A, the back side TSV 157B, the front side TSV 160, and the metal pad 163 together provide a direct coupling between the contact pad 103A and the in-substrate metal grid 133A, whereby a negative bias applied to the contact pad 103A will result in a negative voltage on the in-substrate metal grid 133A with an analog relationship between the voltages.

Figure 2B:
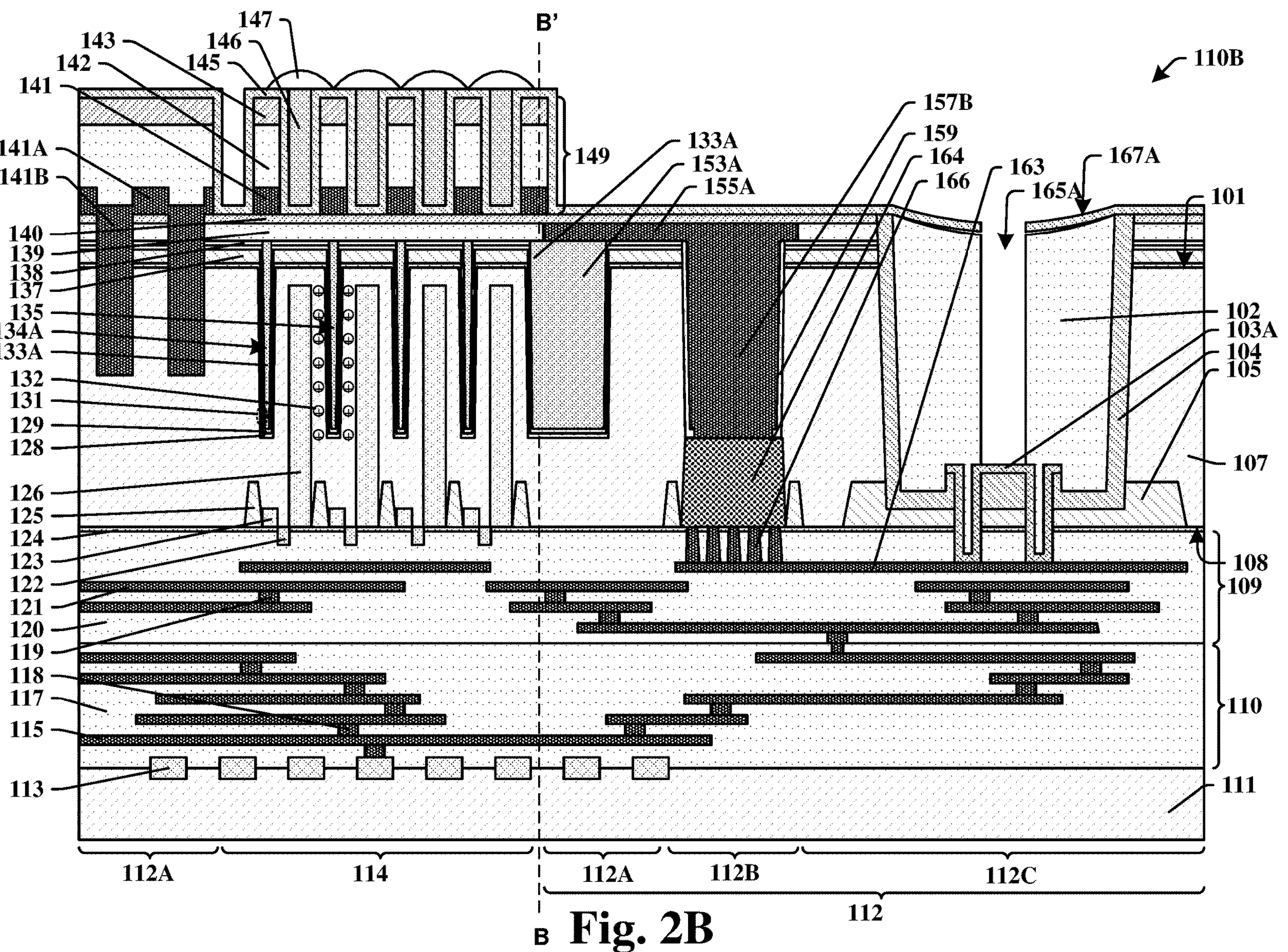
FIG. 2B illustrates a cross-sectional side view of an IC device according to some aspects of the present teachings.

A variety of structures may be used in place of the front side TSV 160 to make the connection between the back side TSV 157B and the metal pad 163. FIG. 2B illustrate an IC device 110B that illustrates one such variation. In the IC device 110B, the connection is made with a heavily doped area 164 of the first semiconductor substrate 107 and a plurality of vias 166. The heavily doped area 164 may have the same doping type as the first semiconductor substrate 107.

Figure 3A:
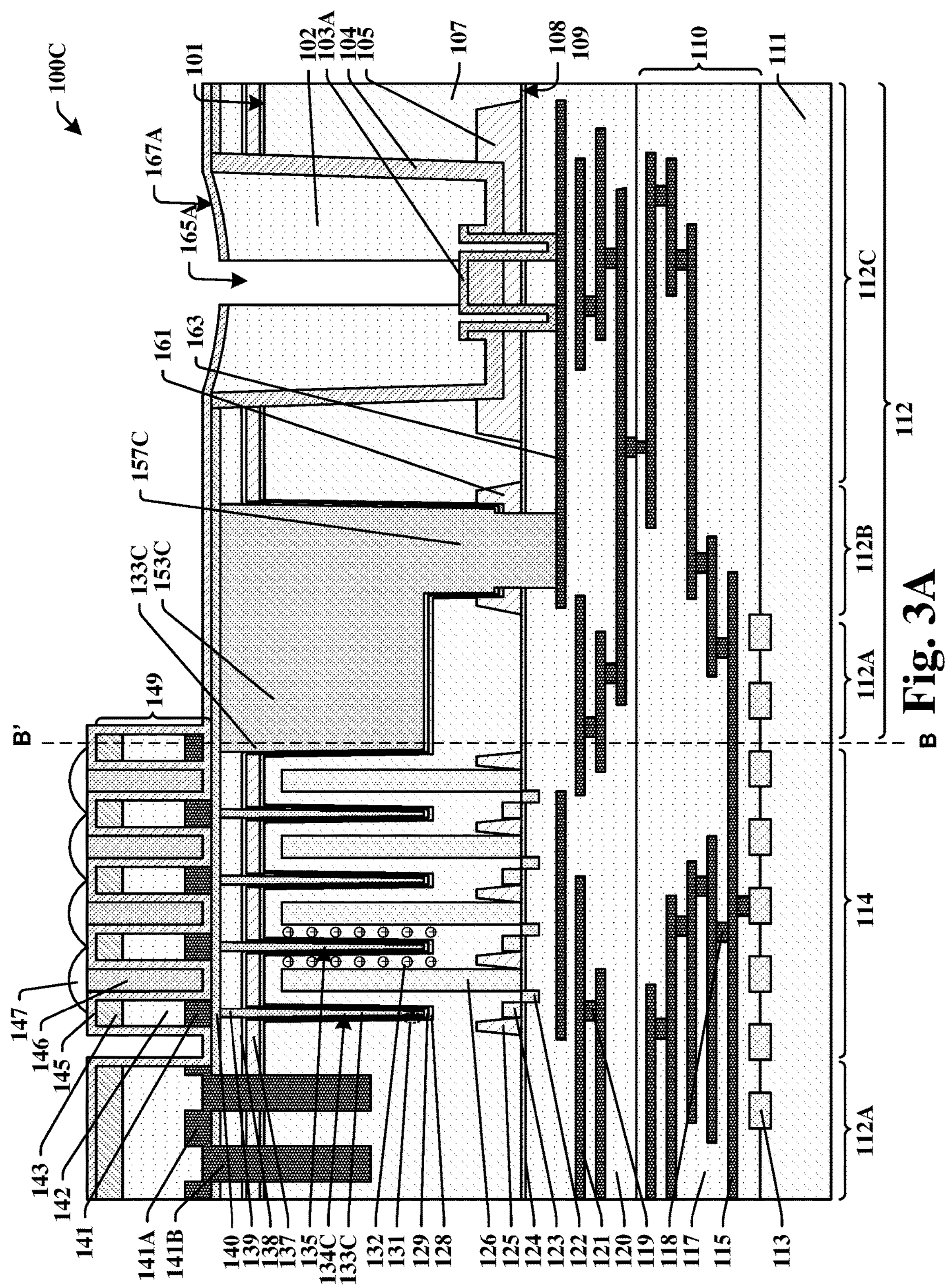
FIG. 3A illustrates a cross-sectional side view of an IC device according to some aspects of the present teachings.

FIGS. 3A-3D illustrate an image sensing IC device 100C according to some other aspects of the present teachings. The IC device 100C differs from the IC device 100A in that it lacks the conductive bridge 155A. Instead, the IC device 100C has an isolation structure 134C comprising an in-substrate metal grid 133C having a segment 153C that extends across the inner peripheral area 112A to the middle peripheral area 112B where the segment 153C intersects a back side TSV 157C within the first semiconductor substrate 107. In some embodiments, the back side TSV 157C and the segment 153C are unitary, whereby the back side TSV 157C has a same composition as the in-substrate metal grid 133C. As shown in FIG. 3C, in the IC device 100C the metal pad 163, and the back side TSV 157C together provide a direct coupling between the contact pad 103A and the in-substrate metal grid 133C whereby a voltage on the in-substrate metal grid 133C is continuously variable with a voltage on the contact pad 103A. A negative bias applied to the contact pad 103A will result in a negative voltage on the in-substrate metal grid 133C with an analog relationship between the voltages.

Figure 4:
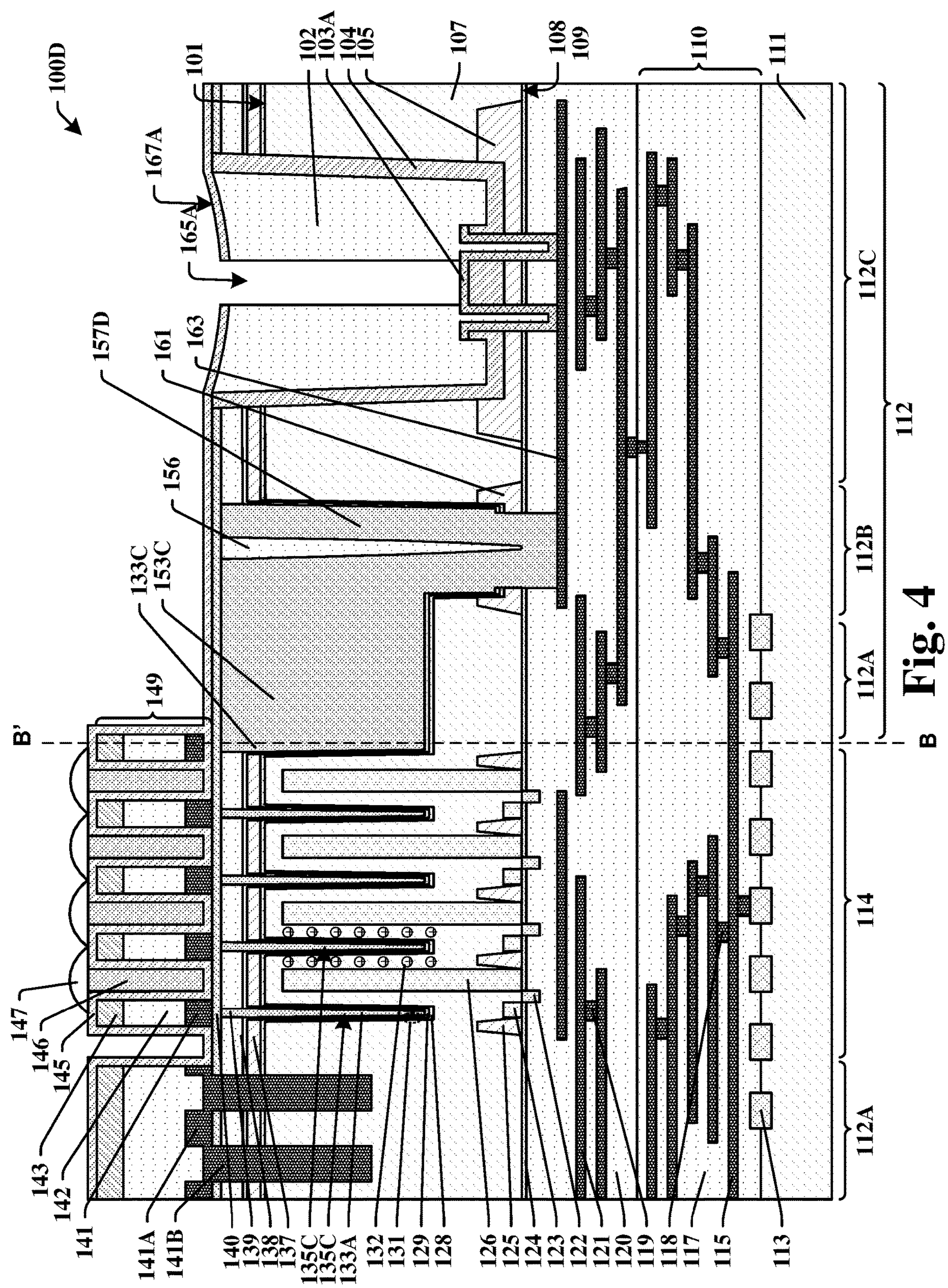
FIG. 4 illustrates a cross-sectional side view of an IC device according to some aspects of the present teachings.

FIG. 4 illustrates an image sensing IC device 100D according to some other aspects of the present teachings. The IC device 100D is like the IC device 100C but differs in that the IC device 100D has a back side TSV 157D in place of the back side TSV 157C. The back side TSV 157D has fill 156 in an area centrally located within the back side TSV 157D. In some embodiments, the fill 156 is dielectric. In some embodiments, the fill 156 extends from the back side 101 but stops short of the front side 108. In some embodiments, the back side TSV 157D and the segment 153C are unitary, whereby the back side TSV 157D has a same composition as the in-substrate metal grid 133C. The IC device 100D may function as well as the IC device 100C but without the metal of the back side TSV 157D having been applied as thickly as the metal of the back side TSV 157C of FIG. 3A. The back side TSV 157A of FIGS. 1A-1D may also be formed with a thinner metal deposition and have a central area occupied by the fill 156.

Figure 5:
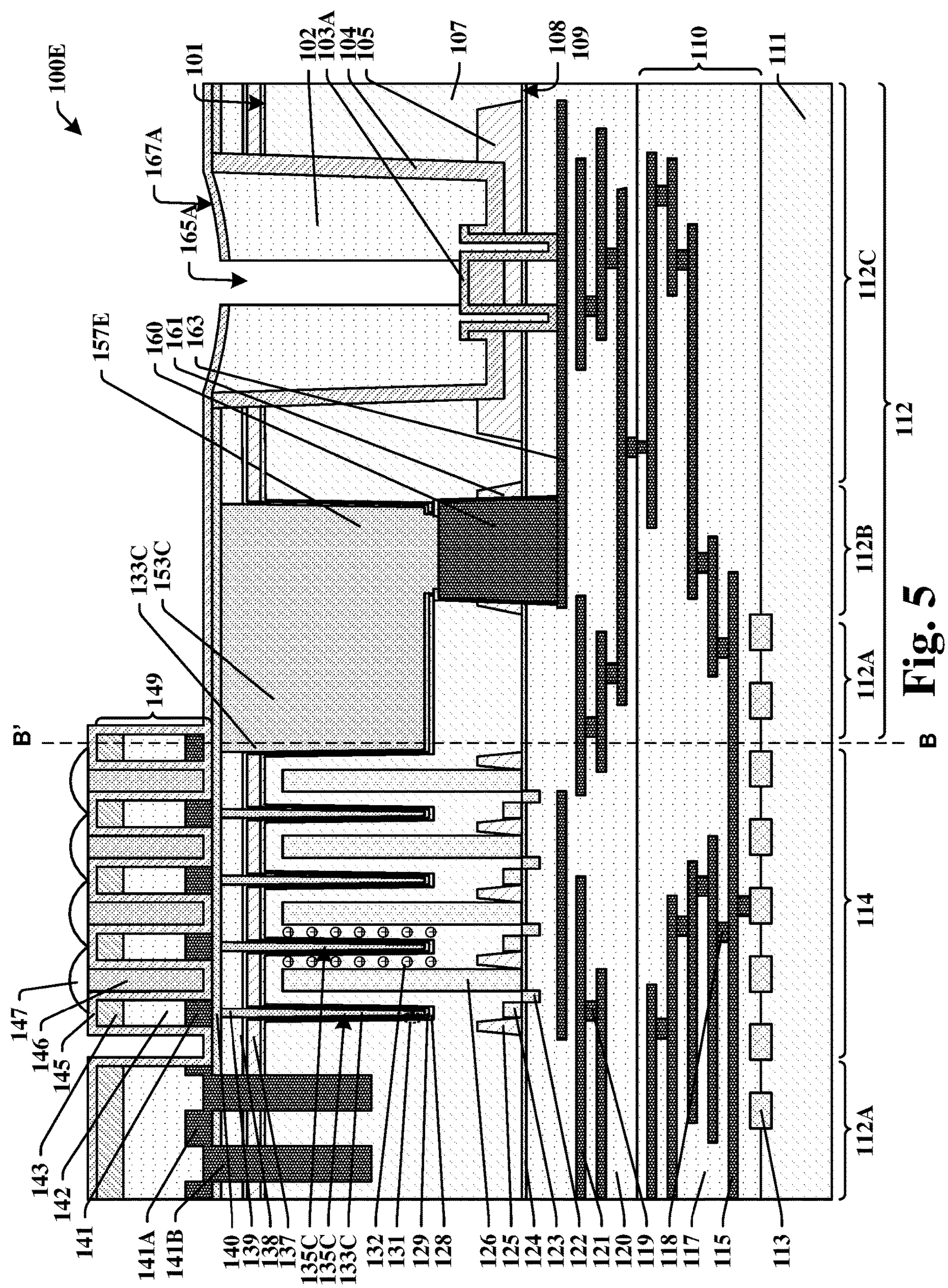
FIG. 5 illustrates a cross-sectional side view of an IC device according to some aspects of the present teachings.
Figure 6A:
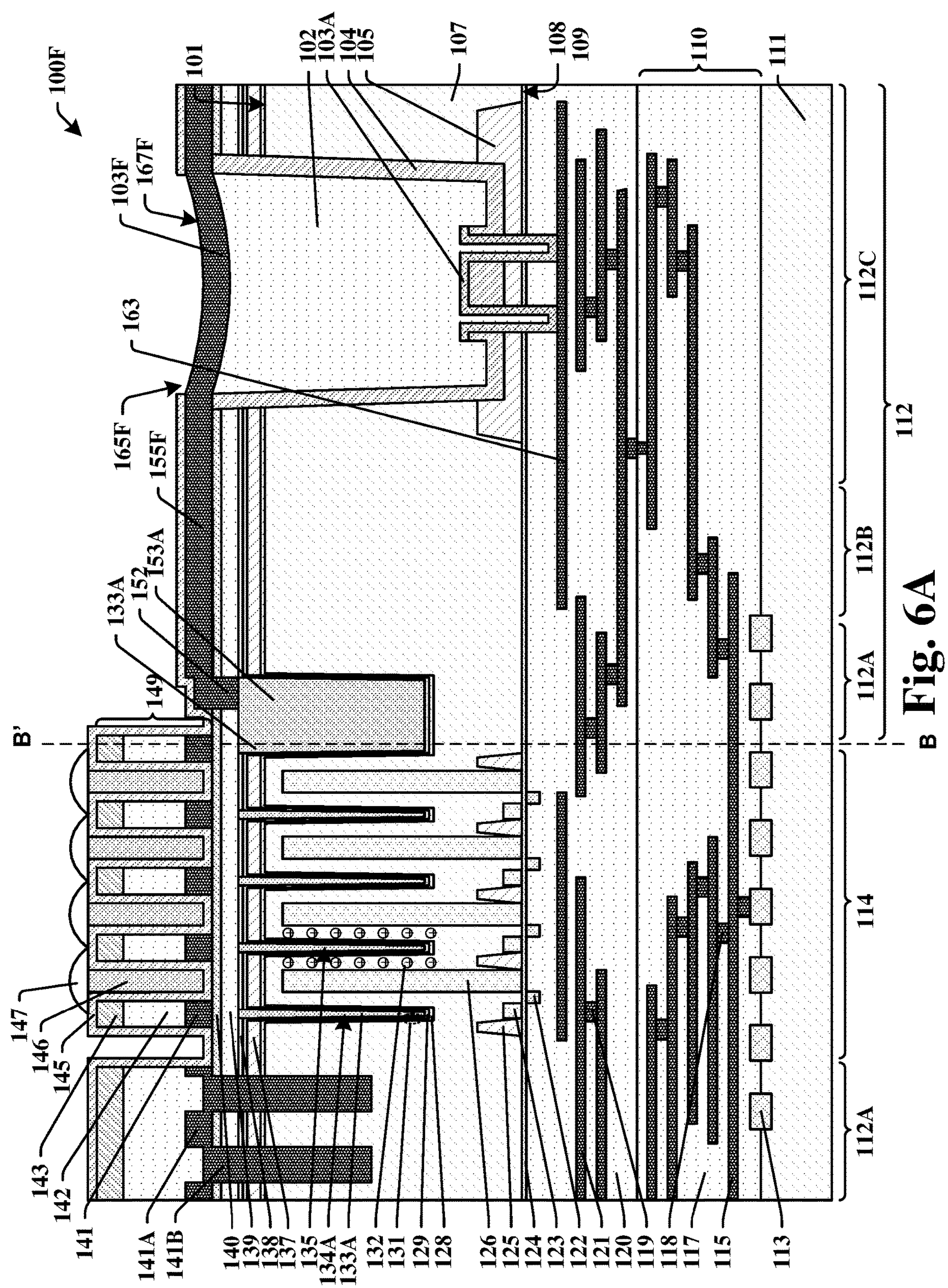
FIG. 6A illustrates a cross-sectional side view of an IC device according to some aspects of the present teachings.
Figure 6C:
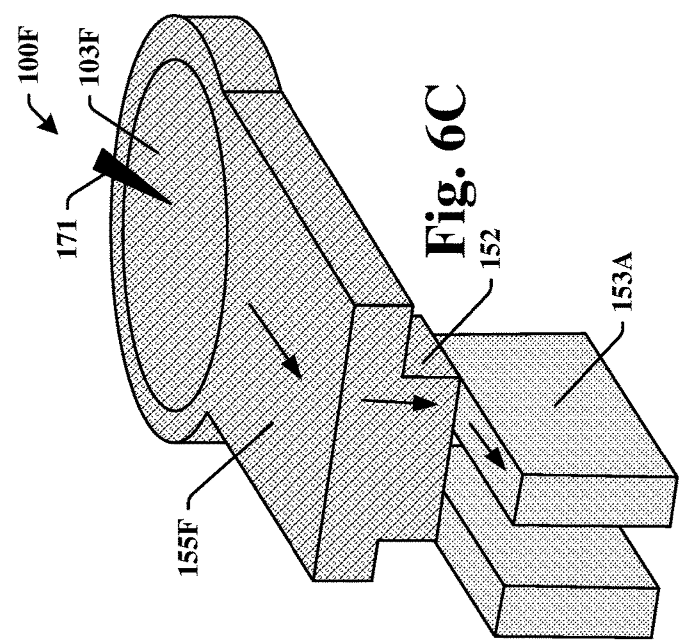
FIG. 6C illustrates the structures of the IC device of FIG. 6A through which the in-substrate metal grid is coupled to the contact pad.
Figure 6D:
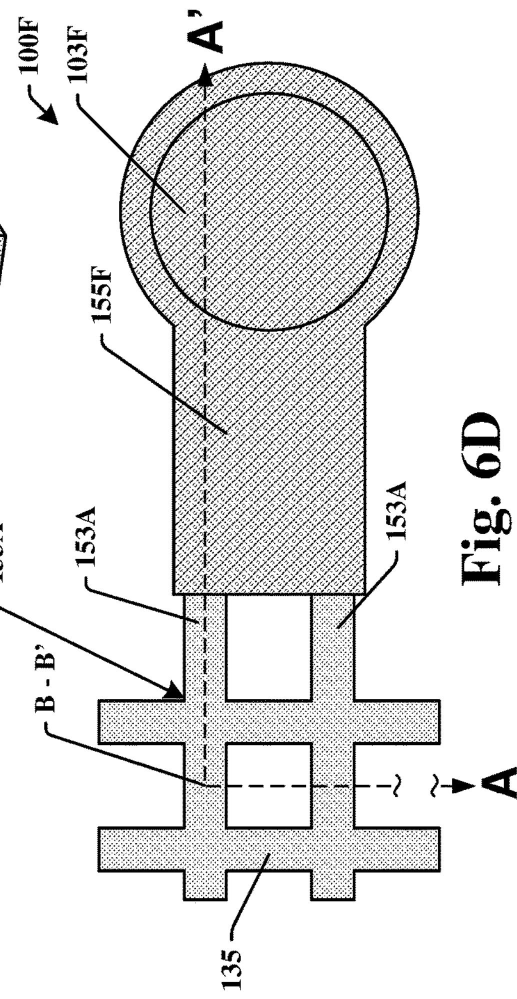
FIG. 6D illustrates a layout of the in-substrate metal grid and the structures that couple the in-substrate metal grid to the contact pad in the IC device of FIG. 6A.
Figure 6B:
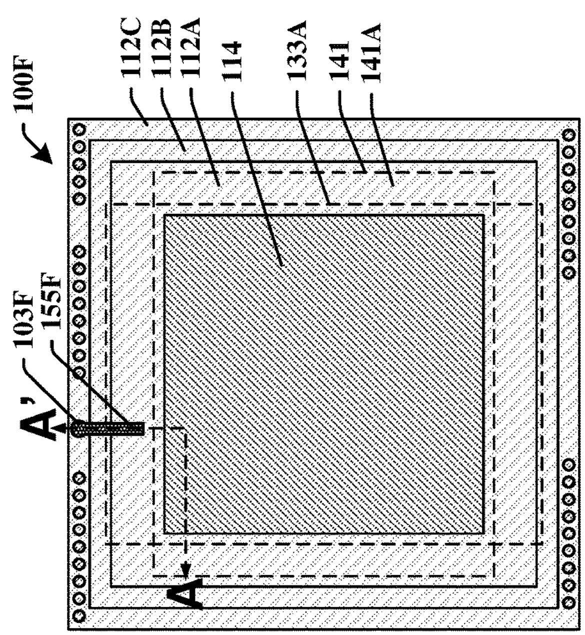
FIG. 6B illustrates a possible layout for the IC device of FIG. 6A.

FIG. 5 illustrates an image sensing IC device 100E according to some other aspects of the present teachings. The IC device 100E differs from the IC device 100C in that the IC device 100E has the front side TSV 160 opposite the back side TSV 157E. The front side TSV 160 completes a direct connection between the back side TSV 157E and the metal pad 163 or like structure in the first metal interconnect 109 or the second metal interconnect 110. Other suitable structures may be used in place of the front side TSV 160. In the IC device 100E, the back side TSV 157E, the front side TSV 160, and the metal pad 163 together provide a direct coupling between the contact pad 103A and the in-substrate metal grid 133C whereby a voltage on the in-substrate metal grid 133C is continuously variable with a voltage on the contact pad 103A.

FIGS. 6A-6D illustrate an IC device 100F according to some other aspects of the present teachings. The IC device 100F differs from the IC device 100A in that it uses a contact pad 103F that is disposed on the back side 101 and forms a direct connection between the in-substrate metal grid 133A and the contact pad 103F that bypasses the front side 108. The connection may be provided by a conductive bridge 155F that extends laterally from the contact pad 103F on the back side 101. Forming a direct connection between the in-substrate metal grid 133A and the contact pad 103F on the back side 101 provides a low resistance pathway through which a voltage on the in-substrate metal grid 133A may be tightly controlled. Avoiding the connections through the front side 108 may also eliminate process steps.

In some embodiments, the conductive bridge 155F is unitary with the contact pad 103F, whereby they have the same composition. In some embodiments, this composition is also a composition of the back side metal grid 141. In these embodiments, the back side metal grid 141, the conductive bridge 155F, and the contact pad 103F may be formed simultaneously. In some embodiments, a contact pad 103A is formed opposite the contact pad 103F and proximate the front side 108. The contact pad 103A that is opposite the contact pad 103F may be a dummy contact pad. The pad dielectric 102 may completely seal the dummy contact pad from the back side 101. The dummy contact pad may be formed simultaneously with other contact pads that are operable. The dummy contact pad structure may facilitate giving a desirable geometry to the contact pad 103F such as a concave surface 167F.

FIGS. 7A, 7B, and 8-33 are cross-sectional view illustrations exemplifying a method according to the present teachings of forming the IC device 100A. While FIGS. 7A and 7B through 33 are described with reference to various embodiments of a method, it will be appreciated that the structures shown in FIGS. 7A, 7B, and 8-33 are not limited to the method but rather may stand alone separate from the method. While FIGS. 7A, 7B, and 8-33 are described as a series of acts, it will be appreciated that the order of the acts may be altered in other embodiments. While FIGS. 7A, 7B, and 8-33 illustrate and describe a specific set of acts, some acts that are illustrated and/or described may be omitted in other embodiments. Further, acts that are not illustrated and/or described may be included in other embodiments. While the method of FIGS. 7A, 7B, and 8-33 is described in terms of forming the IC device 100A, the method and variants thereof may be used to form other IC devices according to the present teachings.

Figure 7A:
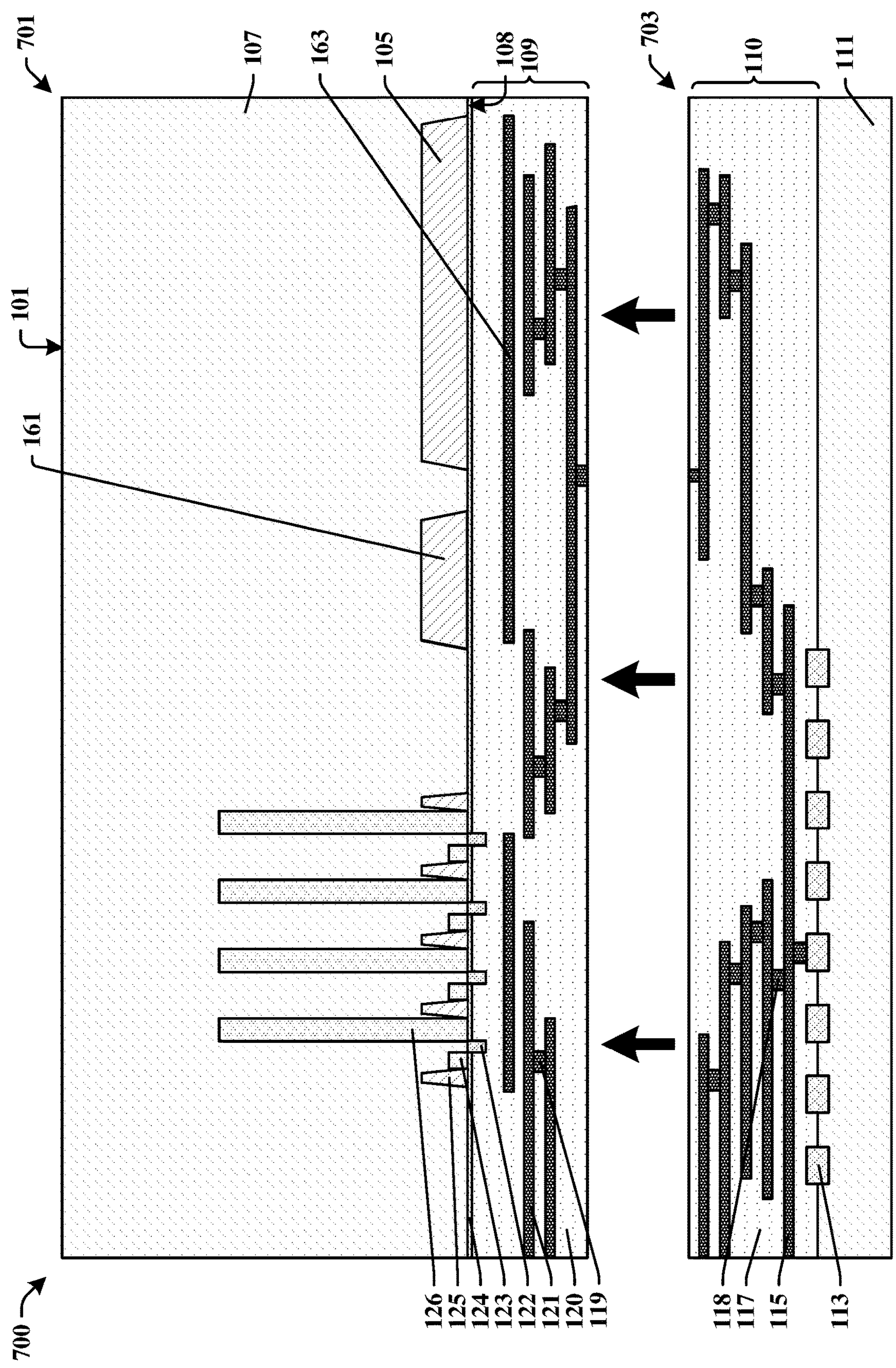
FIGS. 7A, 7B, and 8-33 are a series of cross-sectional view illustrations exemplifying a method of forming an IC device.

As shown by the cross-sectional view 700 of FIG. 7A, the method may begin with bonding together of a partially manufactured IC device 701 and a second IC device 703. Each of the IC device 701 and the second IC device 703 may have been subjected to front-end-of-line (FEOL) and back-end-of-line (BEOL) processing. In the IC device 701, FEOL processing provides the front side isolation structures 125, 161, and 105, the photodetector pixels 126, the floating diffusion regions 123, and the transfer gates 122. BEOL processing provides the first metal interconnect 109. In the second IC device 703, FEOL processing provides the logic gates 113 and like structures and BEOL processing provides the second metal interconnect 110. Bonding occurs between the first metal interconnect 109 may and the second metal interconnect 110. The bonding process may be fusion bonding, hybrid bonding, the like, or some other suitable bonding process. After bonding, the first semiconductor substrate 107 may be thinned from the back side 101 to provide a structure as illustrated by the cross-sectional view 710 of FIG. 7B.

Each of the first semiconductor substrate 107 and the second semiconductor substrate 111 may be or comprise a bulk silicon substrate, a silicon-on-insulator (SOI) substrate, the like, or some other suitable semiconductor substrate. In some embodiments an etch stop layer 124 is disposed directly on the front side 108. The etch stop layer 124 is a dielectric and may be an oxide, a carbide, a nitride, or the like. Each of the first interlevel dielectric 120 and the second interlevel dielectric 117 may be or comprise silicon oxide, a low-κ dielectric, an extremely low-κ dielectric, or the like. The first wires 121, the first vias 119, the second wires 115, the second vias 118, and the metal pad 163 may be copper (Cu), aluminum (Al), the like, or some other suitable metal. In some embodiments, the metal pad 163 is copper (Cu) or the like. The front side isolation structures 125, 161, and 105 may be shallow trench isolation structures, field oxide, or any other suitable type of isolation structure. The photodetector pixels 126, the floating diffusion regions 123, and the transfer gates 122 may constitute active-pixel sensors with pinned photodiodes, but the photodetector pixels 126 may be any type of photodetector that includes a photodiode.

Figure 7B:
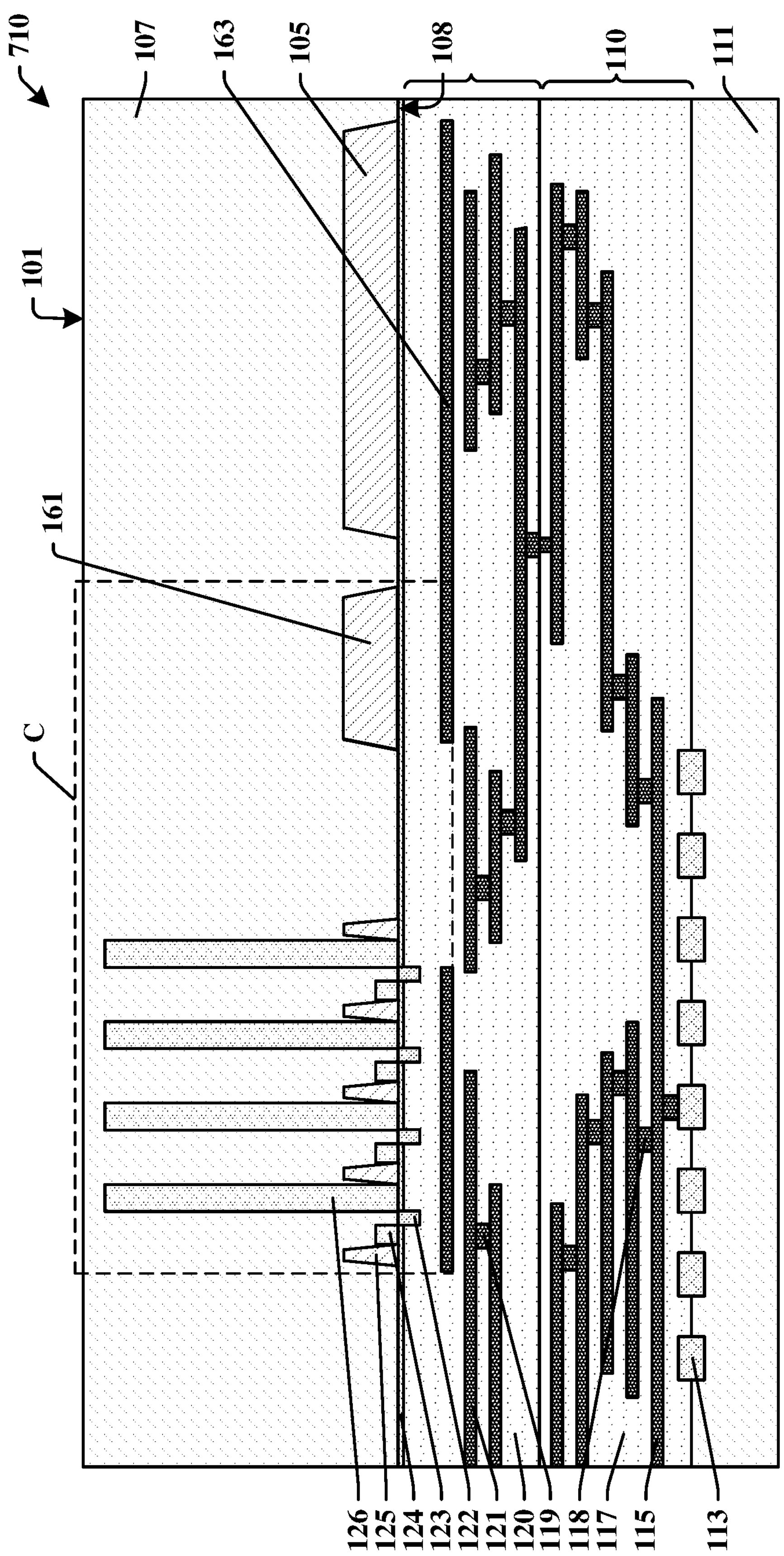

The cross-sectional views 800-1900 of FIGS. 8-19 all corresponds to the area C of the cross-sectional view 710 of FIG. 7B. As shown by the cross-sectional view 800 of FIG. 8, processing may continue with photolithography to form a mask 803 on the back side 101 and using the mask 803 to etch trenches 801 of width W1 in the first semiconductor substrate 107. It should be appreciated that the trench 801A, which extends into the inner peripheral area 112A, also has the width W1. The trench 801A occupies a wider space in the cross-sectional view 800 of FIG. 8 due to the cross-section extending along a length of the trench 801A as illustrated by the line A-A' of FIG. 1D. After etching the trenches 801, the mask 803 may be stripped.

Figure 9:
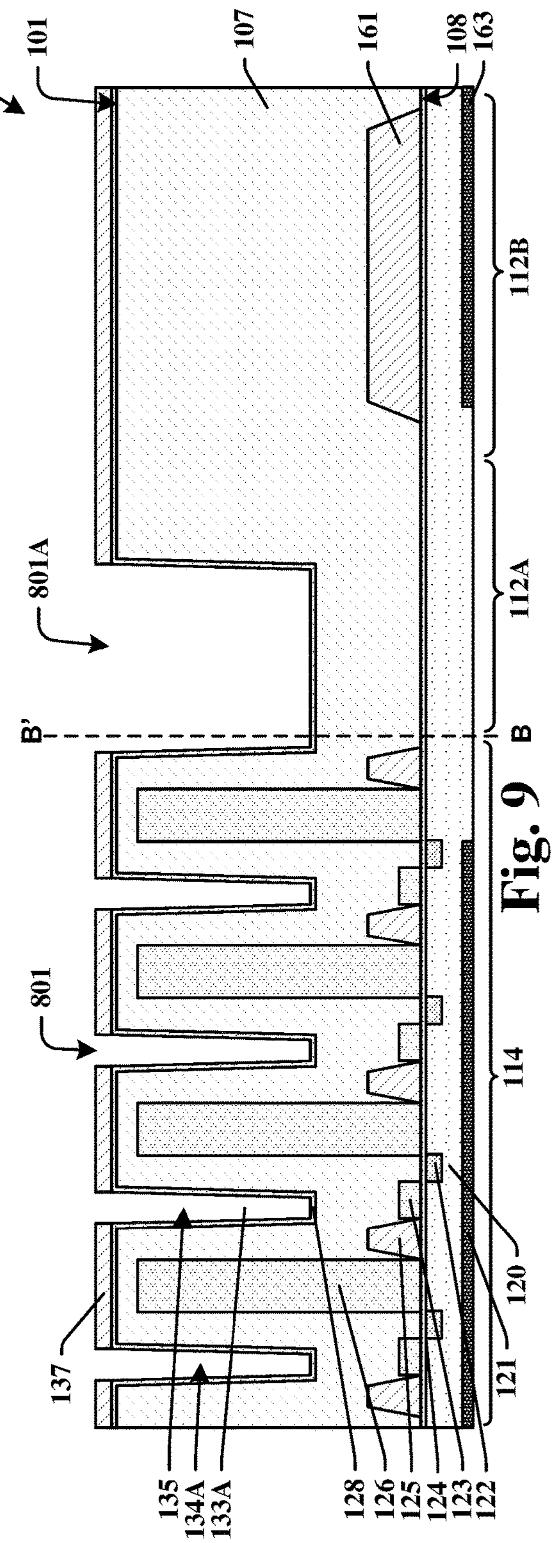

As shown by the cross-sectional view 900 of FIG. 9, the high-κ liner 128 and a high-κ capping layer 137 may be deposited in and between the trenches 801. In some embodiments, the high-κ liner 128 is deposited by a conformal deposition process. The conformal deposition process may be chemical vapor deposition (CVD) at a low rate, atomic layer deposition (ALD), the like, or some other suitable process. In some embodiments, the high-κ capping layer 137 is deposited by a non-conformal deposition process. The non-conformal may be a process with poor gap-filling ability, whereby little of the high-κ capping layer 137 deposits within the trenches 801. The non-conformal deposition process may be physical vapor deposition (PVD), CVD at a high rate, plasma enhanced CVD (PECVD), the like, or some other suitable process. The high-κ liner 128 and the high-κ capping layer 137 may each be hafnium oxide (HfO), aluminum oxide (AlO), zirconium oxide (ZrO), titanium oxide (TiO), strontium oxide (SrO), barium oxide (BaO), barium titanate ($BaTiO_3$), tantalum oxide ($Ta_2O_3$), lanthanum oxide ($La_2O_3$), yttrium oxide ($Y_2O_3$), the like, some other suitable high-κ dielectric(s), or a mixture thereof. The high-κ liner 128 and the high-κ capping layer 137 may have the same composition or different compositions. In some embodiments, the total thickness of the high-κ dielectrics within the trenches 801 is from about 50 Angstroms to about 250 Angstroms. In some embodiments, the total thickness of the high-κ liner 128, the high-κ capping layer 137, and any other high-κ dielectrics within the trenches 801 is from about 100 Angstroms to about 180 Angstroms. In some embodiments, a thickness of the high-κ capping layer 137 outside the trenches 801 is from about 300 Angstroms to about 700 Angstroms.

Figure 10:
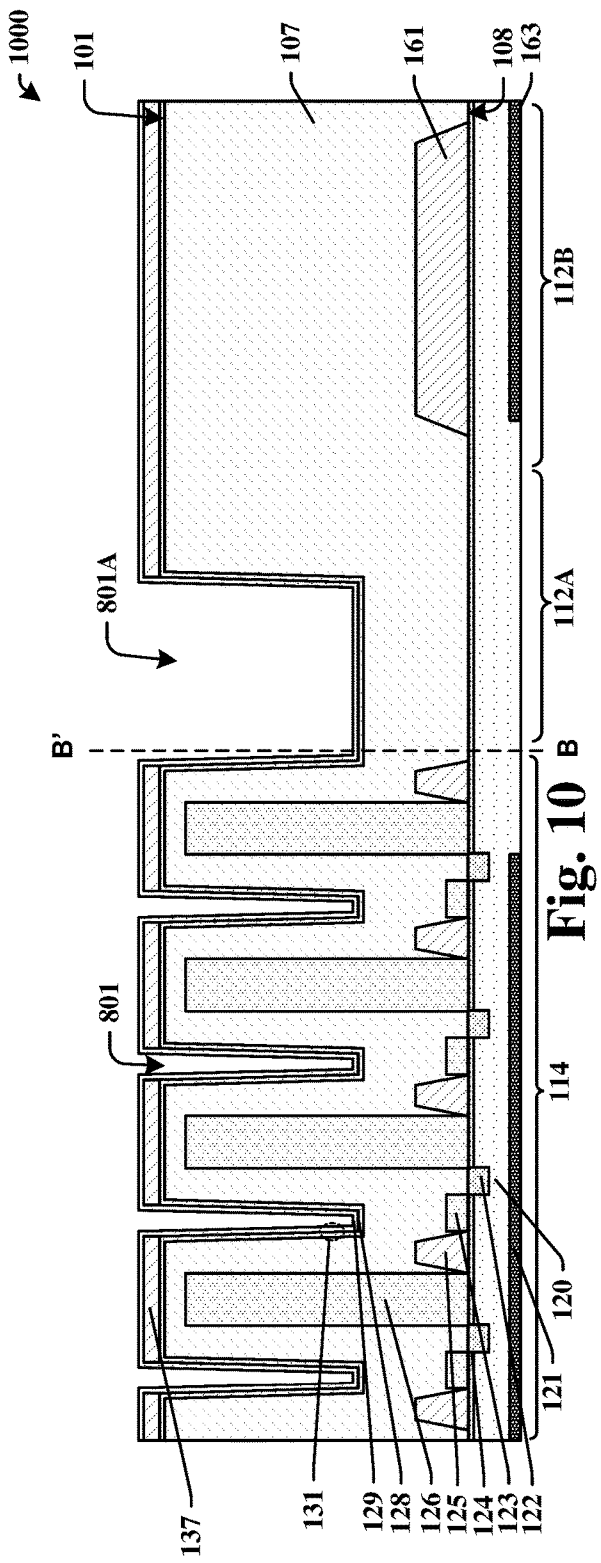

As shown by the cross-sectional view 1000 of FIG. 10, the second dielectric liner 129 may be deposited in and between the trenches 801. In some embodiments, the second dielectric liner 129 is deposited by a conformal deposition process such as ALD or the like. In some embodiments, the second dielectric liner 129 is an oxide or the like. In some embodiments, the second dielectric liner 129 has a thickness from about 50 Angstroms to about 300 Angstroms. In some embodiments, the second dielectric liner 129 has a thickness from about 150 Angstroms to about 250 Angstroms. It should be appreciated that the number, thickness, and order of the layers that make up the dielectric liner structure 131 within the trenches 801 may be varied widely.

Figure 11:
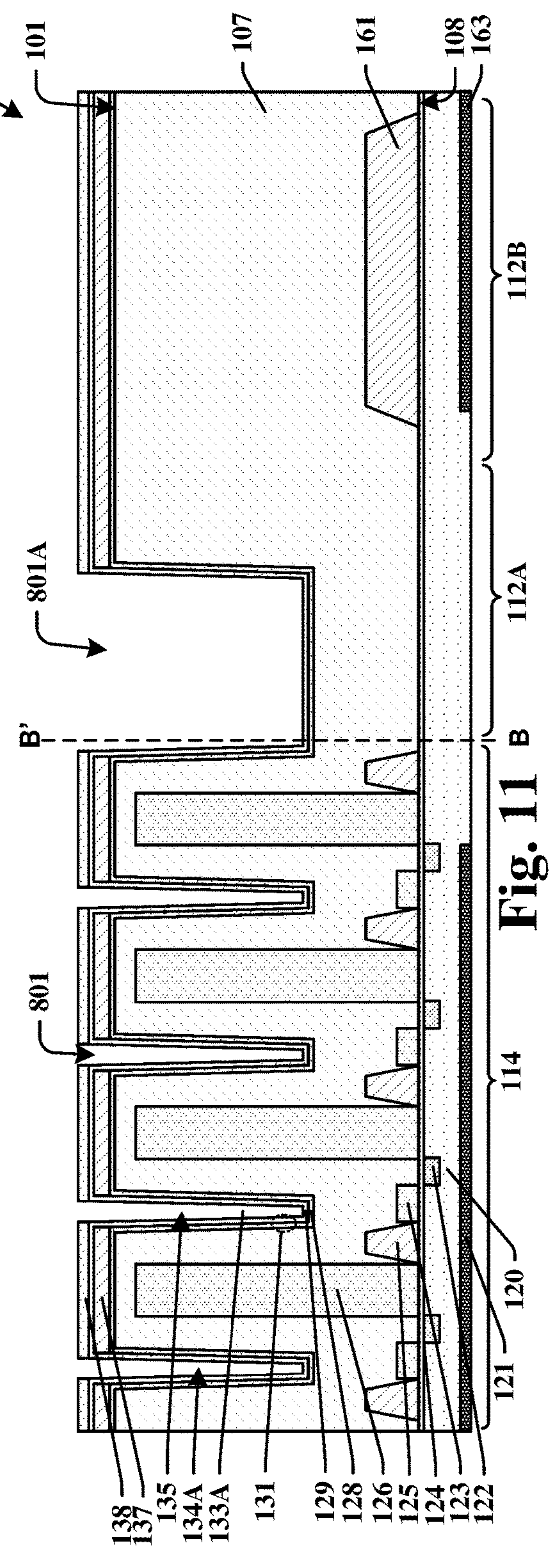

As shown by the cross-sectional view 1100 of FIG. 11, a second capping layer 138 may be formed. The second capping layer 138 may be deposited by a non-conformal deposition process such PECVD such that little of the second capping layer 138 deposits in the trenches 801 to add to the dielectric liner structure 131. In some embodiments, the second capping layer 138 is an oxide or the like. In some embodiments, the second capping layer 138 has a thickness from about 200 Angstroms to about 1500 Angstroms outside the trenches 801. In some embodiments, the second capping layer 138 has a thickness from about 300 Angstroms to about 700 Angstroms. The second capping layer 138 may have an overhang with respect to the trenches 801, but any such overhang does not affect the filling of the trenches 801 and is not shown in the illustrations.

Figure 12:
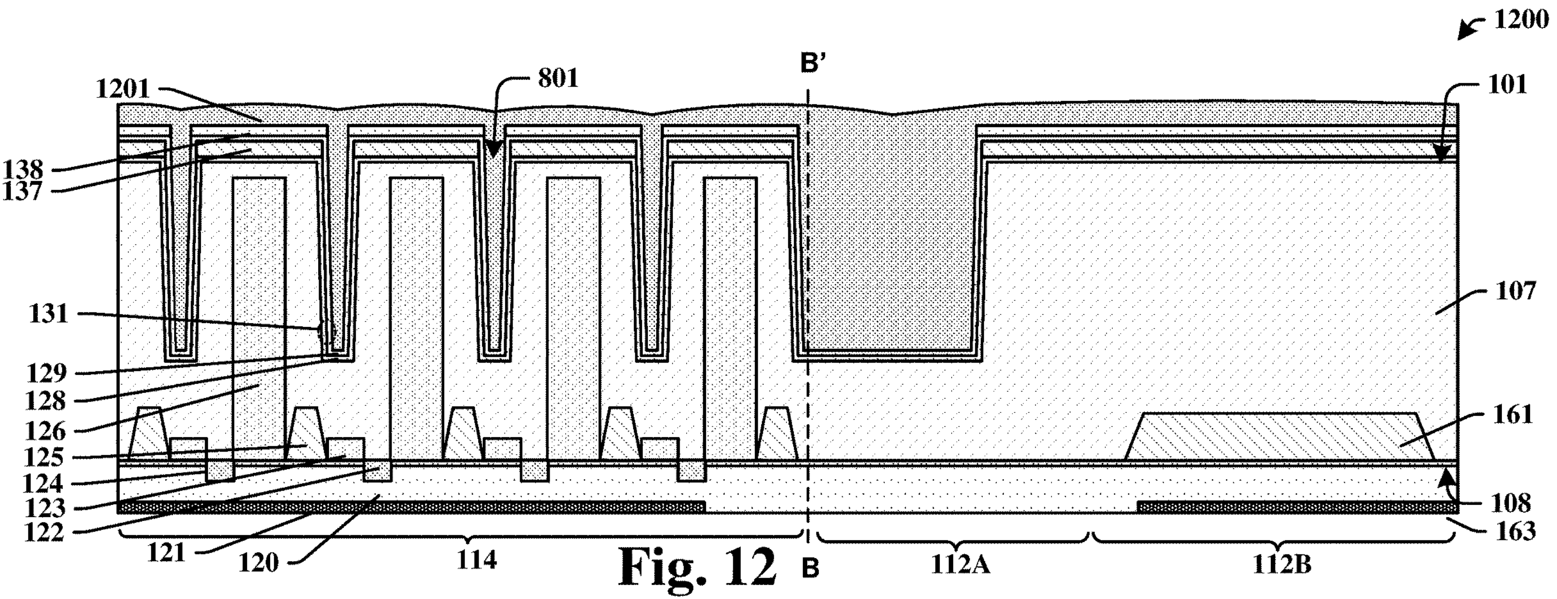

As shown by the cross-sectional view 1200 of FIG. 12, a conductive layer 1201 is deposited and fills the trenches 801. The conductive layer 1201 may be a metal that lends itself to a process with good gap fill. In some embodiments, the conductive material is tungsten (W), aluminum (Al), or the like. The conductive material may be deposited by CVD, PVD, electroplating, electroless plating, or the like. In some embodiments, a conductive liner is deposited before the conductive material. A conductive liner may be, for example, titanium nitride, tantalum, nitride, or the like. The conductive liner may be deposited to a thickness from about 20 Angstroms to about 100 Angstroms, e.g., 50 Angstroms. The conductive material may be deposited to a thickness from about 1000 Angstroms to about 3000 Angstroms.

Figure 13:
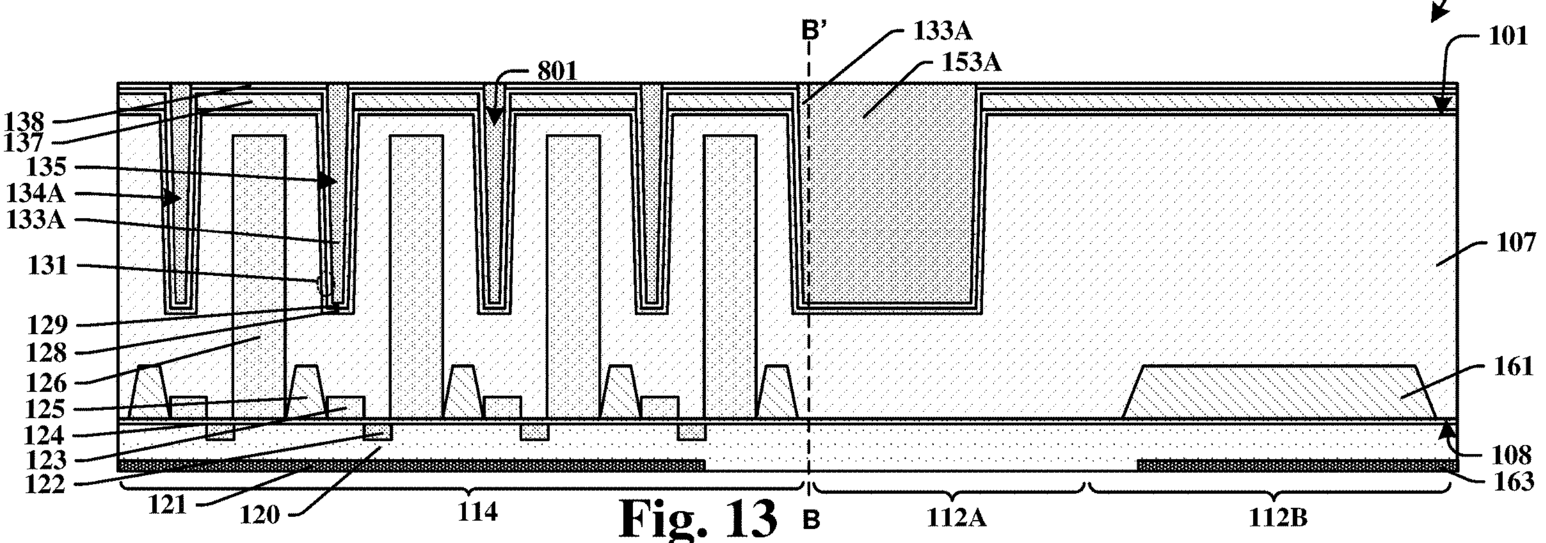

As shown by the cross-sectional view 1300 of FIG. 13, the conductive layer 1201 may be planarized. Planarization removes material outside the trenches 801. The planarization process may be chemical mechanical polishing (CMP), the like, or some other suitable planarization process. The remaining conductive material forms the in-substrate metal grid 133A. The in-substrate metal grid 133A together with the high-κ liner and the second dielectric liner 129 provides the back side isolation structure 134A, which include segments 135 extending between photodetector pixels 126 and the segment 153A that extends into the inner peripheral area 112A. In some embodiments, CMP reduces the second capping layer 138 to a thickness in the range from about 500 Angstroms to about 800 Angstroms. In some embodiments, CMP reduces the second capping layer 138 to a thickness in the range from about 200 Angstroms to about 500 Angstroms, e.g., about 400 Angstroms.

Figure 14:
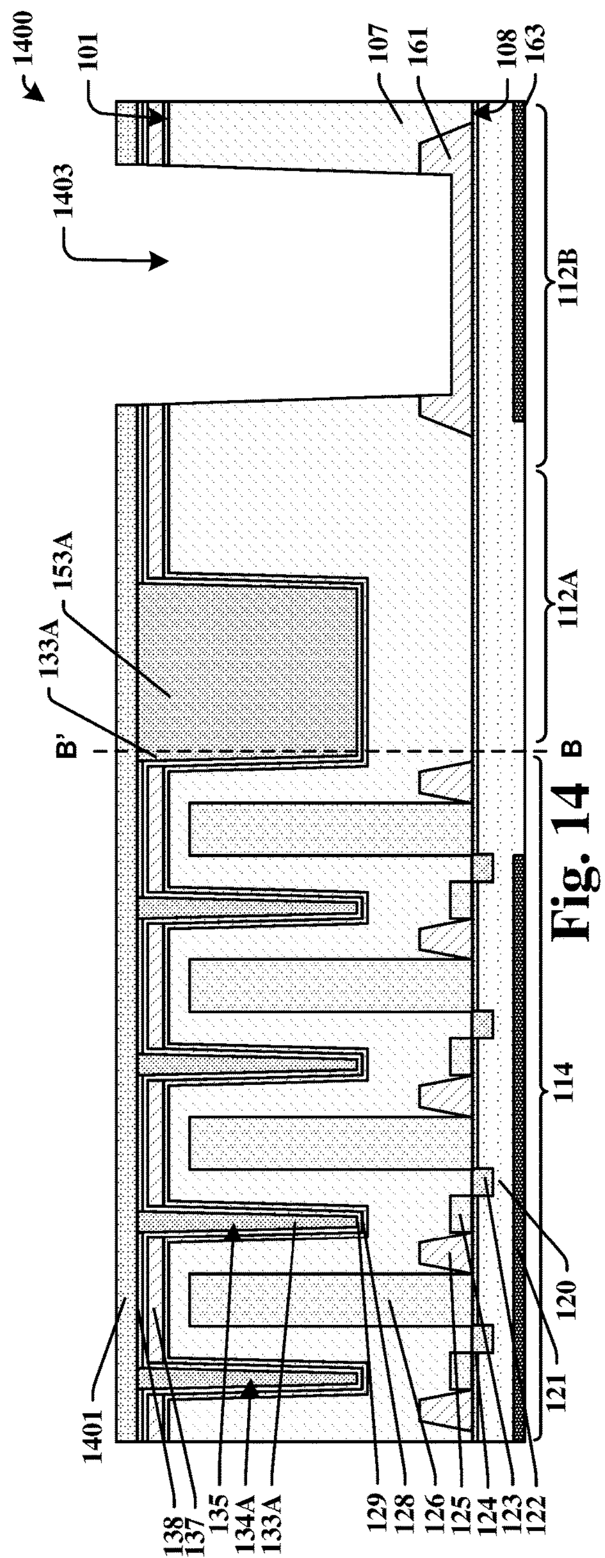

As shown by the cross-sectional view 1400 of FIG. 14, a mask 1401 may be formed by photolithography and used to etch a TSV opening 1403 in the first semiconductor substrate 107 within the middle peripheral area 112B. The etch may stop on the front side isolation structure 161. In some embodiments, the TSV opening 1403 has a width in the range from about 1 μm to about 5 μm. In some embodiments, the TSV opening 1403 has a width in the range from about 2 μm to about 3 μm, e.g., about 2.4 μm. After the etch, the mask 1401 may be stripped.

Figure 15:
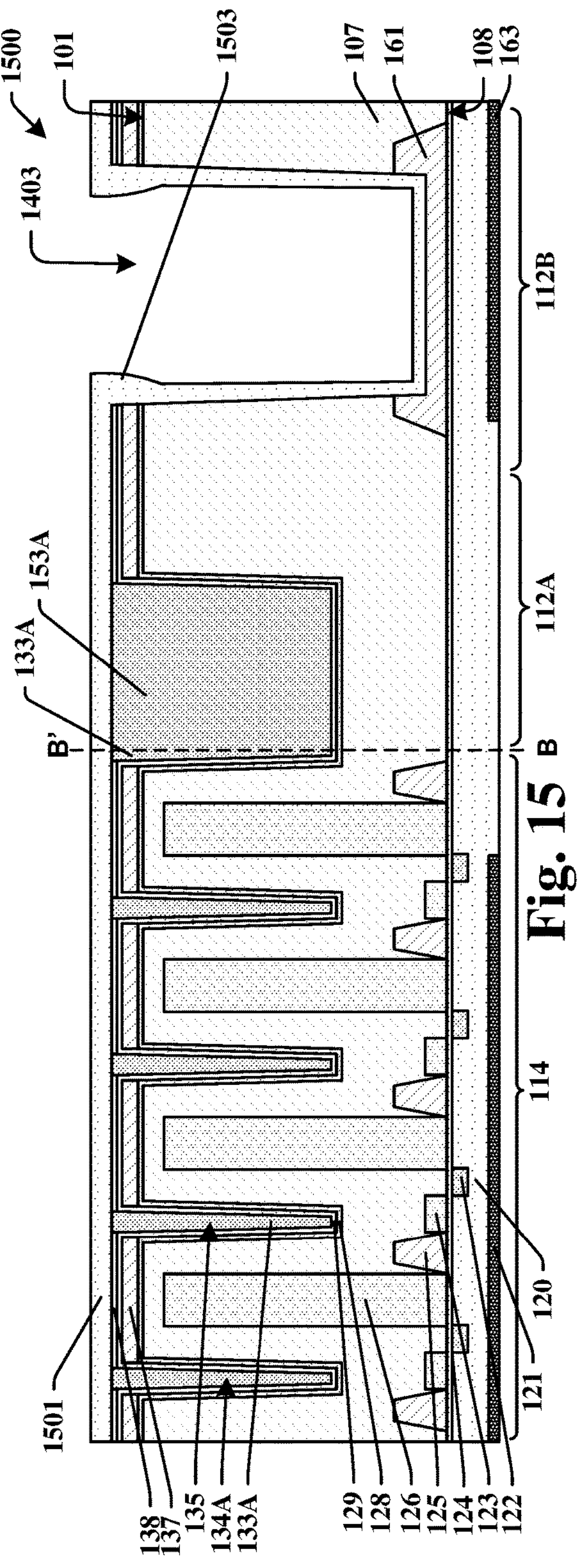

As shown by the cross-sectional view 1500 of FIG. 15 a dielectric layer 1501 maybe deposited over the structure shown by the cross-sectional view 1400 of FIG. 14 such that the dielectric layer 1501 lines the TSV opening 1403. The dielectric layer 1501 may be deposited thickly by a partially non-conformal deposition process such the dielectric layer 1501 forms overhangs 1503 at edges of the TSV opening 1403. The deposition process may be PECVD, the like, or any other suitable process. The dielectric layer 1501 may be one or more layers of silicon oxide, silicon nitride, the like, or any other suitable dielectric(s). In some embodiments, the dielectric layer 1501 is deposited to a thickness in the range from about 1 μm to about 5 μm. In some embodiments, the dielectric layer 1501 is deposited to a thickness in the range from about 2 μm to about 4 μm, e.g., about 3 μm.

Figure 16:
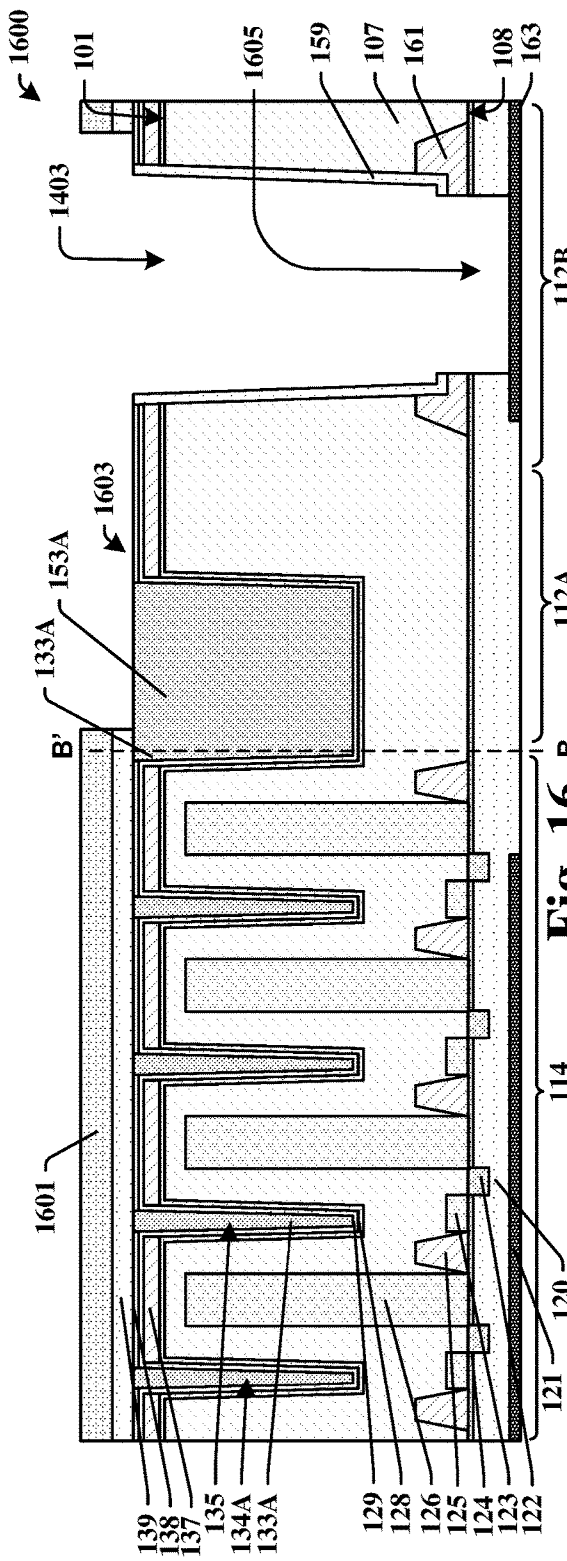

As shown by the cross-sectional view 1600 of FIG. 16, a mask 1601 may be formed by photolithography and used to mask the pixel area 114 while etching in the peripheral area 112. The etch exposes at least a portion of the segment 153A of the in-substrate metal grid 133A and forms an opening 1605 through which the metal pad 163 is exposed within the TSV opening 1403. A portion of the dielectric layer 1501 that is protected by the mask 1601 remains to provide the thick oxide layer 139, which extends over the pixel area 114 and the outer peripheral area 112C (see FIG. 1A) and has an opening 1603 extending from the inner peripheral area 112A to the middle peripheral area 112B.

In some embodiments, the etch is an anisotropic plasma etch whereby a portion of the dielectric layer 1501 remains to form a dielectric liner 159 within the TSV opening 1403. In particular, the overhang 1503 (see FIG. 15) can prevent this portion of the dielectric layer 1501 from being etched away. The dielectric layer 1501 is thinner at the base of the TSV opening 1403, whereby a time of etching that exposes the metal pad 163 is nearly the same as time of etching that exposes the segment 153A. In some embodiments, the etch times are within about 25% of one another. In some embodiments, the etch times are within about 10% of one another. A thickness to which the dielectric layer 1501 is deposited or a degree of conformity with which the dielectric layer 1501 is deposited may be adjusted to affect this balance. After the etching, the mask 1601 may be stripped.

Figure 17:
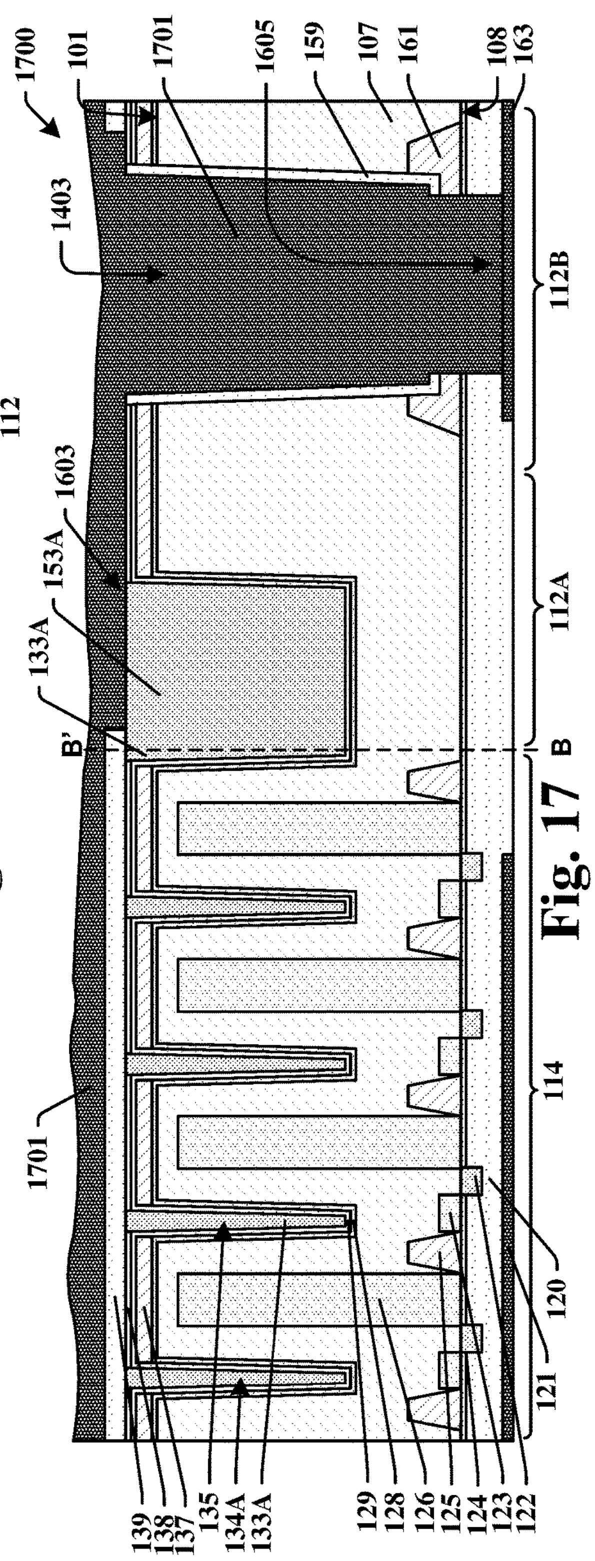

As shown by the cross-sectional view 1700 of FIG. 17, a conductive layer 1701 may be deposited to fill the opening 1605, the TSV opening 1403, and the opening 1603. The conductive layer 1701 may be selected to have a high conductivity and to lend itself to a process that fills the TSV opening 1403, which may have a high aspect ratio. In some embodiments, the conductive material is tungsten (W), aluminum (Al), or the like. In some embodiments, the conductive material is aluminum (Al), or the like. The conductive material may be deposited by CVD, PVD, electroplating, electroless plating, or the like.

Figure 18:
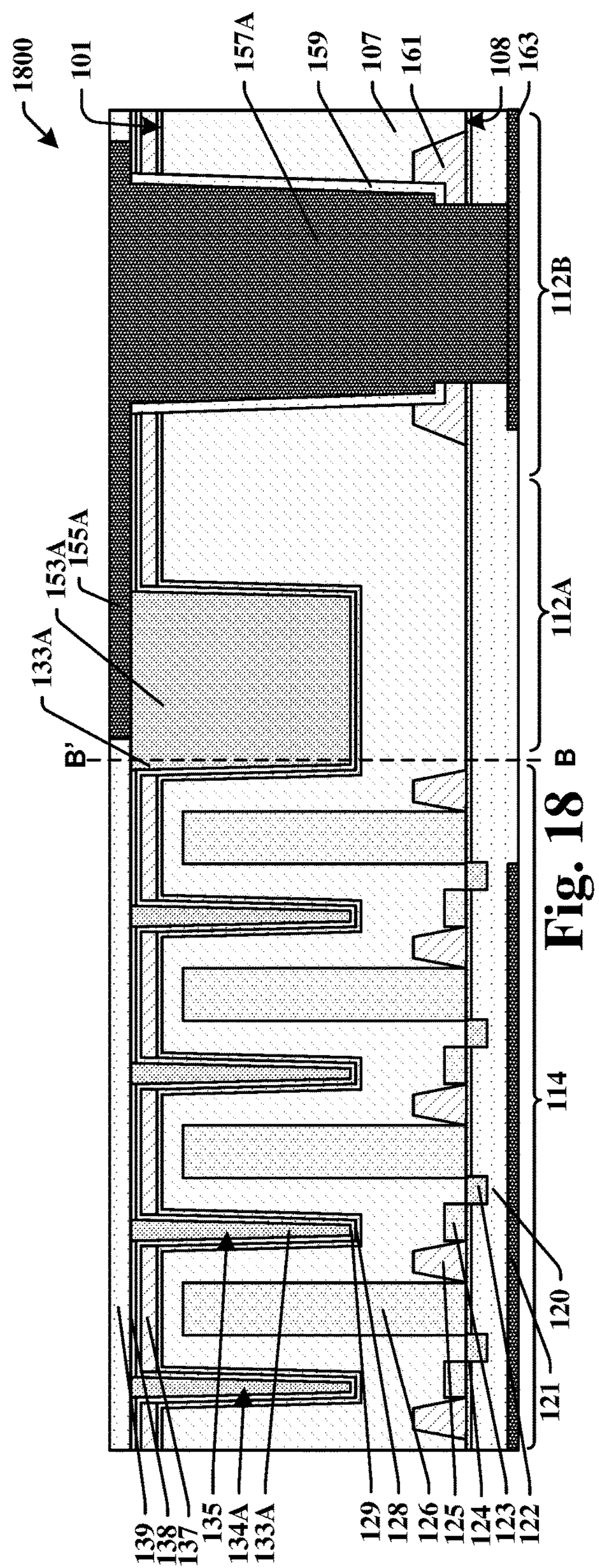

As shown by the cross-sectional view 1800 of FIG. 18, the conductive layer 1701 may be planarized by CMP or the like to form the conductive bridge 155A and the back side TSV 157A. CMP thins the thick oxide layer 139 and leaves the thick oxide layer 139 coplanar with the conductive bridge 155A. In some embodiments, the thick oxide layer 139 is reduced to a thickness in the range from about 500 Angstroms to about 2000 Angstroms. In some embodiments, the thick oxide layer 139 is reduced to a thickness in the range from about 900 Angstroms to about 1500 Angstroms.

Figure 19:
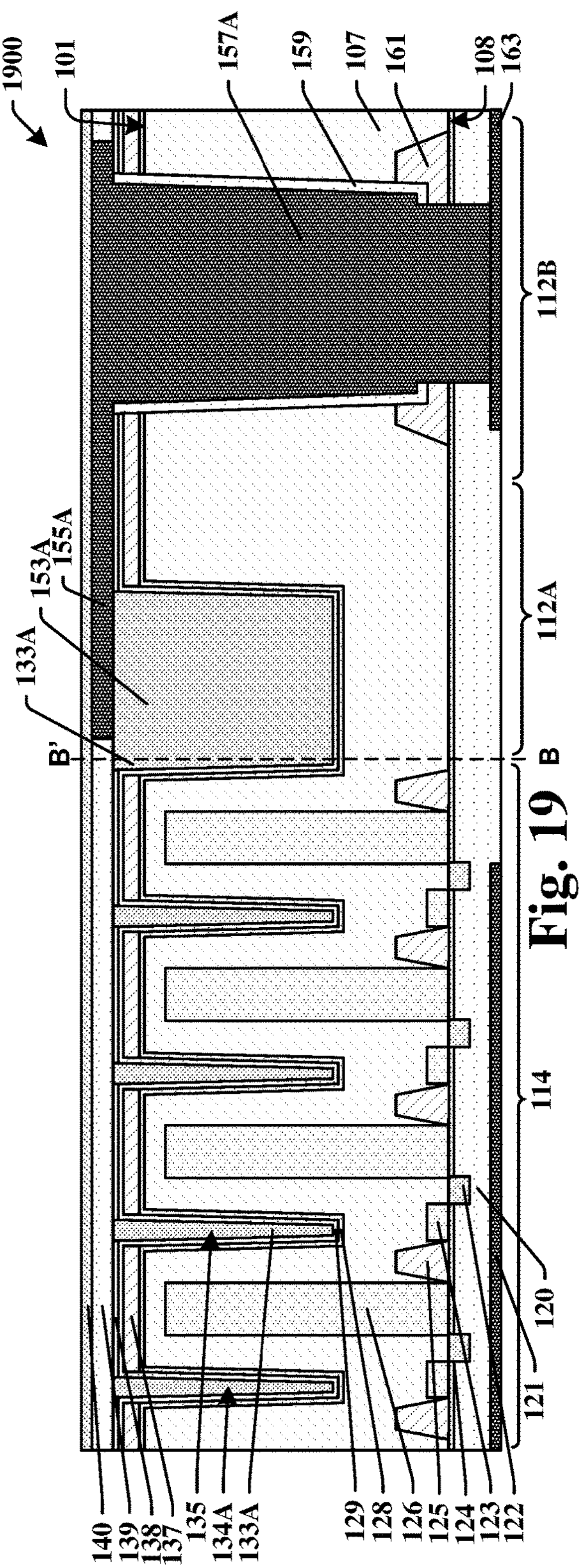
Figure 20:
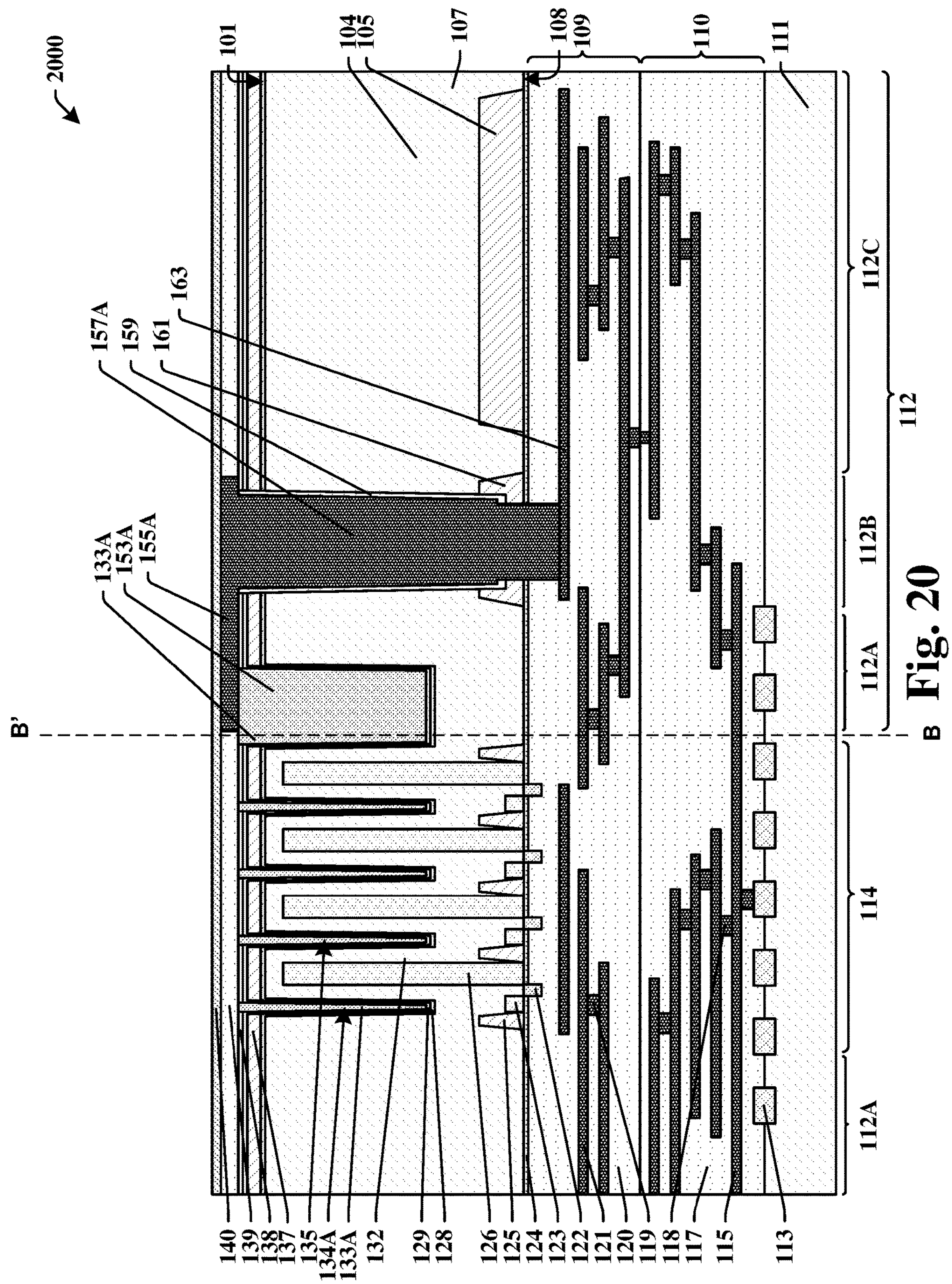

As shown by the cross-sectional view 1900 of FIG. 19, an etch stop layer 140 may be formed over the structure illustrated by the cross-sectional view 1800 of FIG. 18. The etch stop layer 140 may be silicon nitride, the like, or some other suitable dielectric. The etch stop layer 140 may be formed by PVD, CVD, ALD, the like, or any other suitable process. In some embodiment, the etch stop layer 140 has a thickness from about 400 Angstroms to about 1200 Angstroms. In some embodiment, the etch stop layer 140 has a thickness from about 600 Angstroms to about 1000 Angstroms, e.g., about 880 Angstroms. The cross-sectional view 2000 of FIG. 20 is a broader view that corresponds to the cross-sectional view 1900 of FIG. 19.

Figure 21:
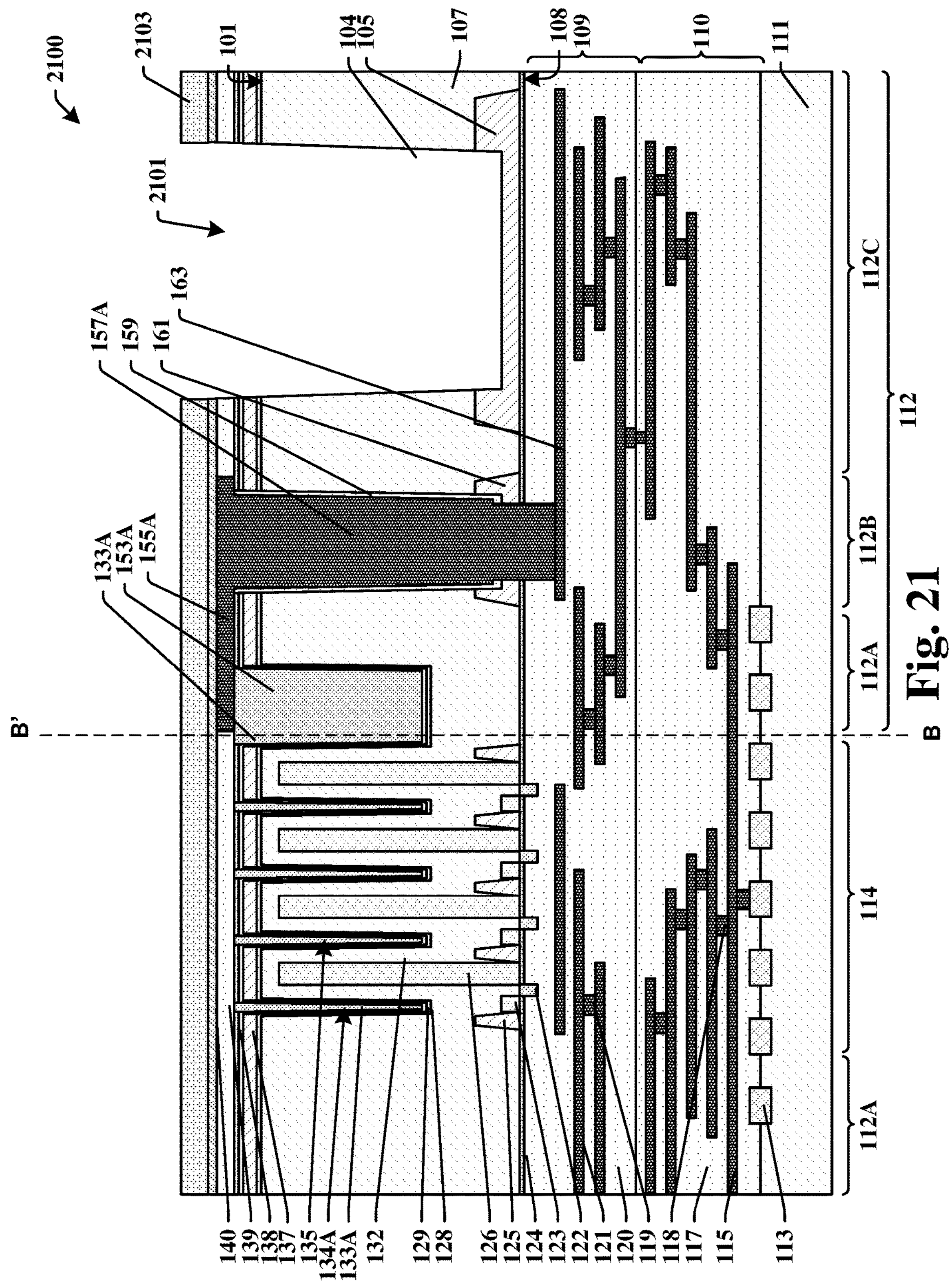

As shown by the cross-sectional view 2100 of FIG. 21, a mask 2103 may be formed by photolithography and used to etch a pad opening 2101 in the first semiconductor substrate 107 within the outer peripheral area 112C. The etch may stop on the isolation structure 105 that was formed on the front side 108. After the etch, the mask 2103 may be stripped.

Figure 22:
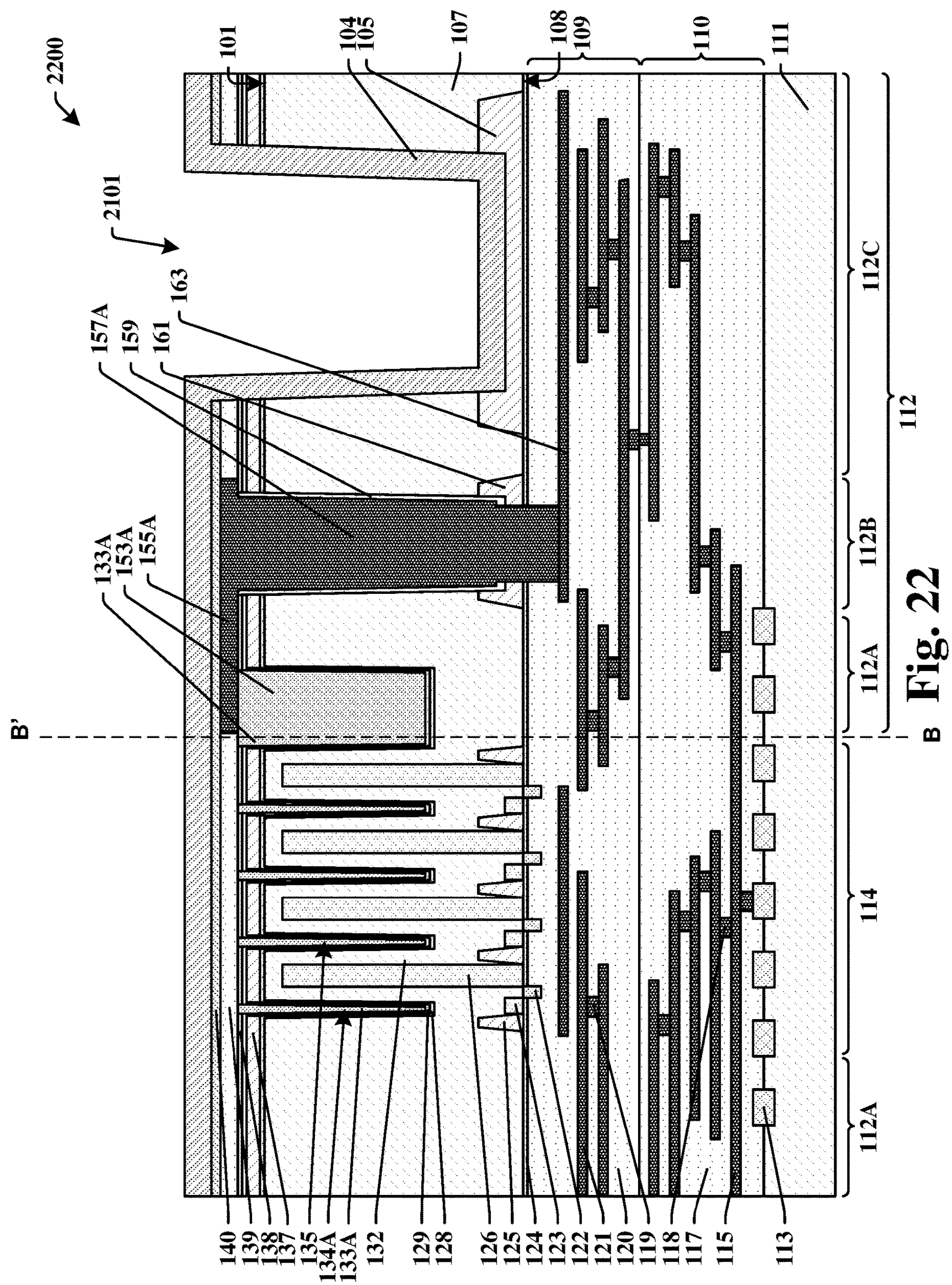

As shown by the cross-sectional view 2200 of FIG. 22, a pad dielectric liner 104 may be deposited over the structure shown by the cross-sectional view 2100 of FIG. 21. The pad dielectric liner 104 may be an oxide, the like, or some other suitable dielectric. In some embodiment, the pad dielectric liner 104 is from about 2000 Angstroms to about 5000 Angstroms thick. The pad dielectric liner may be deposited by PVD, CVD, the like, or any other suitable process.

Figure 23:
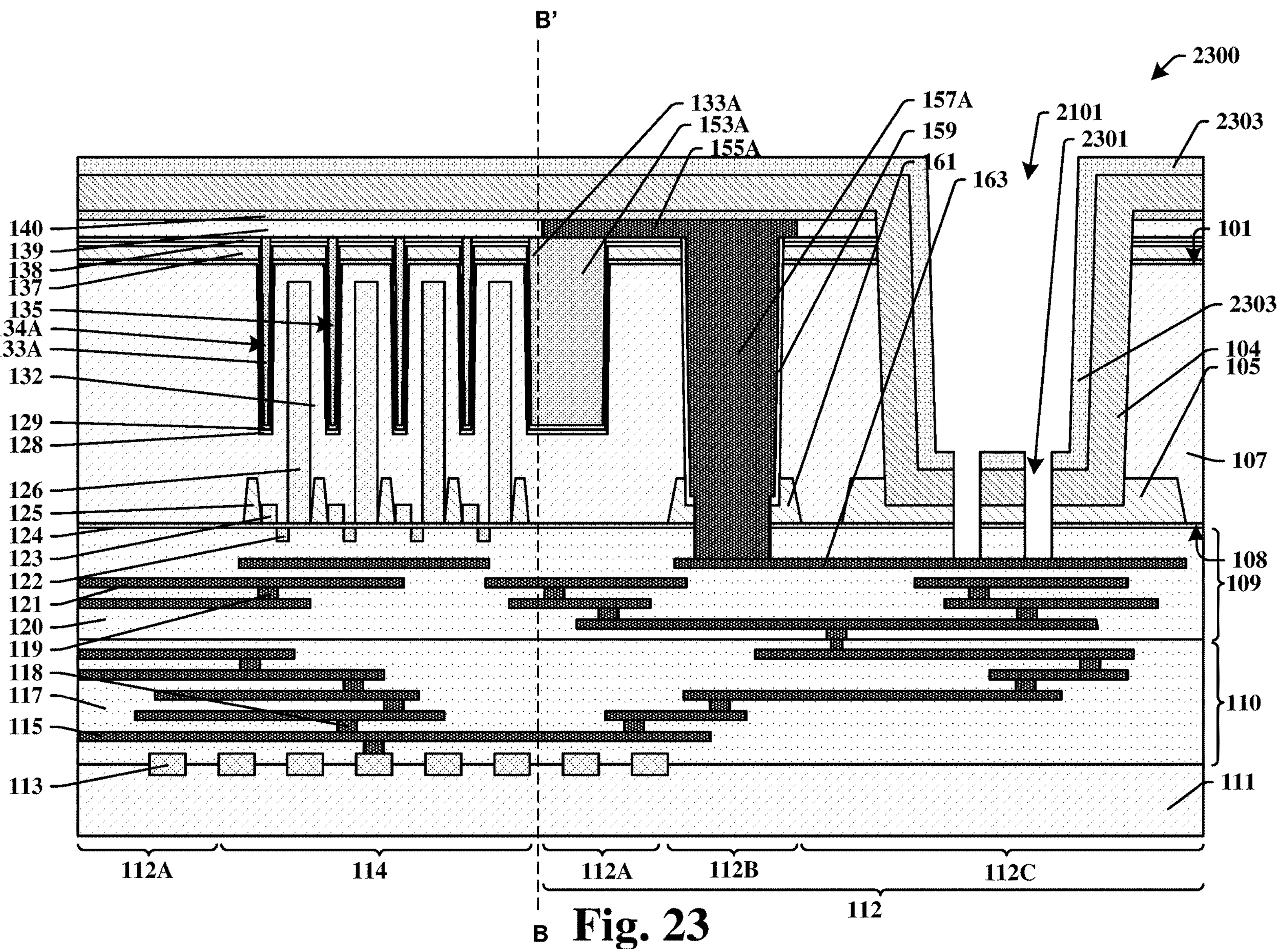

As shown by the cross-sectional view 2300 of FIG. 23, a mask 2303 may be formed by photolithography and used to etch openings 2301 within the pad opening 2101. The metal pad 163 is exposed through the openings 2301. After the etch, the mask 2303 may be stripped.

Figure 24:
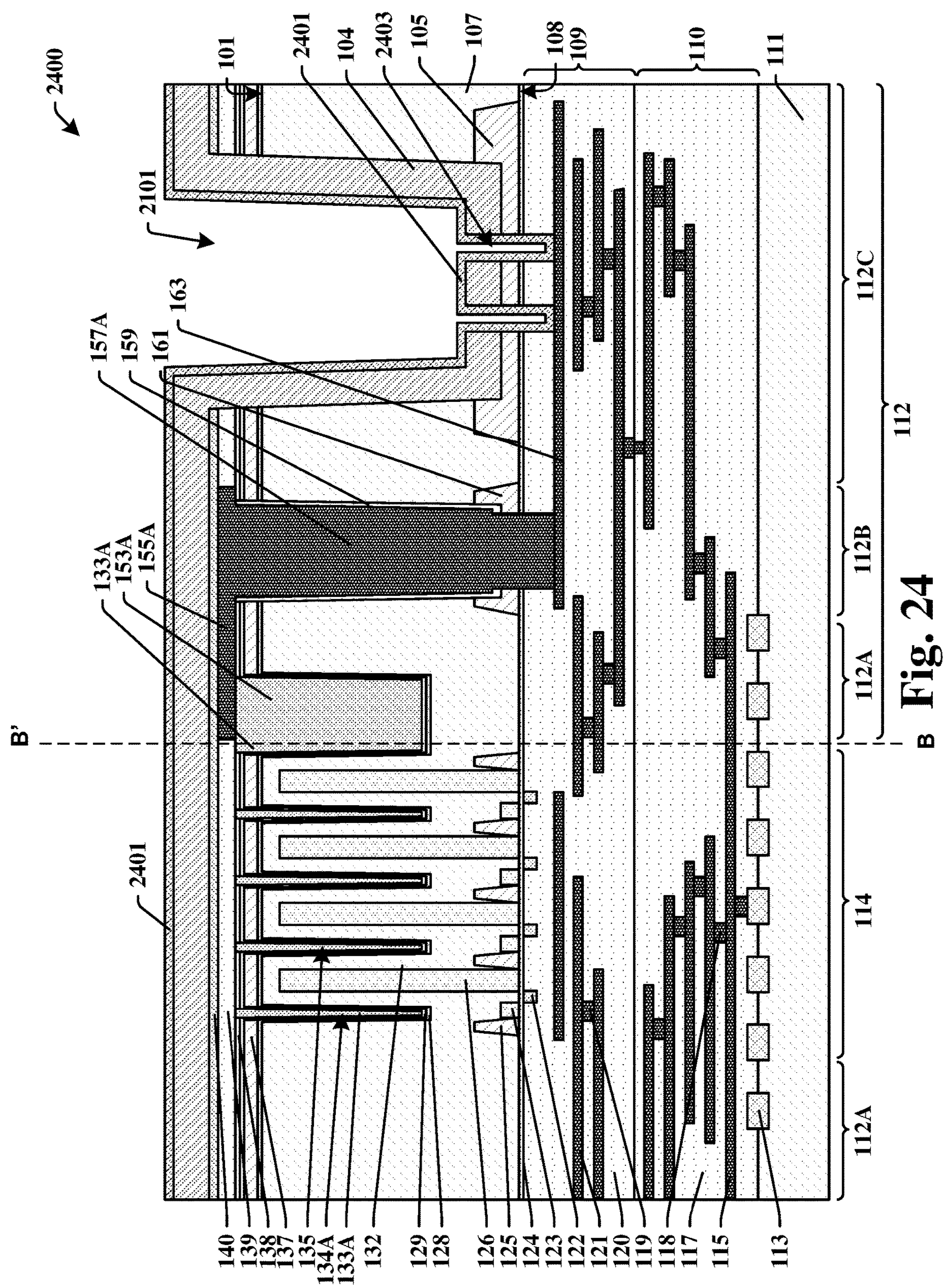

As shown by the cross-sectional view 2400 of FIG. 24, pad metal 2401 may be deposited over the structure illustrated by the cross-sectional view 2300 of FIG. 23, including with the openings 2301. Rather than completely fill the openings 2301, the pad metal 2401 may line the openings 2301 leaving slits 2403 in the pad metal 2401. The pad metal 2401 may be aluminum (Al), copper (Cu), the like, or any other suitable pad metal. In some embodiments, the metal is aluminum-copper (AlCu). In some embodiment, the pad metal 2401 is deposited to a thickness from about 0.8 μm to about 1.6 μm, e.g., about 1.3 μm. The pad metal 2401 may be deposited by CVD, PVD, electroplating, electroless plating, or the like.

Figure 25:
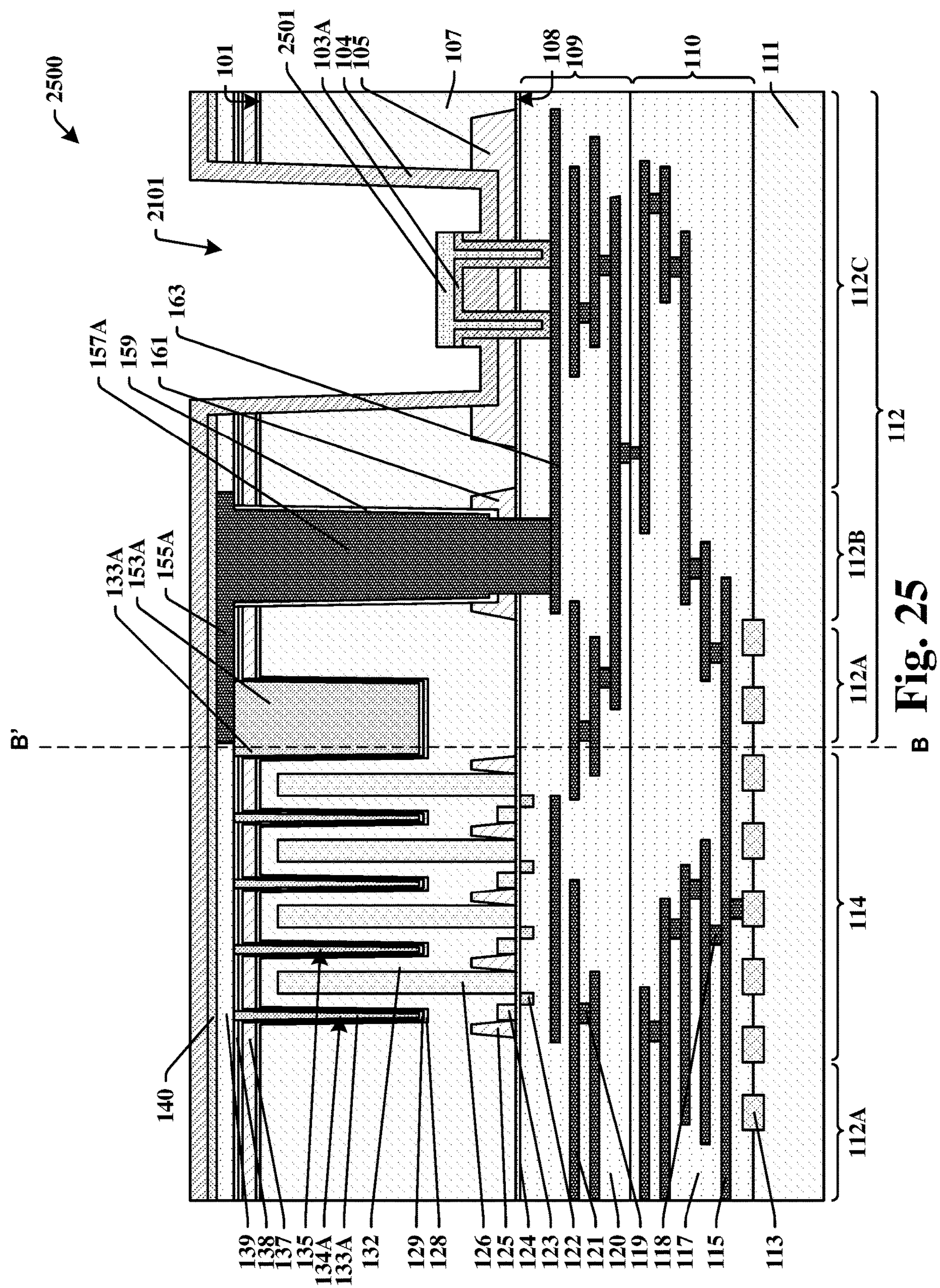

As shown by the cross-sectional view 2500 of FIG. 25, a mask 2501 may be formed by photolithography and used to define the contact pad 103A from the pad metal 2401. After the etch, the mask 2501 may be stripped.

Figure 26:
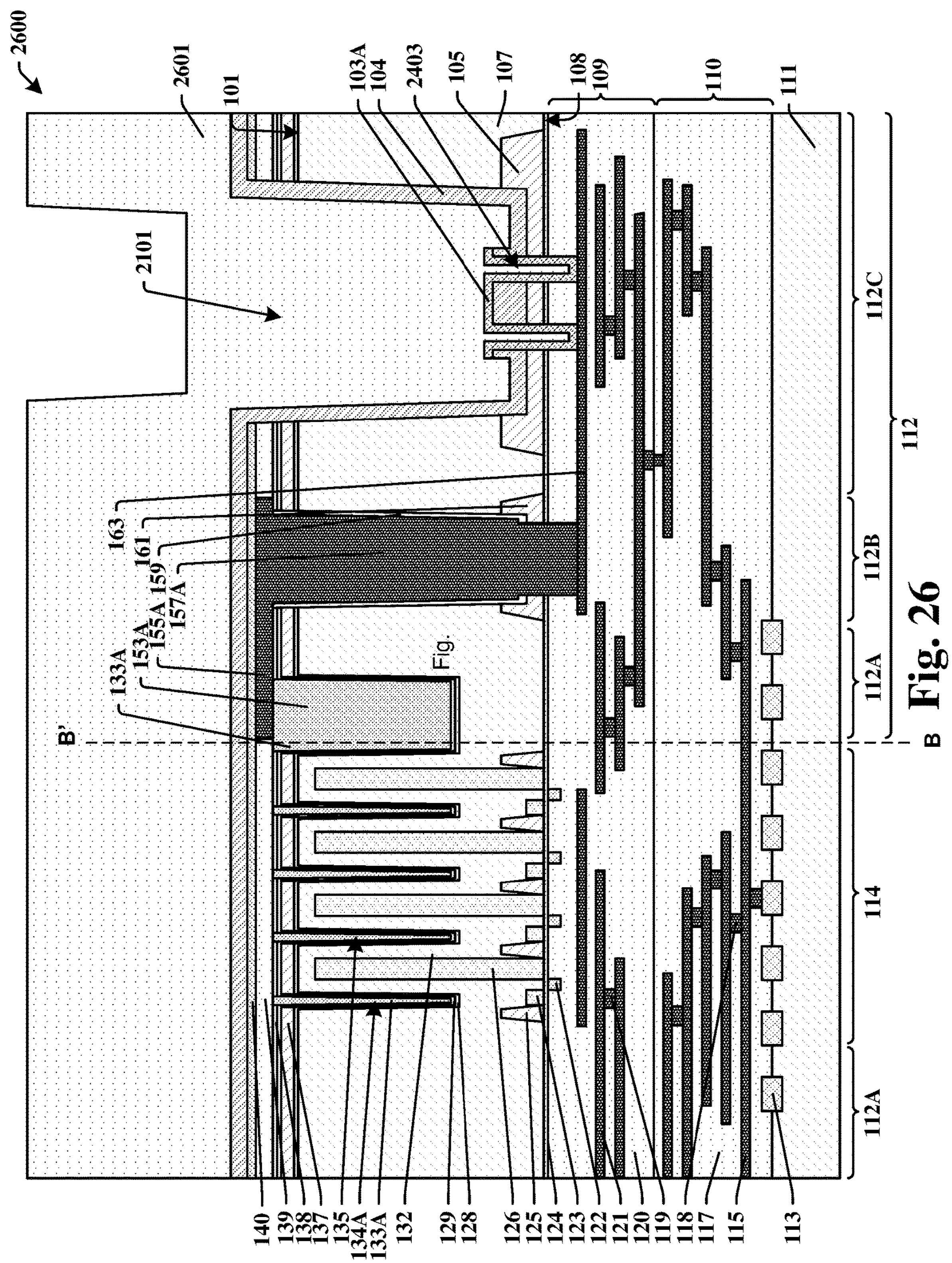

As shown by the cross-sectional view 2600 of FIG. 26, a pad dielectric 2601 may be deposited over the structure shown in the cross-sectional view 2500 of FIG. 25 to a thickness sufficient to fill the pad opening 2101. The pad dielectric 2601 may fill the slits 2403. The pad dielectric 2601 may be an oxide, the like, or another suitable dielectric. The pad dielectric 2601 may be deposited by PVD, CVD, the like, or any other suitable process or combination of processes.

Figure 27:
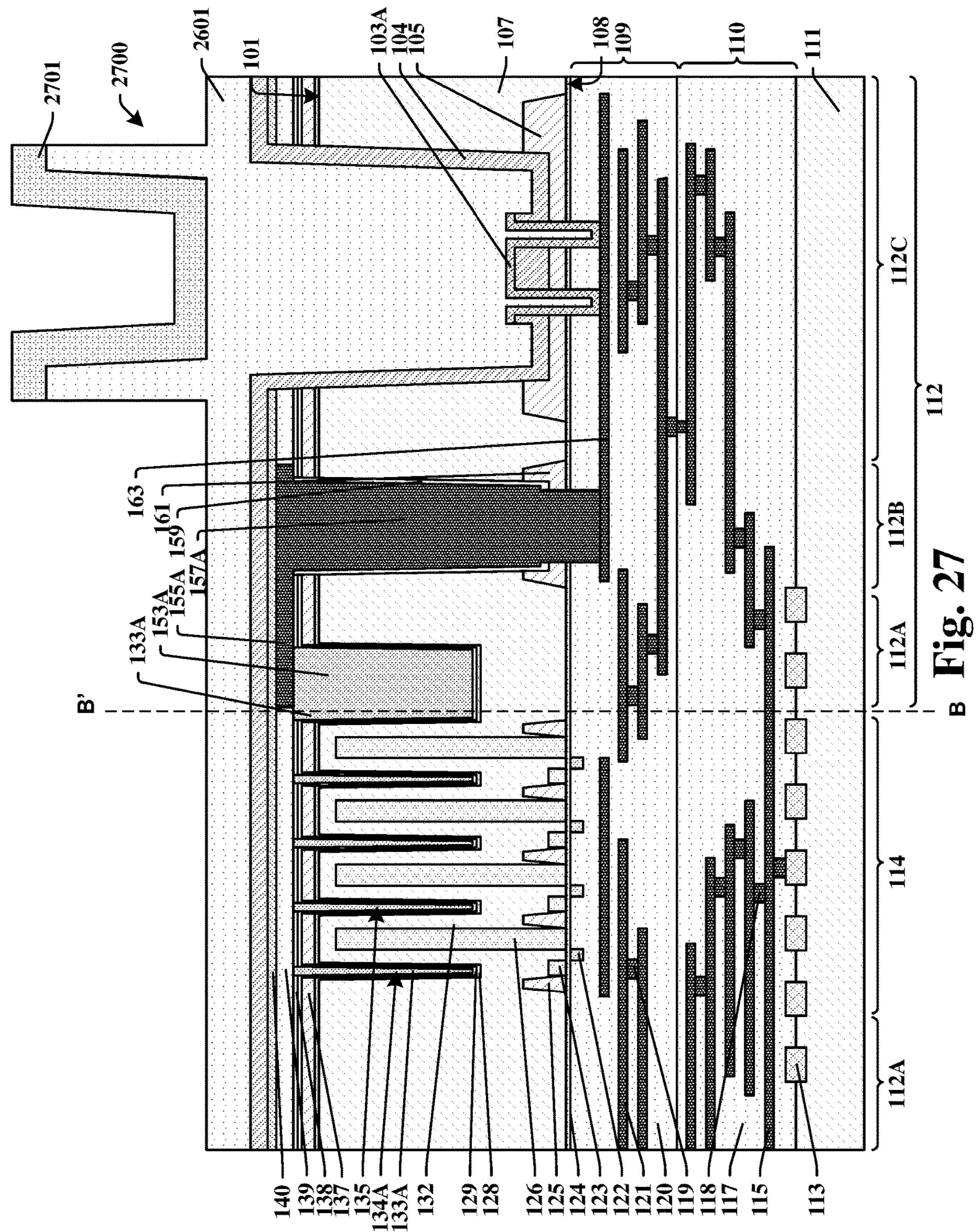
Figure 28:
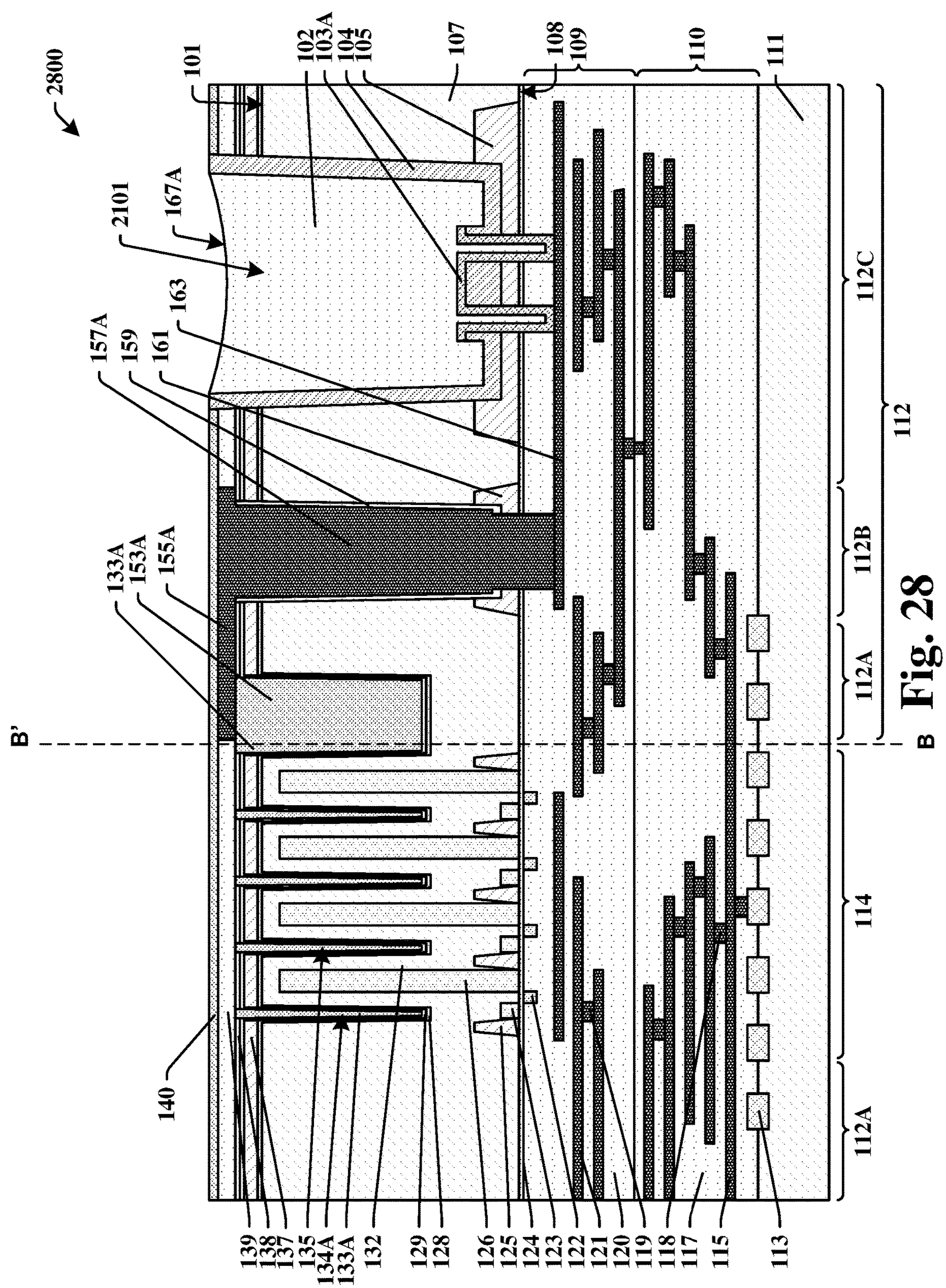

As shown by the cross-sectional view 2700 of FIG. 27, a mask 2701 may be formed by photolithography and used to thin the pad dielectric 2601 in areas away from the contact pad 103A. As shown by the cross-sectional view 2800 of FIG. 28, the mask 2701 is stripped and planarization and additional etching carried out to form the pad dielectric 102 from the pad dielectric 2601. This processing facilitates providing the pad dielectric 102 with the concave surface 167A. The etching may also remove portions of the pad dielectric 102 and the pad dielectric liner 104 that are outside the pad opening 2101.

Figure 29:
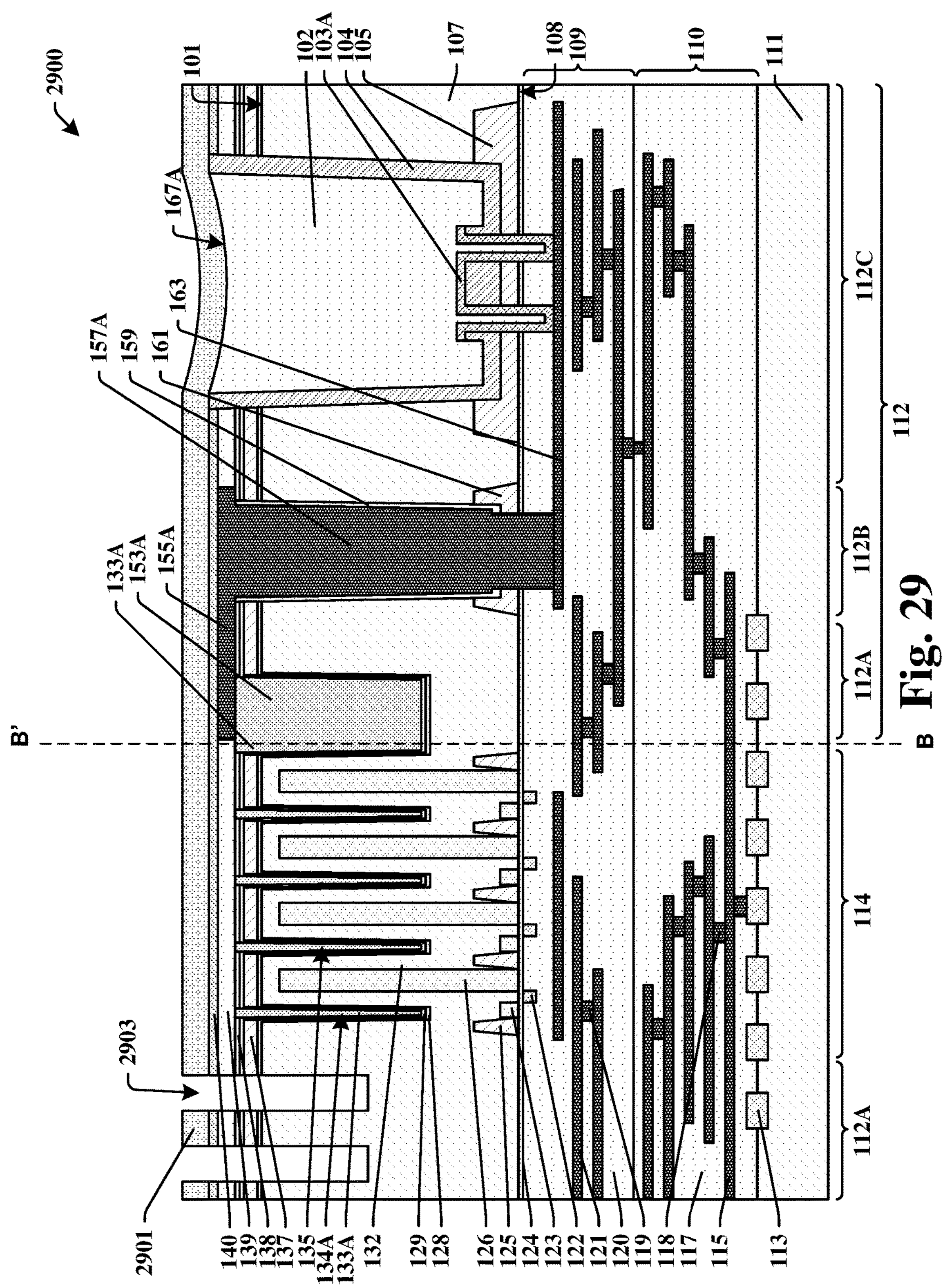

As shown by the cross-sectional view 2900 of FIG. 29, a mask 2901 may be formed by photolithography and used to etch ground bar openings 2903 in the first semiconductor substrate 107 within the inner peripheral area 112A. The etch process may be a plasma etch. After etching, the mask 2901 may be stripped.

Figure 30:
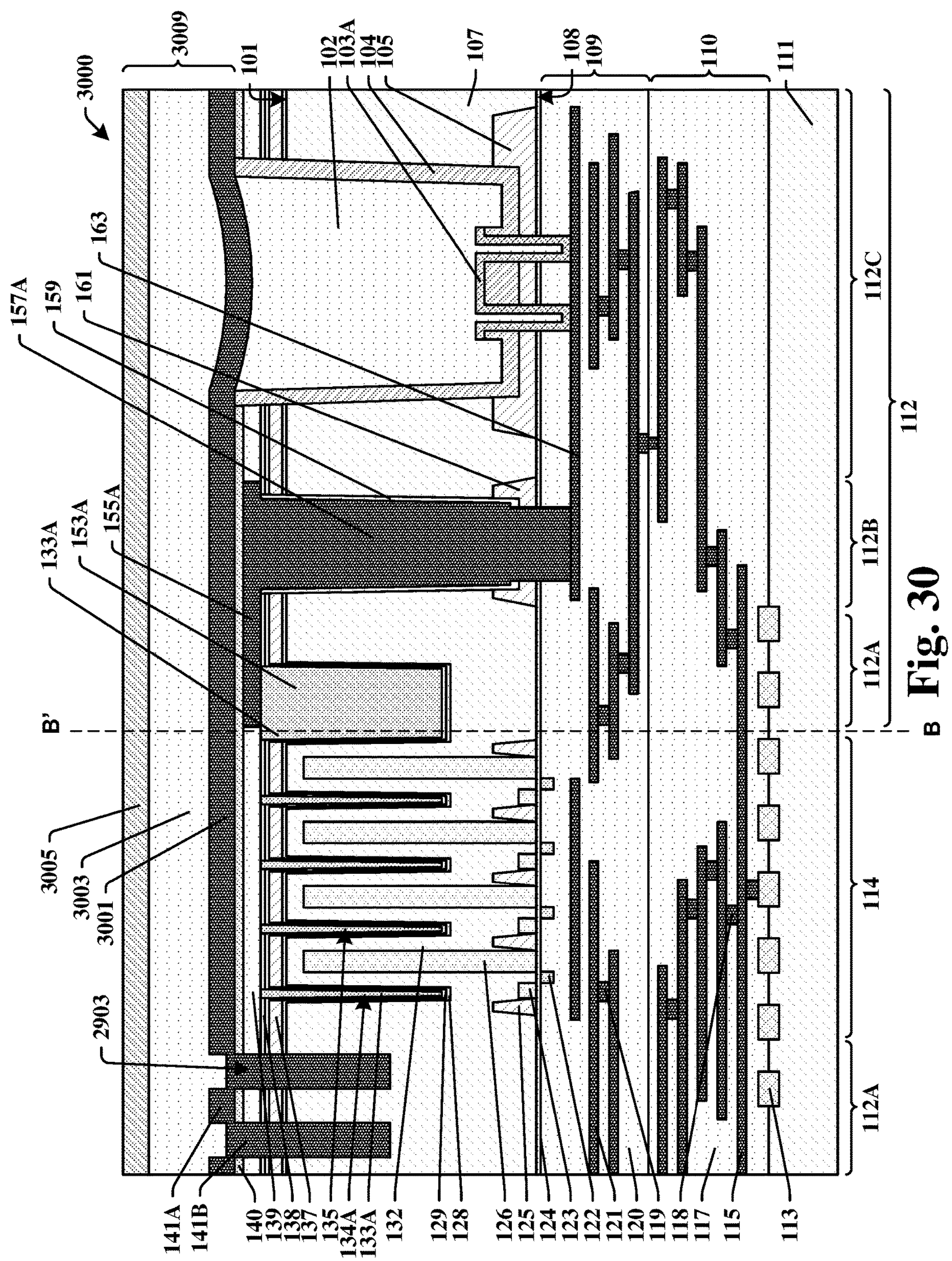

As shown by the cross-sectional view 3000 of FIG. 30, a composite grid stack 3009 may be deposited over the structure shown by the cross-sectional view 2900 of FIG. 29. The composite grid stack 3009 may include a metal layer 3001, a dielectric layer 3003, and a hard mask layer 3005. The metal layer 3001 forms the ground bars 141B within the ground bar openings 2903 and the portion 141A of the back side metal grid 141 that connects the ground bars 141B to the rest of the back side metal grid 141. The metal layer 3001 may comprise any suitable metal or combination of metals. In some embodiments, the metal layer 3001 comprises tungsten (W), or the like. In some embodiments, the metal layer 3001 includes a liner layer of titanium nitride (TiN), tantalum nitride (TaN), or the like. The dielectric layer 3003 may be silicon oxide, the like, or any suitable dielectric. The hard mask layer 3005 may be a nitride, a carbide, the like, a combination thereof, or any other suitable hard mask material. These layers may be deposited by a combination of CVD, PVD, electroplating, electroless plating, the like, or any other suitable processes.

Figure 31:
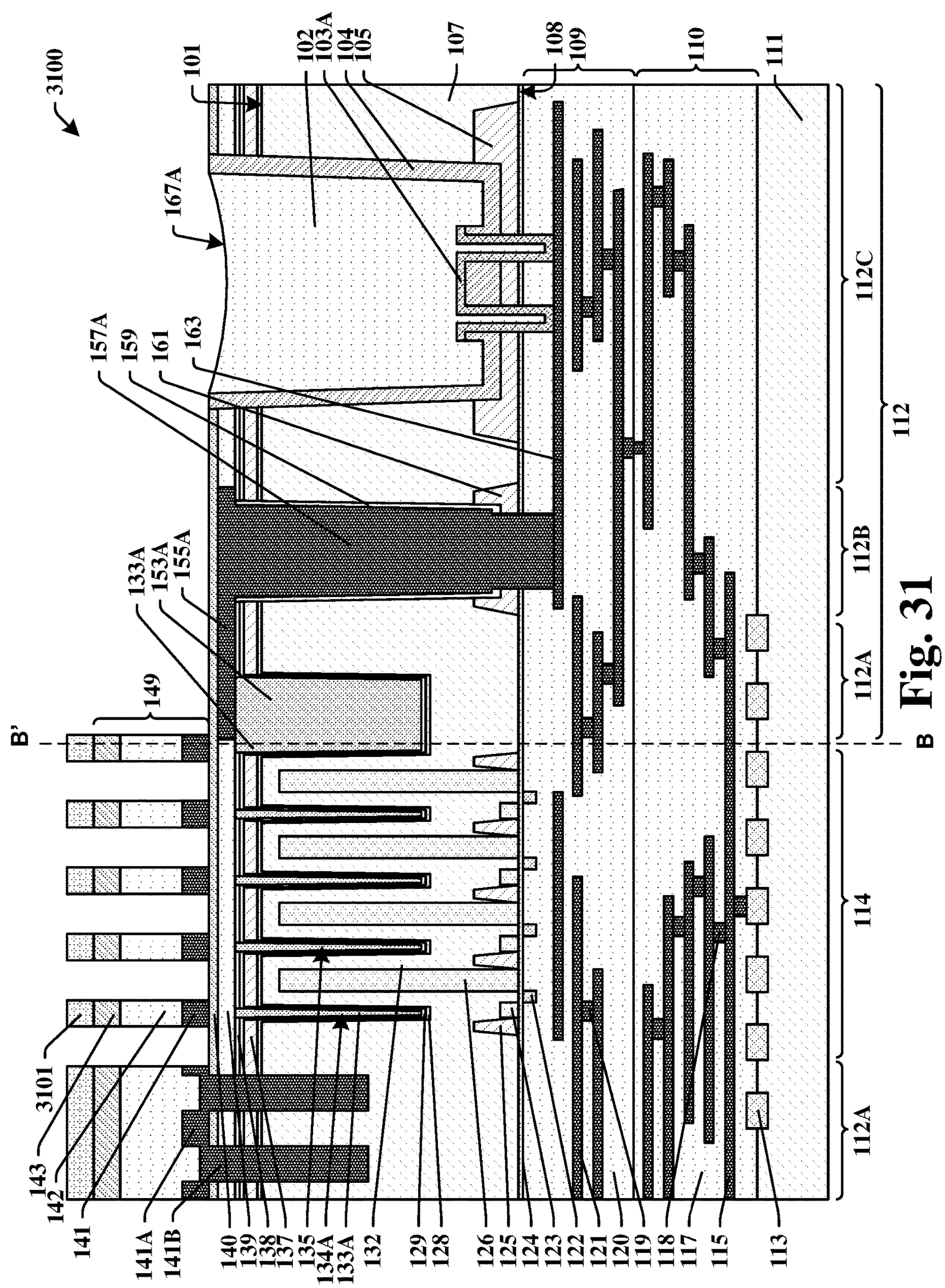

As shown by the cross-sectional view 3100 of FIG. 31, a mask 3101 may be formed by photolithography and used to etch the composite grid 149 from the composite grid stack 3009. The etching removes the composite grid from over the photodetector pixels 126 and from over the pad dielectric 102. The etching forms the back side metal grid 141 from the metal layer 3001, the dielectric grid 142 from the dielectric layer 3003, and the hard mask grid 143 from the hard mask layer 3005. After the etching, the mask 3101 may be stripped.

Figure 32:
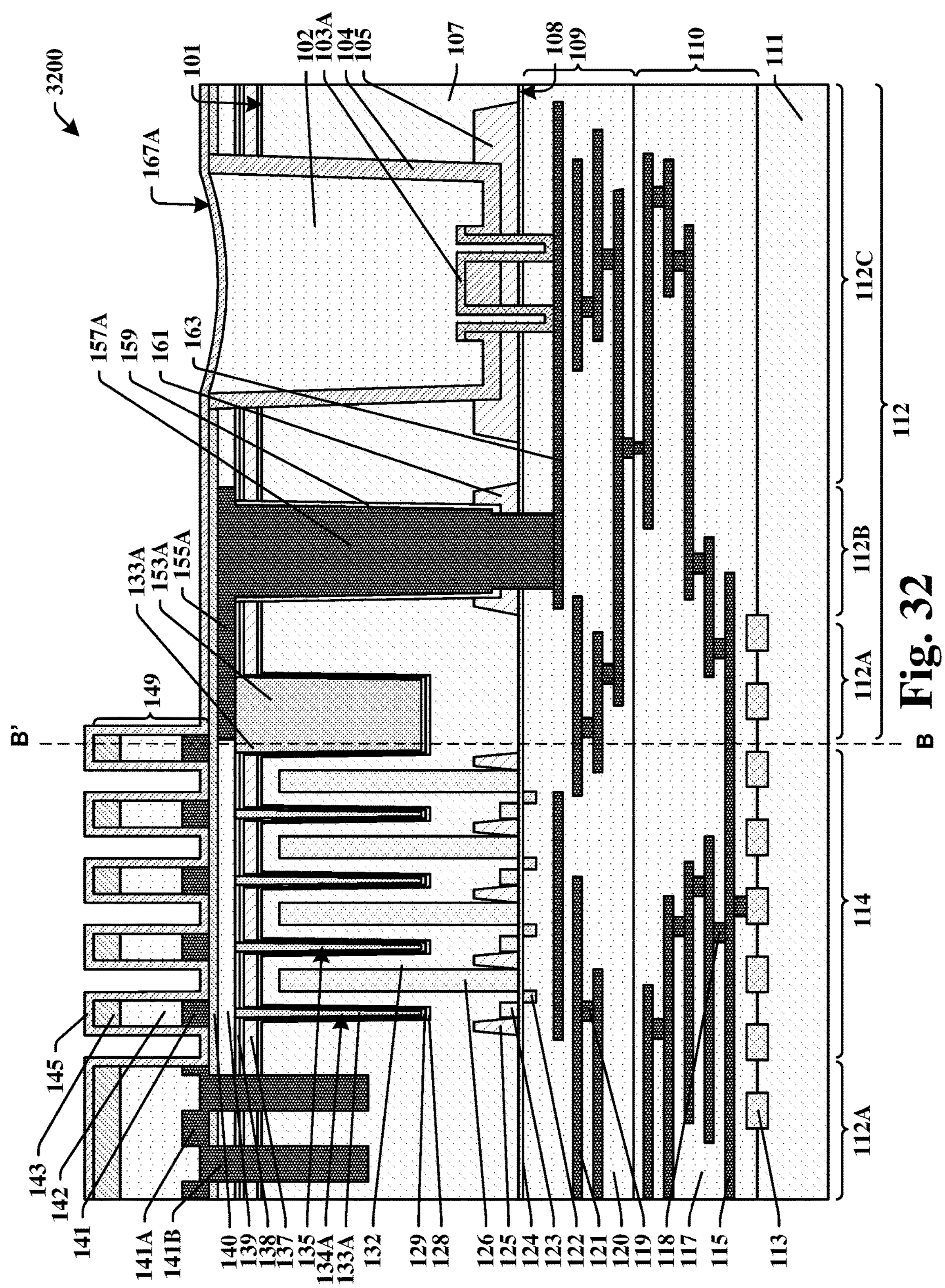
Figure 33:
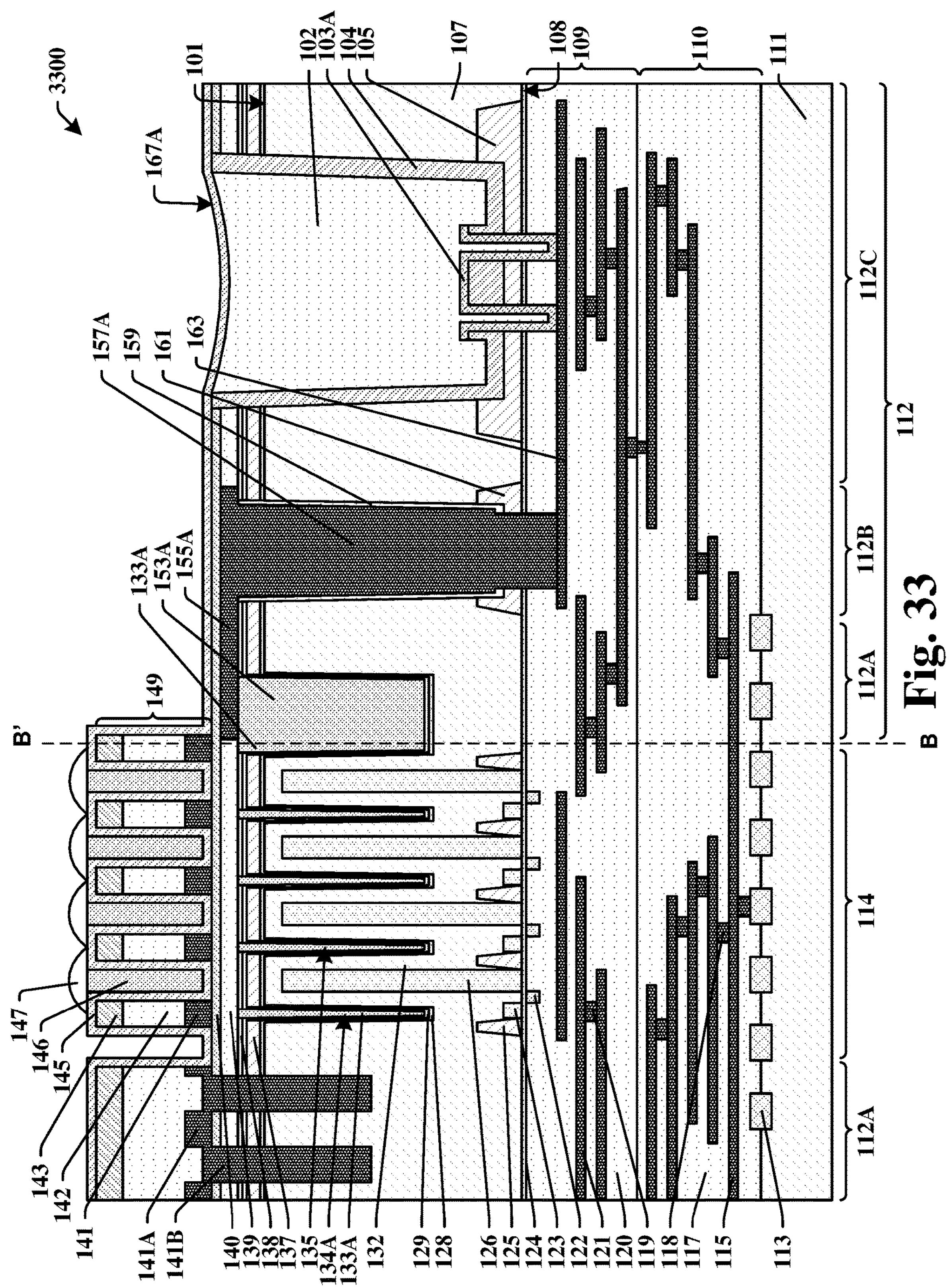
Figure 34:
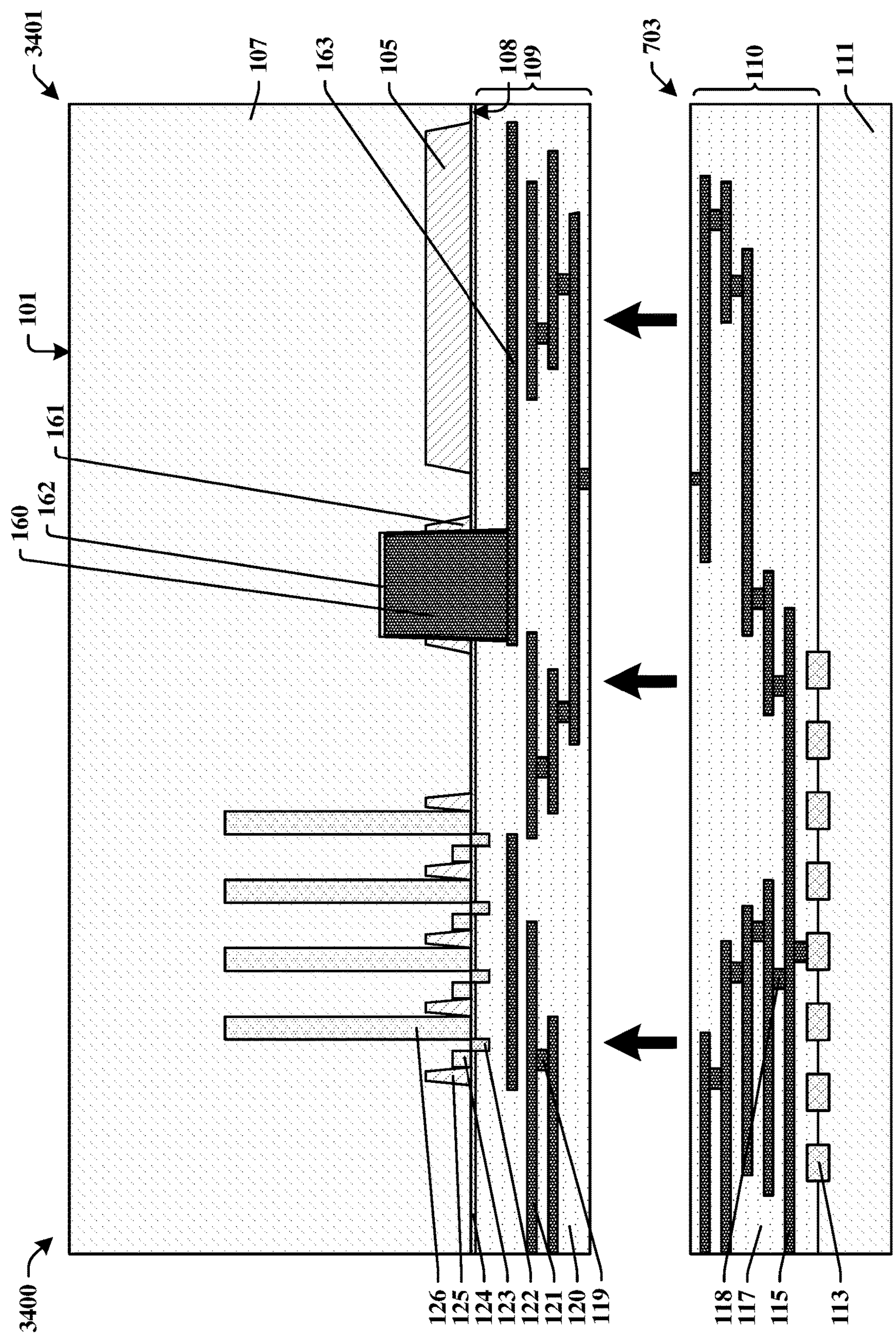
FIGS. 34-40 are a series of cross-sectional view illustrations exemplifying a variation on the method of FIGS. 7A, 7B, and 8-33.

As shown by the cross-sectional view 3200 of FIG. 32, an encapsulation layer 145 may be formed over the structure illustrated by the cross-sectional view 3100 of FIG. 31. The encapsulation layer 145 mirrors a surface of the pad dielectric 102 and presents the concave surface 167A. The encapsulation layer 145 may be an oxide, the like, or some other suitable dielectric. As shown by the cross-sectional view 3300 of FIG. 33, color filters 146 may be formed over the photodetector pixels 126 within the composite grid 149. Micro-lenses 147 may be formed over the color filters 146. The opening 165A may be etched through the encapsulation layer 145 and the pad dielectric 102 to expose the contact pad 103A and produce the structure of FIG. 1A.

The cross-sectional views 3400-4000 of FIGS. 34-40 illustrate a variation of the process shown by the cross-sectional views 700-3300 of FIGS. 7A, 7B, and 8-33. This variation may be used to form the IC device 100B of FIG. 2A. As shown by the cross-sectional view 3400 of FIG. 34, which may be compared to the cross-sectional view 700 of FIG. 7A, the variation begins with the IC device 3401 in place of the IC device 701. The IC device 3401 is similar to the IC device 701 but includes the front side TSV 160. The front side TSV 160 may be insulated from the first semiconductor substrate 107 by a TSV liner 162. The TSV liner 162 may be an oxide, a nitride, the like, or some other suitable dielectric.

Processing may continue as shown by the cross-sectional views 710-1300 of FIGS. 7B-13. As shown by the cross-sectional view 3500 of FIG. 35, etching to form the TSV opening 3501 may stop on the front side TSV 160 or the TSV liner 162. As shown by the cross-sectional view 3600 of FIG. 36, the dielectric layer 1501 may be deposited over the resulting structure. As shown by the cross-sectional view 3700 of FIG. 37, etching with the mask 1601 may form an opening 3701 through the dielectric layer 1501 and the TSV liner 162 and thereby expose the front side TSV 160 within the TSV opening 3501. As shown by the cross-sectional view 3800 of FIG. 38, depositing the conductive layer 1701 fills the TSV opening 3501 and the opening 3701. As shown by the cross-sectional view 3900 of FIG. 39, planarizing defines the conductive bridge 155A and the back side TSV 157B from the conductive layer 1701. The etch stop layer 140 may be deposited over the resulting structure as shown by the cross-sectional view 4000 of FIG. 40 and processing may then continue as shown by the cross-sectional views 2000-3000 of FIGS. 20-30 to provide an IC device such as the IC device 100B of FIG. 2A.

The cross-sectional views 4100-4600 of FIGS. 41-46 illustrate a variation of the process shown by the cross-sectional views 700-3300 of FIGS. 7A, 7B, and 8-33. This variation may be used to form the IC device 100C of FIGS. 3A-3D. As shown by the cross-sectional view 4100 of FIG. 41, which may be compared to the cross-sectional view 800 of FIG. 8, the variation begins by etching with the mask 4101 in place of the mask 803. Etching with the mask 4101 creates a trench 801C that extends from the pixel area 114 to the middle peripheral area 112B. In the middle peripheral area 112B, the trench 801C joins with an TSV opening 4103. The layout of the trenches 801 and 801C and of the TSV opening 4103 corresponds to the layout of the in-substrate metal grid 133C, the segment 153C, and the back side TSVs 135C as shown in FIG. 3D.

A depth D2 of the TSV opening 4103 may be greater than a depth D1 of the trenches 801. An etch process may provide a greater depth in the TSV opening 4103 than in the trenches 801 by virtue of the TSV opening 4103 having a width W2 that is greater than a width W1 of the trenches 801. In some embodiments, the width W2 is from 1.1 to 10 times the width W1. In some embodiments, the width W2 is from 1.3 to 5 times the width W1.

The depth D2 of the TSV opening 4103 may be nearly a thickness T1 of the first semiconductor substrate 107. In some embodiments, the thickness T1 is from 1 μm to about 5 μm. In some embodiments, the thickness T1 is from 2 μm to about 4 μm, e.g., about 3.5 μm. In some embodiments, the depth D1 is from about 0.5 μm to about 3 μm. In some embodiments, the depth D1 is from about 1 μm to about 2 μm or about 1.5 μm. In some embodiments, the width W1 is from about 0.03 μm to about 0.5 μm. In some embodiments, the width W1 is from about 0.08 μm to about 0.16 μm or about 0.12 μm.

Figure 42:
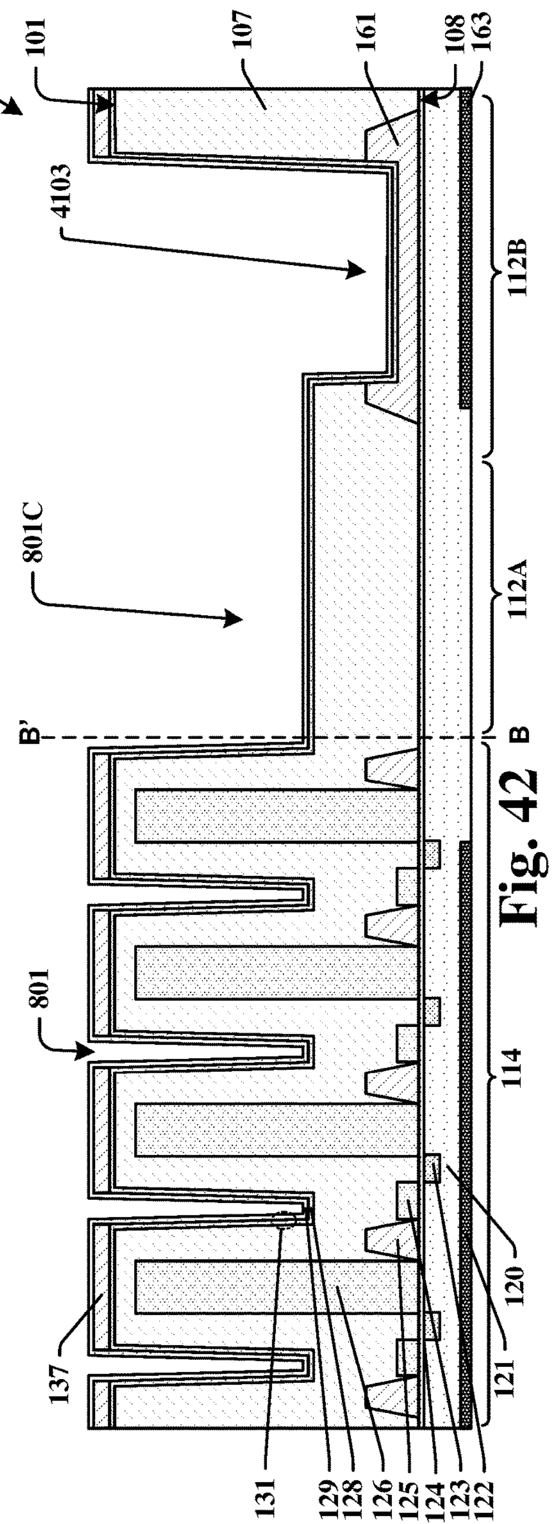

As shown by the cross-sectional view 4200 of FIG. 42, stripping the mask 4101 and deposition of the high-κ liner 128, the high-κ capping layer 137, and the second dielectric liner 129 causes the TSV opening 4103 to be lined with the same dielectric liner structure 131 as the trenches 801. As shown by the cross-sectional view 4300 of FIG. 43, the process may proceed with non-conformal deposition of a thick dielectric layer 4301 over the structure shown by the cross-sectional view 4200 of FIG. 42. The thick dielectric layer 4301 may be an oxide, the like, or some other suitable dielectric. The thick dielectric layer 4301 may be deposited by PECVD, the like, or some other suitable process. The non-conformal deposition process may result in the thick dielectric layer 4301 forming primarily outside the trenches 801 and the TSV opening 4103, whereby the thick dielectric layer 4301 make only a small addition to the dielectric liner structure 131.

The thick dielectric layer 4301 may be deposited such that it closes over the trenches 801 but has an opening 4307 through which the TSV opening 4103 is exposed. It should be appreciated that the trench 801C has the same width as the trenches 801 and that the structure 4305 corresponds to a portion 4303 of the thick dielectric layer 4301 that is midway over a trench 801. The elongated appearance of the structure 4305 is a consequence of the profile of the cross-section corresponding to the line A-A' of FIG. 3D.

Figure 44:
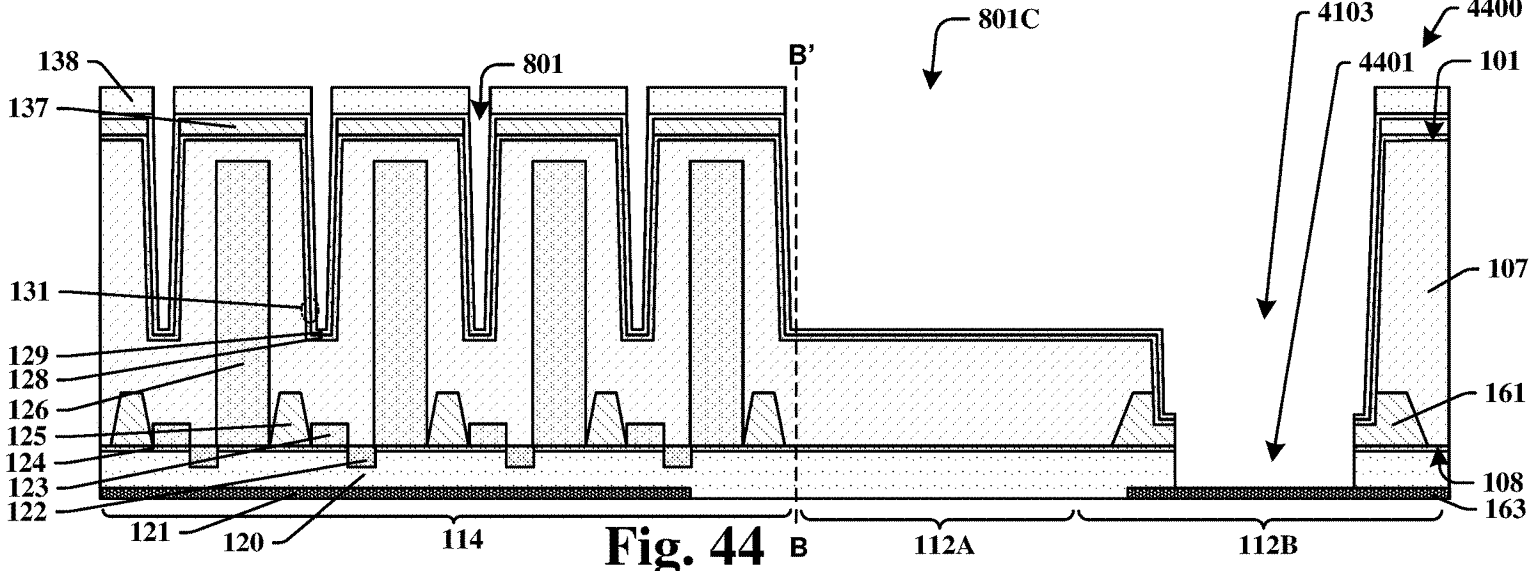

As shown by the cross-sectional view 4400 of FIG. 44, an etch may be carried out in which the thick dielectric layer 4301 is operative as a mask. The etch process forms the opening 4401 through which the metal pad 163 is exposed. The etch may be timed such that a remaining portion of the thick dielectric layer 4301 provides the second capping layer 138. The etch process exposes the trenches 801 but stops before the dielectric liner structure 131 is removed from the trenches 801 or from the sidewalls of the TSV opening 4103.

Figure 45:
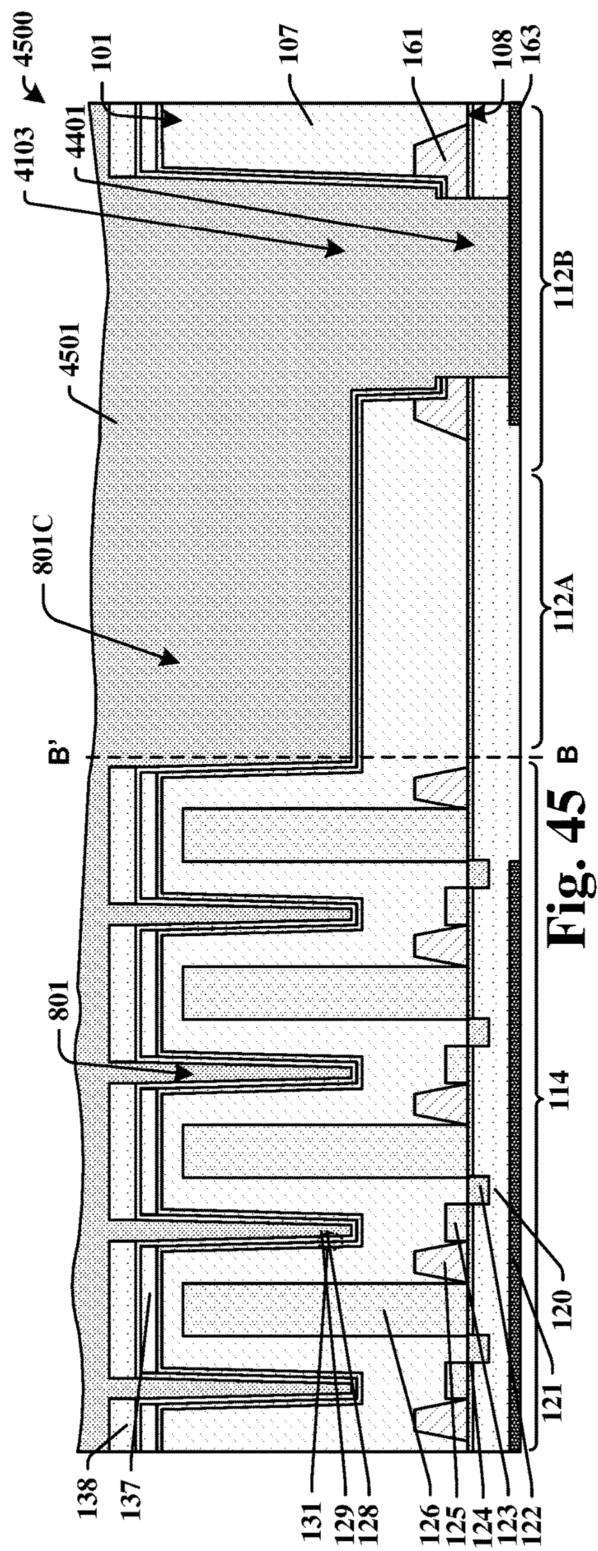

As shown by the cross-sectional view 4500 of FIG. 45, a conductive material 4501 may be deposited over the structure shown by the cross-sectional view 4400 of FIG. 44. The conductive material 4501 is one that provides adequate gap fill in the trenches 801. In some embodiments, the conductive material is tungsten (W), aluminum (Al), or the like. The conductive material may be deposited by CVD, PVD, electroplating, electroless plating, the like, or any other suitable process.

Figure 46:
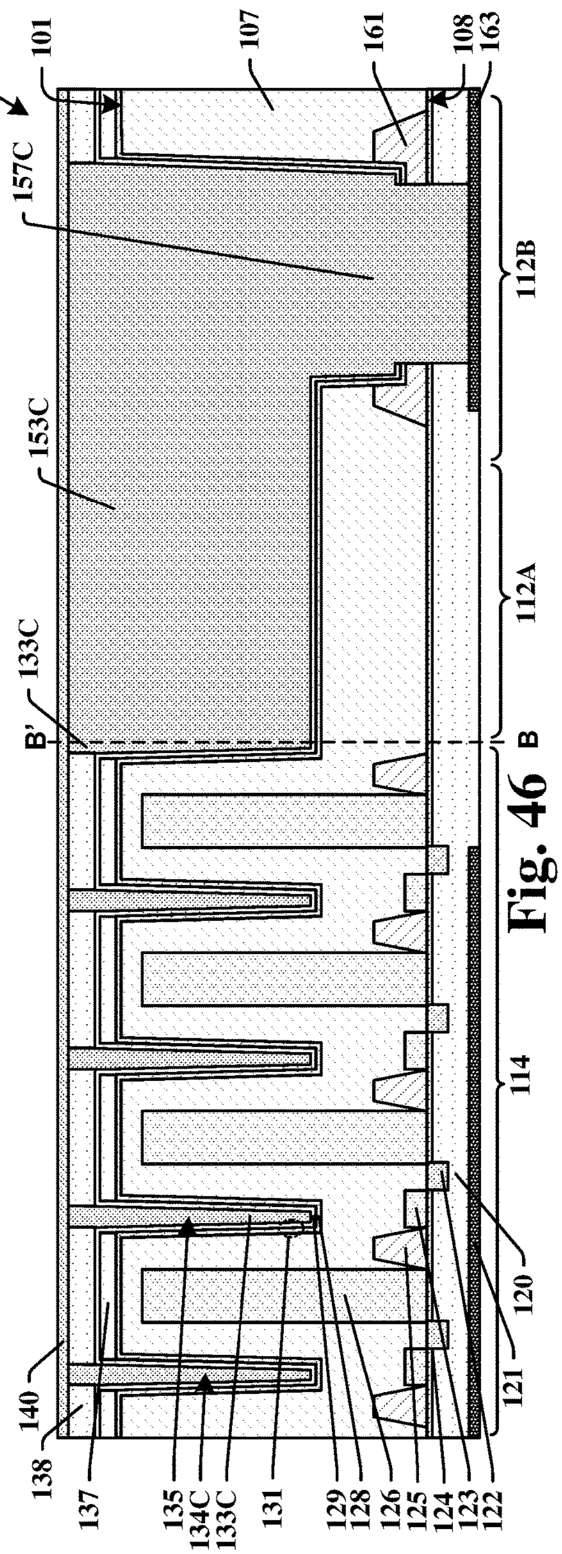

As shown by the cross-sectional view 4600 of FIG. 46 the conductive material 4501 may be planarized by CMP or the like and the etch stop layer 140 may be deposited over the planarized surface. Planarization defines the back side TSV 157C, the segment 153C, and the in-substrate metal grid 133C from the conductive material 4501. Processing may continue as shown by the cross-sectional views 2000-3000 of FIGS. 20-30 to provide an IC device such as the IC device 100C of FIGS. 3A-3D.

Figure 43:
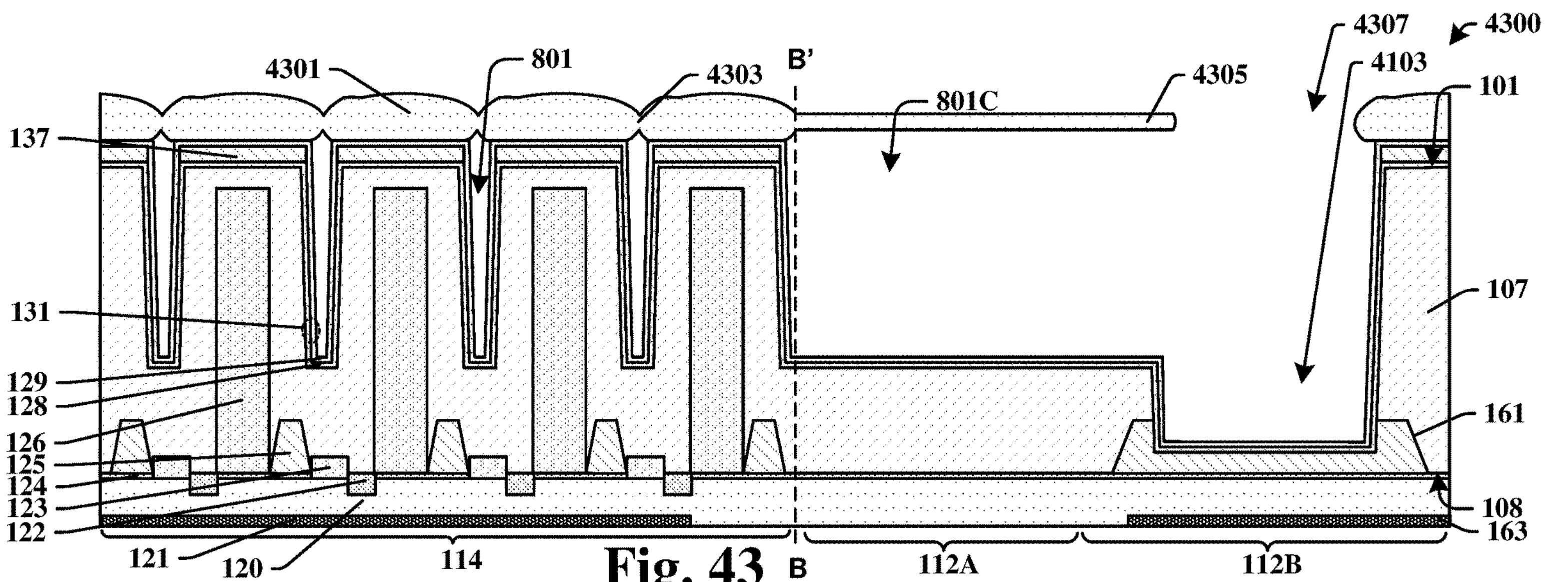
Figure 47:
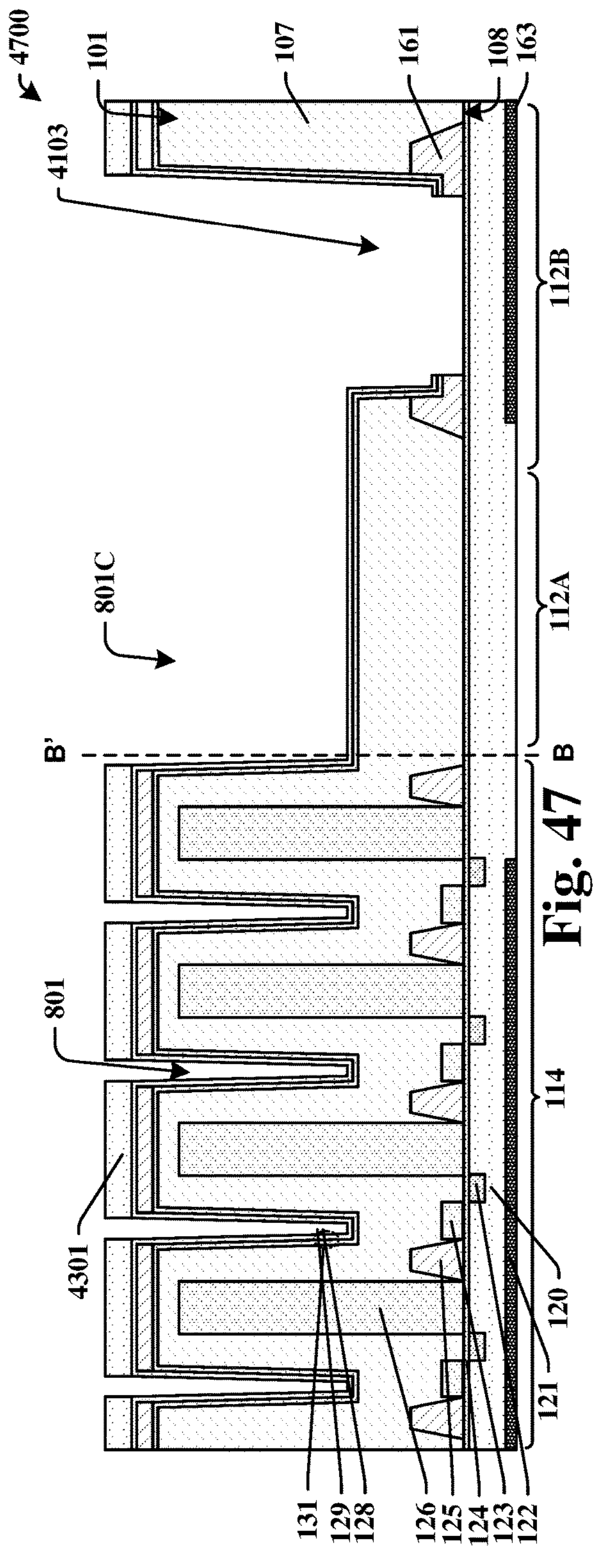
FIGS. 47-48 are a series of cross-sectional view illustrations exemplifying a variation on the method of FIGS. 41-46.
Figure 48:
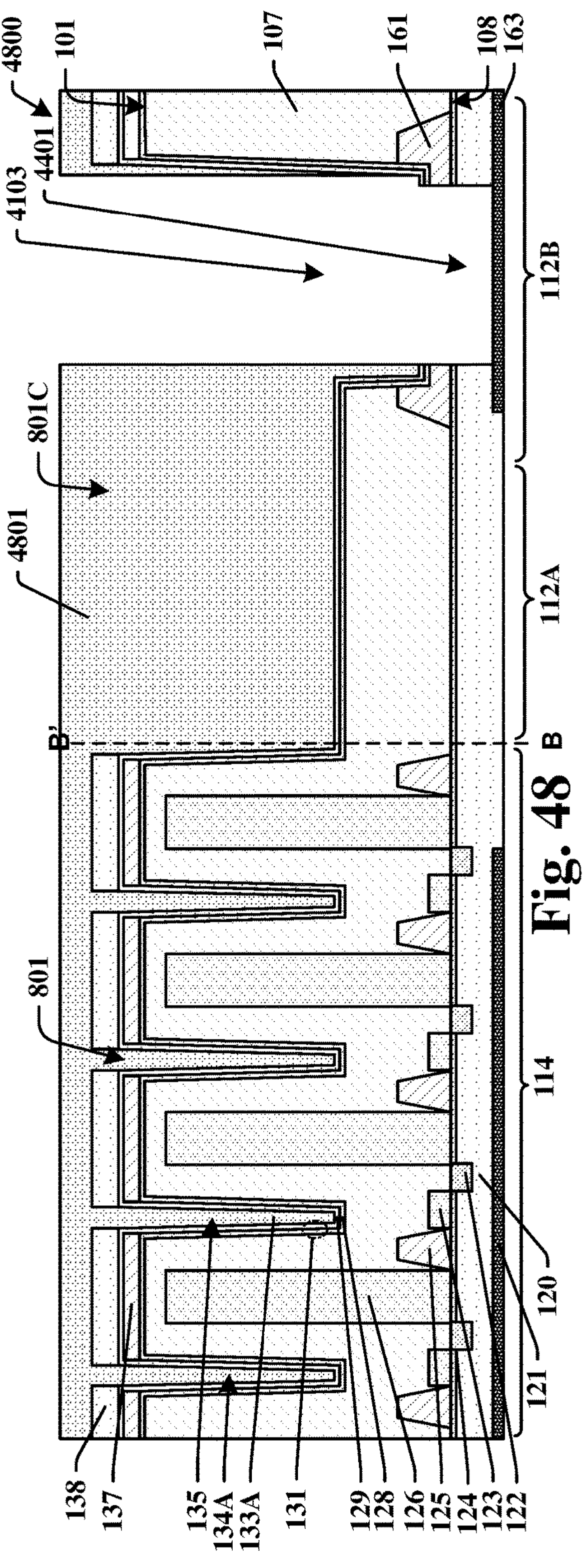

The cross-sectional views 4700 and 4800 of FIGS. 47 and 48 show a variation of the process shown by the cross-sectional view 4300 and 4400 of FIGS. 43 and 44. As shown by the cross-sectional view 4700 of FIG. 47, in this variation the thick dielectric layer 4301 may be deposited to a lesser thickness and need not close off the trenches 801. As shown by the cross-sectional view 4800 of FIG. 48, a mask 4801 formed by photolithography is patterned and used to etch the opening 4401. The mask 4801 may then be stripped and processing may continue as shown by the cross-sectional view 4500 of FIG. 45 and succeeding figures.

The cross-sectional views 4900-5200 of FIGS. 49-52 show a variation of the process shown by the cross-sectional view 4500 and 4600 of FIGS. 45 and 46. This variation may be used to produce the IC device 100D of FIG. 4. As shown by the cross-sectional view 4900 of FIG. 49, in this variation the conductive material 4501 is deposited more thinly whereby a gap 4903 remains within the TSV opening 4103. As shown by the cross-sectional view 5000 of FIG. 50, a fill material 5001 is deposited to fill the gap 4903. The fill material 5001 may be a dielectric, such as an oxide or the like, but could be any suitable fill material. The fill material 5001 may be deposited by CVD, PVD, electroplating, electroless plating, the like, or any other suitable process.

Figure 51:
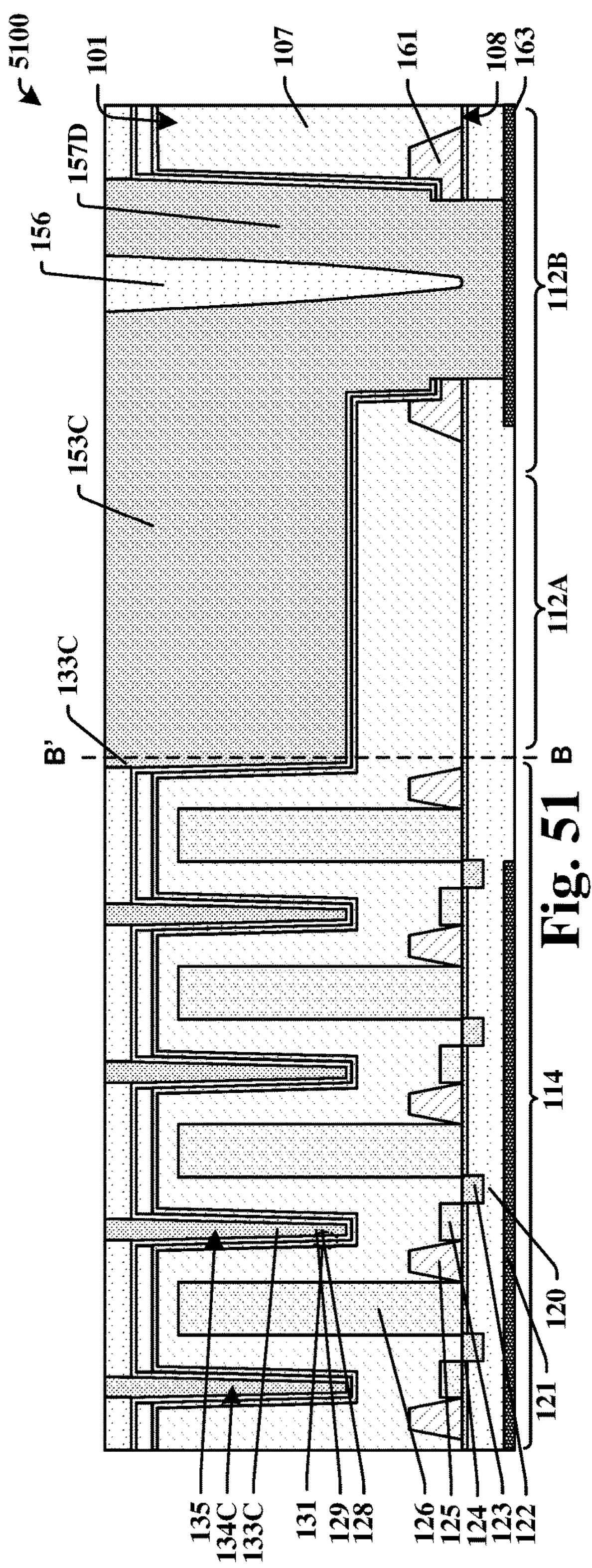
Figure 52:
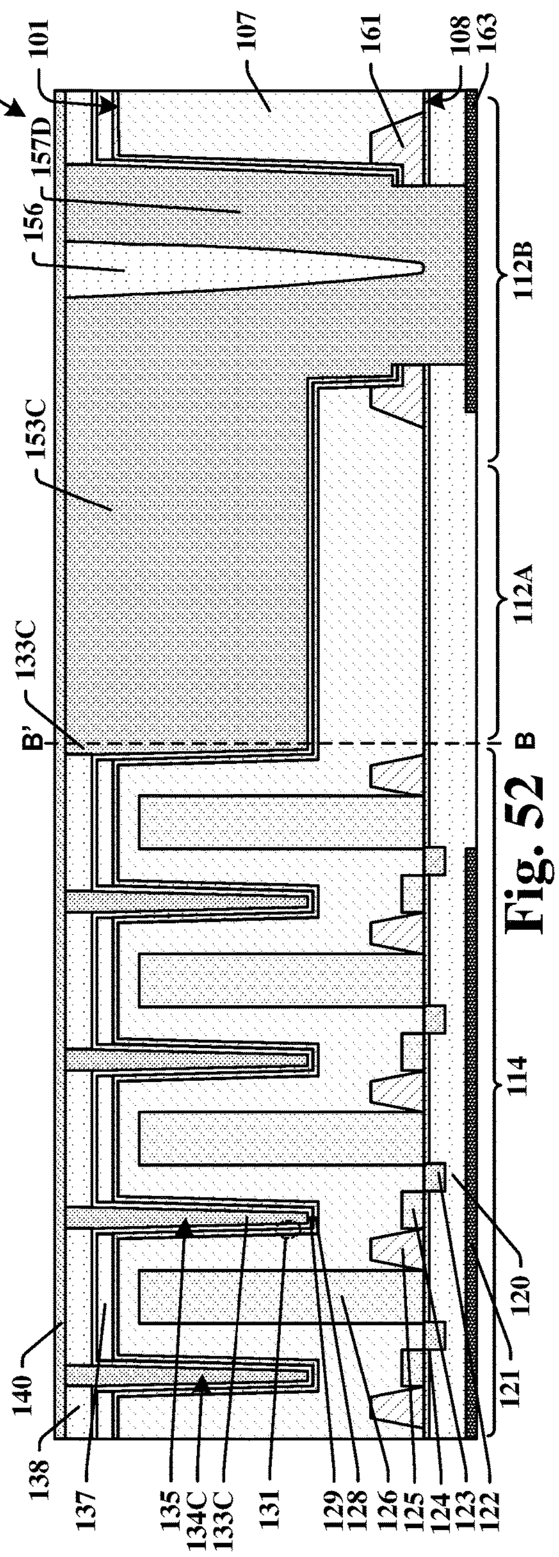

As shown by the cross-sectional view 5100 of FIG. 51, the conductive material 4501 and the fill material 5001 may be planarized together to define the back side TSV 157D, the fill 156, the segment 153C, and the in-substrate metal grid 133C. As shown by the cross-sectional view 5200 of FIG. 52, the etch stop layer 140 may be deposited and processing may continue as shown by the cross-sectional views 2000-3000 of FIGS. 20-30 to provide an IC device such as the IC device 100D of FIG. 4.

The cross-sectional views 5300-5600 of FIGS. 53-56 illustrate a process that combines two variations of the process shown by the cross-sectional views 700-3300 of FIGS. 7A, 7B, and 8-33 to produce the IC device 100E of FIG. 5. One of the variations is to use the IC device 3401 of FIG. 34, which includes the front side TSV 160 in place of the IC device 701 of FIG. 7A. The other variation is to use the processing illustrated by the cross-sectional views 4100 and 4400 of FIGS. 41 and 44 to produce the in-substrate metal grid 133C that intersects the back side TSV 157E.

Figure 41:
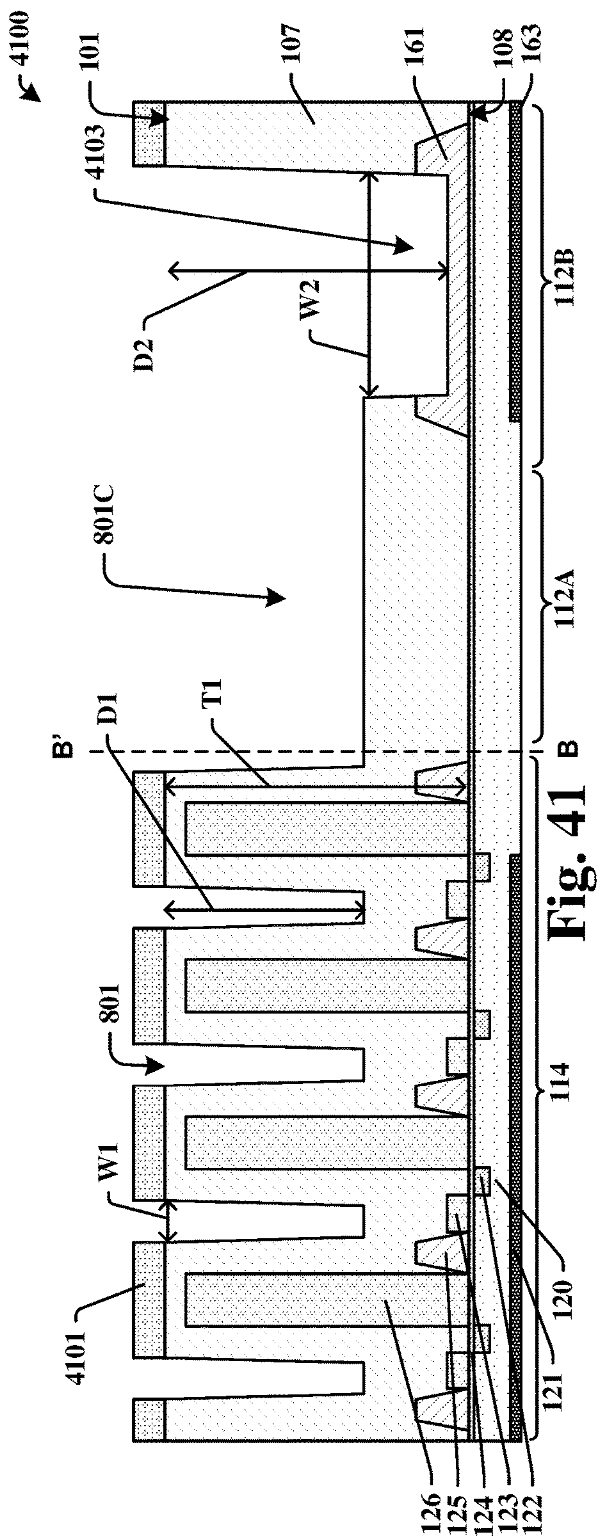
FIGS. 41-46 are a series of cross-sectional view illustrations exemplifying a variation on the method of FIGS. 7A, 7B, and 8-33.
Figure 53:
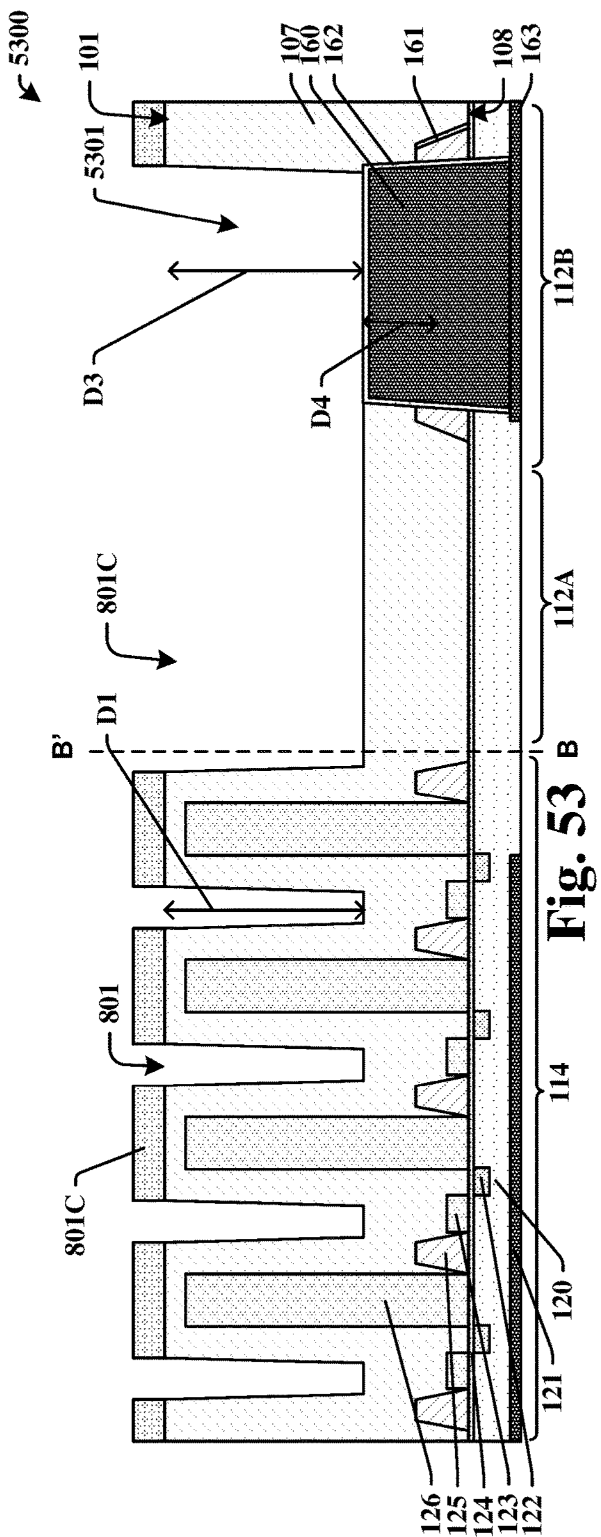
FIGS. 53-56 are a series of cross-sectional view illustrations exemplifying a variation on the method of FIGS. 41-46.

As shown by the cross-sectional view 5300 of FIG. 53, which may be compared to the cross-sectional view 4100 of FIG. 41, if the starting IC device includes the front side TSV 160 the TSV opening 5301 does not need to be as deep as the TSV opening 4103. A depth D3 of the TSV opening 4103 is reduced by a depth D4 of the front side TSV 160, whereby the depth D3 can be anywhere between the depth D2 of the TSV opening 4103 of FIG. 41 to the depth D1 of the trenches 801.

Figure 54:
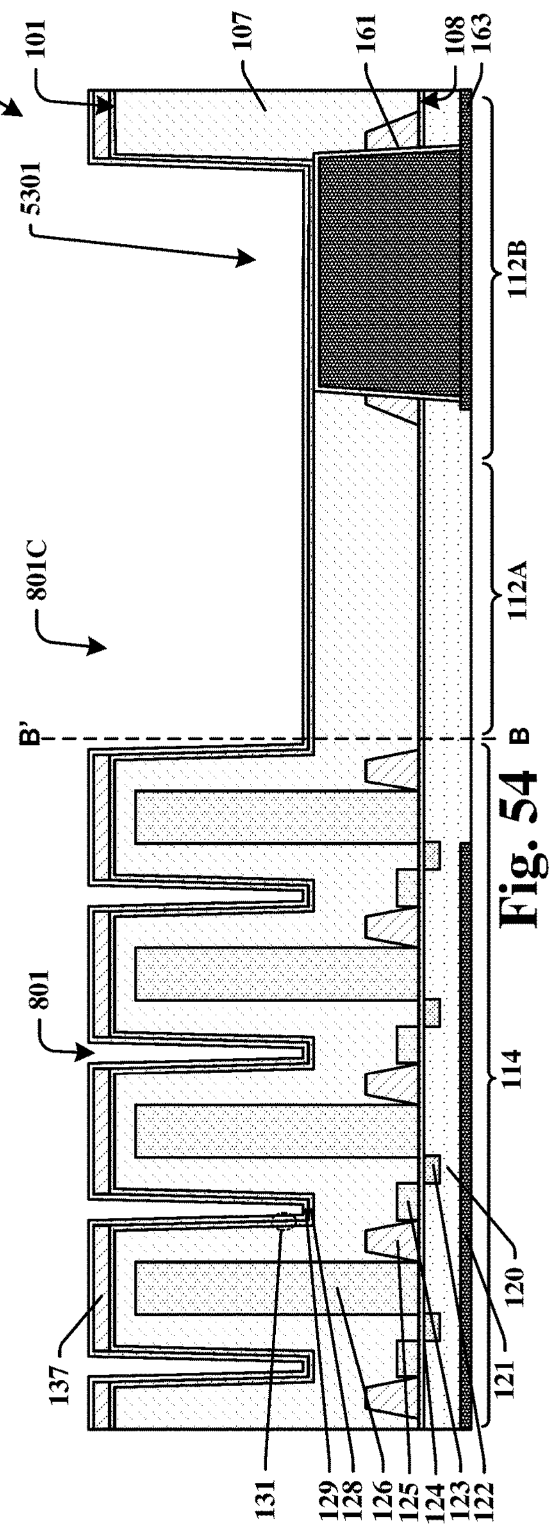
Figure 55:
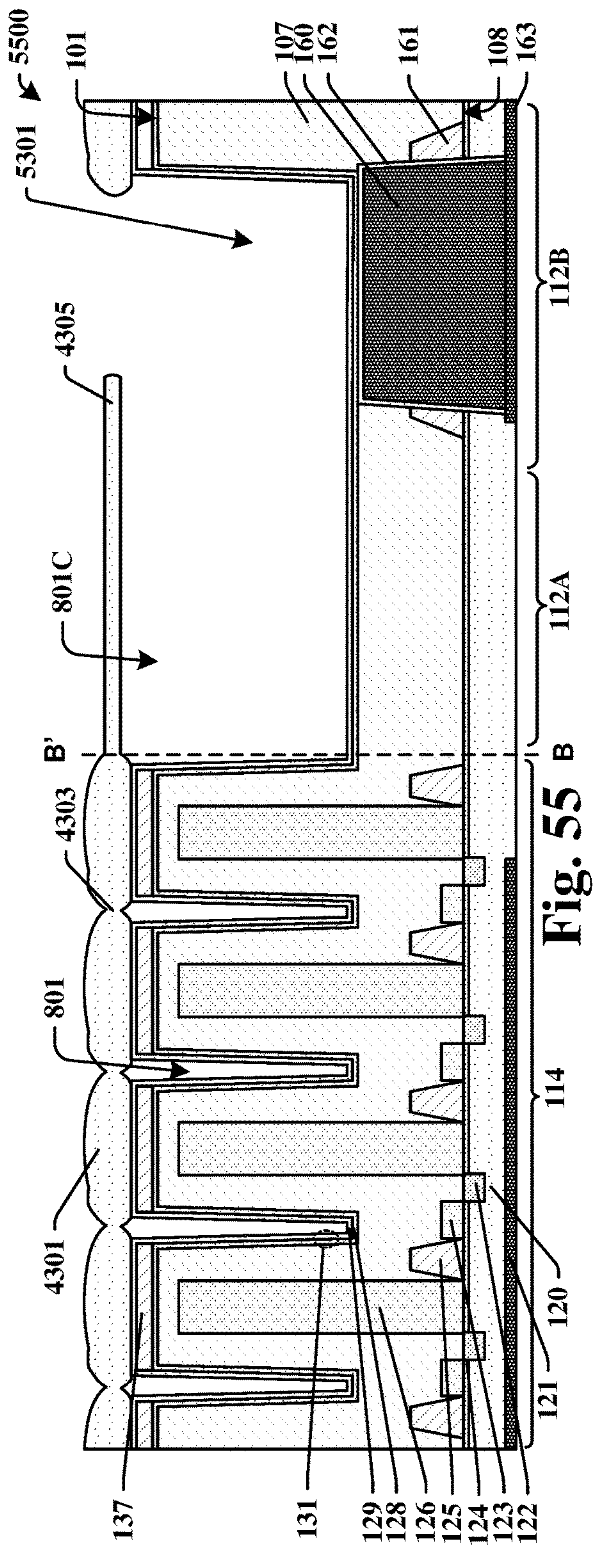

As shown by the cross-sectional views 5400 and 5500 of FIGS. 54 and 55, the high-κ liner 128, the high-κ capping layer 137, the second dielectric liner 129, and the thick dielectric layer 4301 may be formed over the structure shown by the cross-sectional view 5300 of FIG. 53. As shown by the cross-sectional views 5600 of FIG. 56, etching using the thick dielectric layer 4301 as a mask produces the opening 5601 through which the front side TSV 160 is exposed. The opening 5601 may be much shallower than the opening 4401 produced by the corresponding process illustrated in the cross-sectional view 4400 of FIG. 44. Accordingly, the front side TSV 160 reduces the demands on the etch process that uses the thick dielectric layer 4301 as a mask. Processing may continue as illustrated by the cross-sectional views 4500 and 4600 of FIGS. 45 and 46 and by the cross-sectional views 2000-3000 of FIGS. 20-30 to provide an IC device such as the IC device 100E of FIG. 5.

Figure 56:
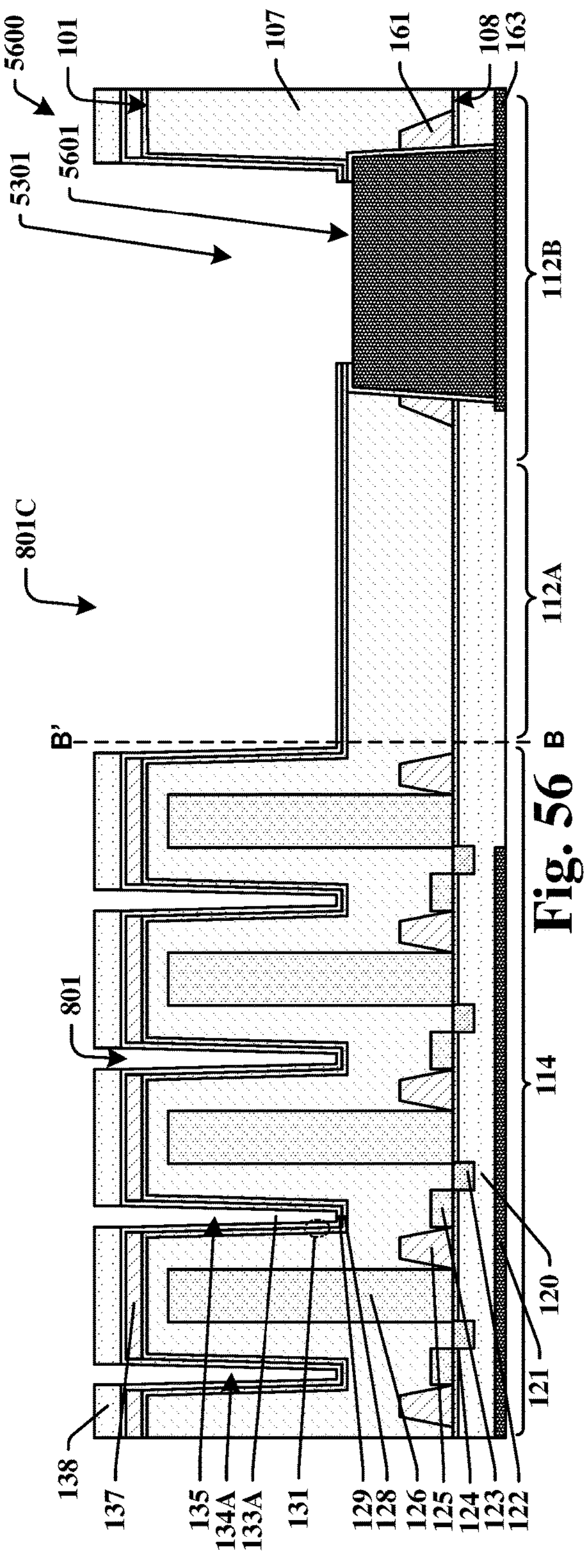
Figure 57:
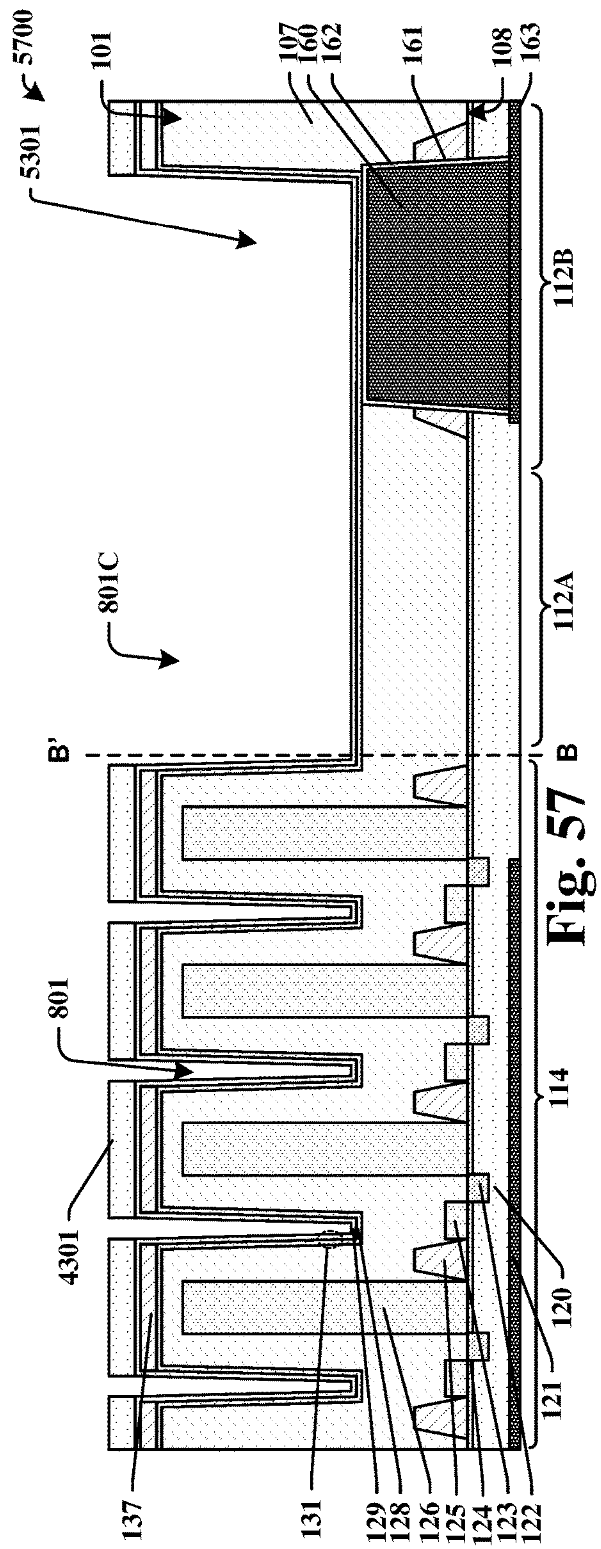
FIGS. 57-58 are a series of cross-sectional view illustrations exemplifying a variation on the method of FIGS. 53-56.
Figure 58:
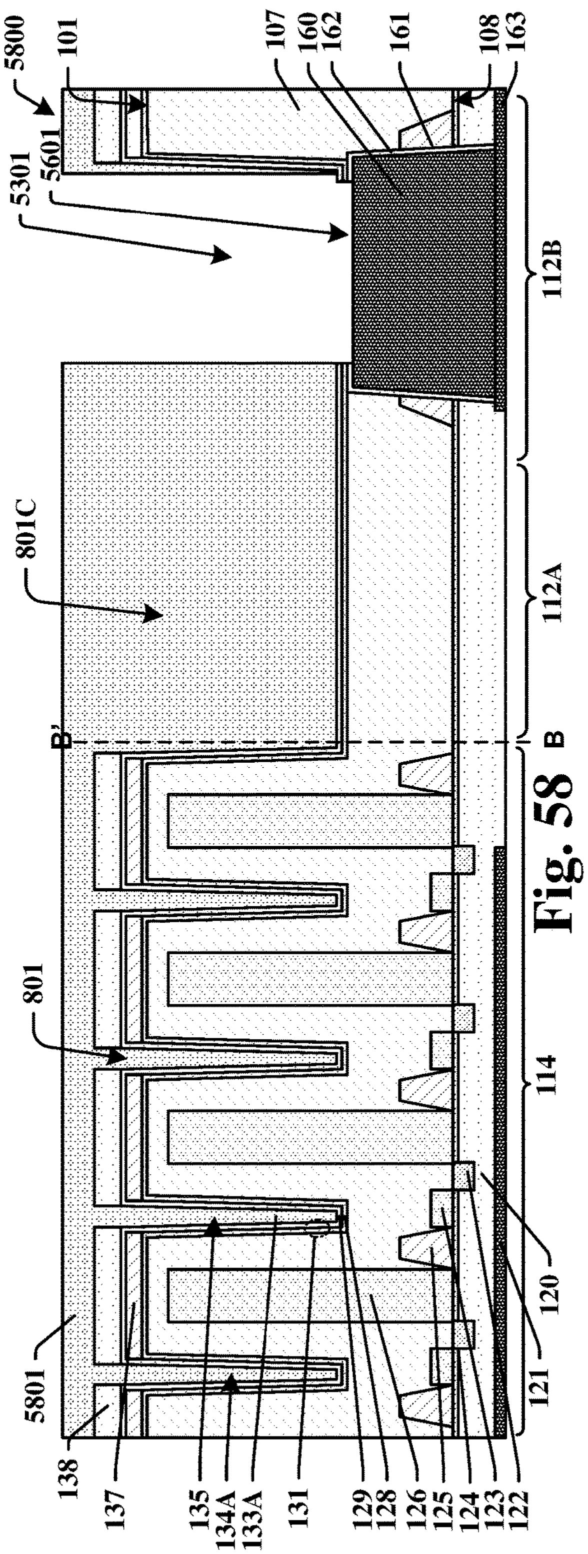

The cross-sectional views 5700 and 5800 of FIGS. 57 and 58 show a variation of the processing illustrated by the cross-sectional views 5500 and 5600 of FIGS. 55-56. In this variation, the thick dielectric layer 4301 may be deposited to a lesser thickness and need not close off the trenches 801. As shown by the cross-sectional view 5800 of FIG. 58, a mask 5801 that is formed and patterned by photolithography is used to etch the opening 5601. This process uses an extra mask but assures the opening 5601 may be formed without over etching within the trenches 801 or on the sidewalls of the TSV opening 5301.

The cross-sectional views 5900-6400 of FIGS. 59-64 illustrate a variation of the process shown by the cross-sectional views 700-3300 of FIGS. 7A, 7B, and 8-33, which variation may be used to form an IC device such as the IC device 100F of FIGS. 6A-6D. As shown by the cross-sectional view 5900 of FIG. 59, which may be compared to the cross-sectional view 2000 of FIG. 20, in this variation the processing that forms the conductive bridge 155A and the back side TSV 157A is omitted.

Figure 60:
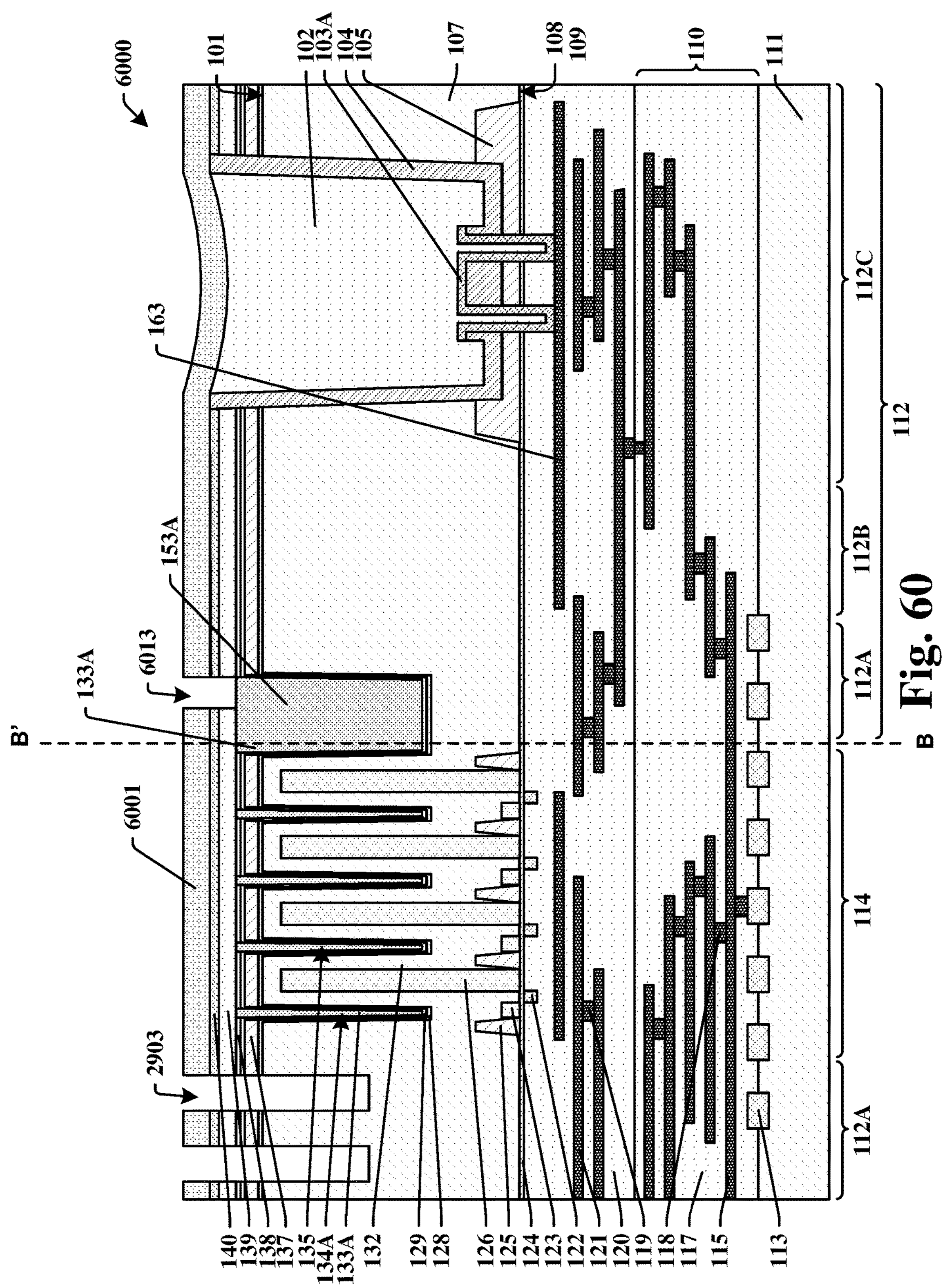

As shown by the cross-sectional view 6000 of FIG. 60, a mask 6001 may be formed by photolithography and used to etch the ground bar openings 2903. This is like the process shown by the cross-sectional view 2900 of FIG. 29, except that in the present example the process may also be used to etch the opening 6013 through which the segment 153A of the in-substrate metal grid 133A is exposed. The mask 6001 may be stripped after the etch.

Figure 61:
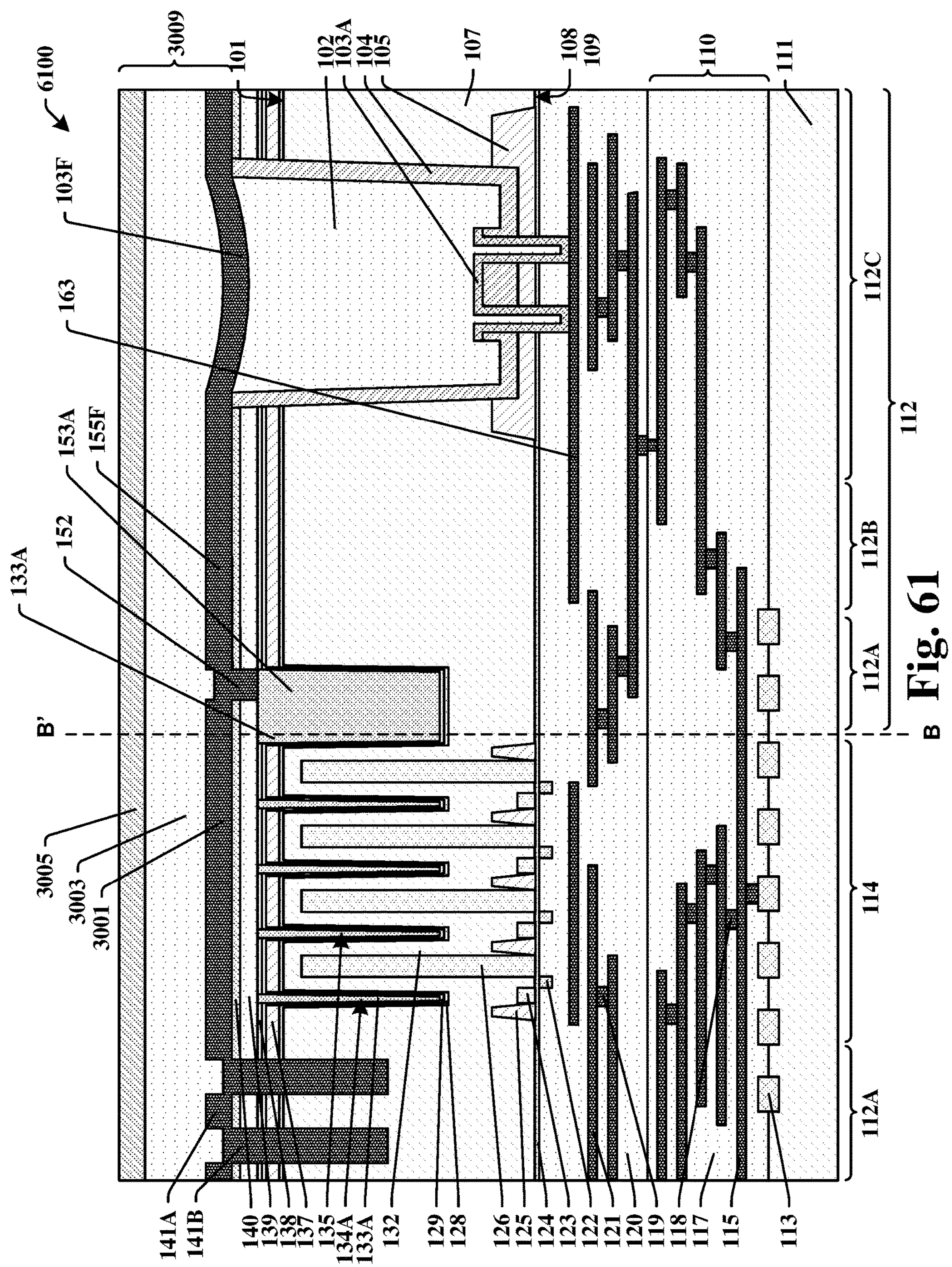

As shown by the cross-sectional view 6100 of FIG. 61, the composite grid stack 3009 may be deposited over the structure shown by the cross-sectional view 6000 of FIG. 60. The metal layer 3001 of the composite grid stack 3009 forms the via 152 in the opening 6013 in addition to forming the ground bars 141B within the ground bar openings 2903. As shown by the cross-sectional view 6200 of FIG. 62, the mask 6201 may be formed by photolithography and used to etch the composite grid 149 from the composite grid stack 3009 as in the process of FIG. 31. Etching the composite grid stack 3009 to form the composite grid 149 separates the back side metal grid 141 from other portions of the metal layer 3001 that provide the conductive bridge 155F and the contact pad 103F. The mask 6201 may then be stripped.

Figure 63:
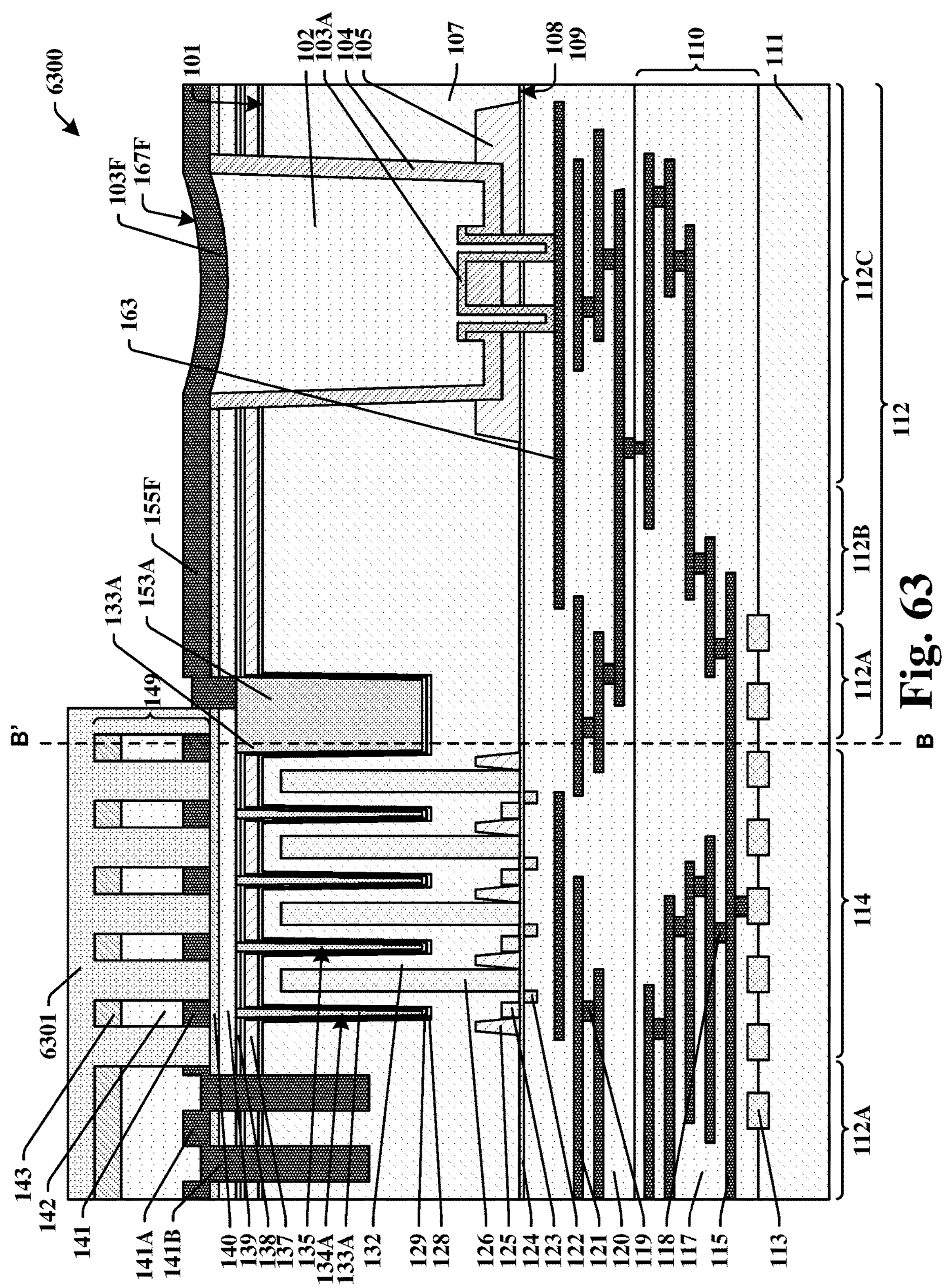

As shown by the cross-sectional view 6300 of FIG. 63, a mask 6301 may be formed by photolithography and used to remove the dielectric layer 3003 and the hard mask layer 3005 from the conductive bridge 155F and the contact pad 103F. As shown by the cross-sectional view 6400 of FIG. 64, the encapsulation layer 145 may be formed over the structure shown by the cross-sectional view 6300 of FIG. 63. The color filters 146 and micro-lenses 147 may be formed over the composite grid 149 and an opening 165F etched through the encapsulation layer 145 over the contact pad 103F to produce a structure like the IC device 100F of FIG. 6A-6D.

Figure 65:
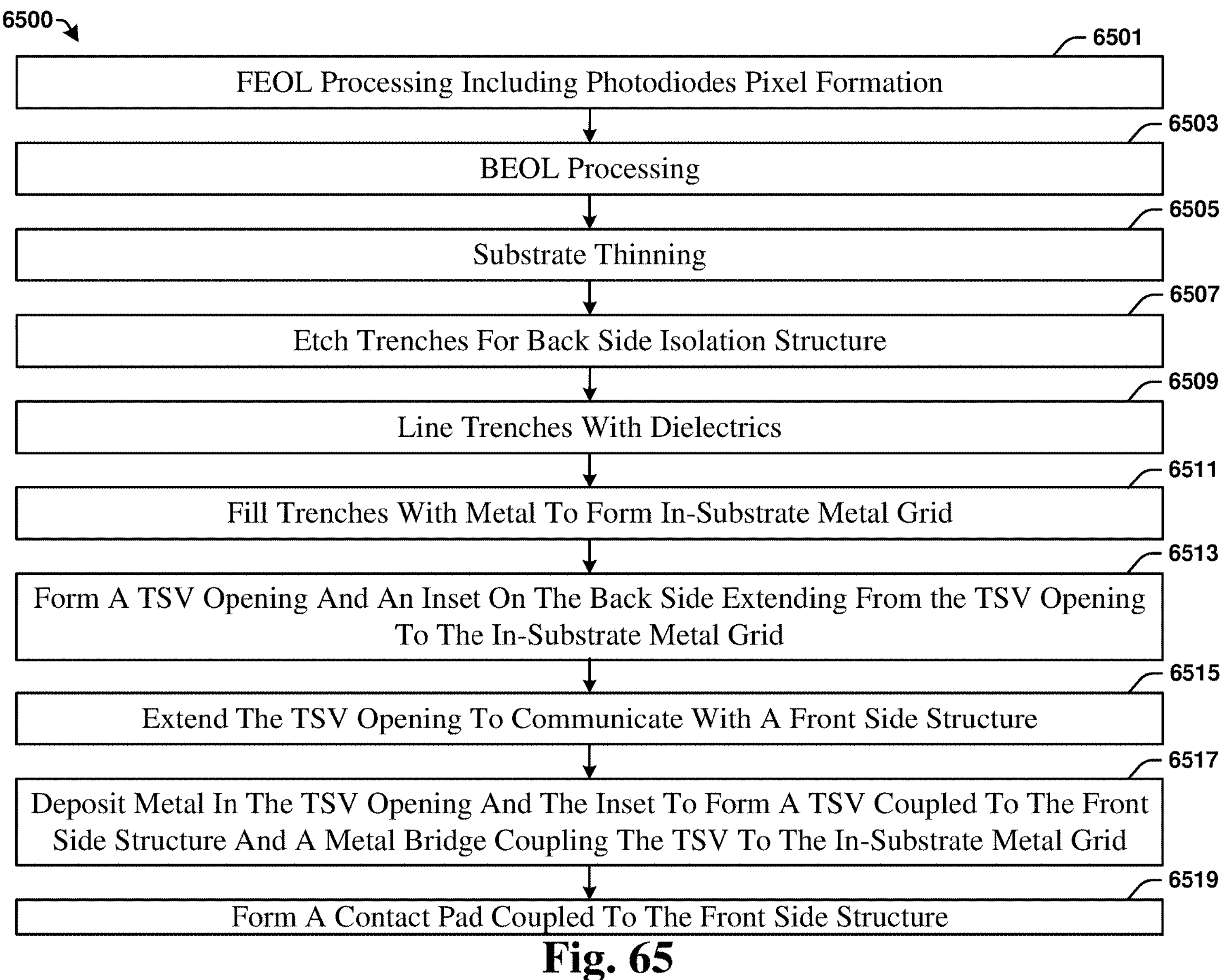
FIGS. 65-67 are flow charts of manufacturing processes according to various aspects of the present teachings.

FIG. 65 presents a flow chart for a process 6500 according to the present disclosure which may be used to form the IC device 100A of FIGS. 1A-1D, the IC device 100B of FIG. 2A, the IC device 110B of FIG. 2B, or another IC device. While the process 6500 of FIG. 65 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 6500 begins with act 6501 and act 6503, FEOL processing including the process that forms photodetector pixels and BEOL processing that forms a metal interconnect. In various embodiments, the resulting structure is the IC device 701 of FIG. 7A, the IC device 3401 of FIG. 34, or some other IC device that includes photodetector pixels.

The process continues with act 6505, thinning the substrate from the back side. FIG. 7B provides an example. As shown in FIG. 7A, the IC device may be attached to a second IC device through the metal interconnect prior to thinning. The second IC device may then provide structural integrity through the thinning process.

Figure 8:
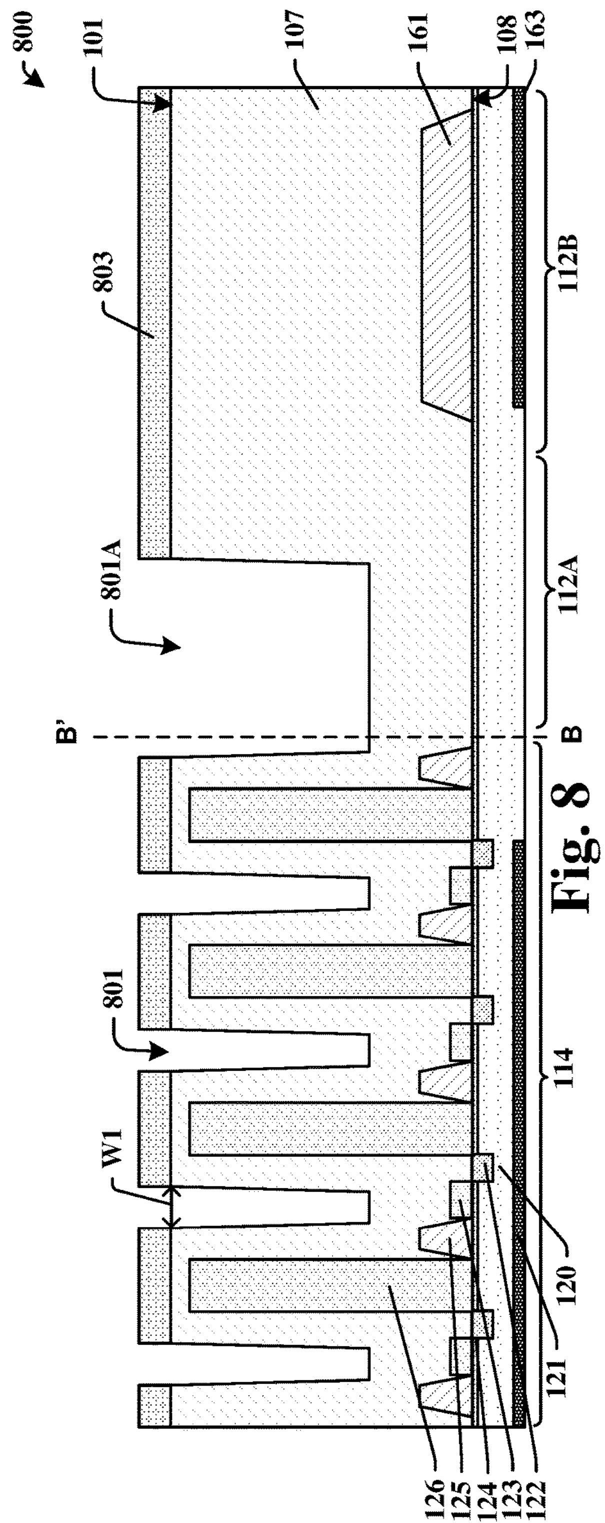

The process continues with act 6507, etching trenches for a back side isolation structure. The cross-sectional view 800 of FIG. 8 provides an example. The trenches include trenches that extend into the semiconductor substrate and between the photodetector pixels and at least one trench that extends outside the pixel area.

The process continues with act 6509, depositing one or more dielectric layers to line the trenches. The cross-sectional views 900-1100 of FIGS. 9-11 provide an example. The dielectric layers may include one or more high-κ dielectric layers.

The process continues with act 6511 filling the trenches with conductive material. This may include depositing the conductive material and planarizing. The cross-sectional views 1200 and 1300 of FIGS. 12 and 13 provide an example. The conductive material forms the in-substrate metal grid including a segment that extends out from the pixel area.

Figure 35:
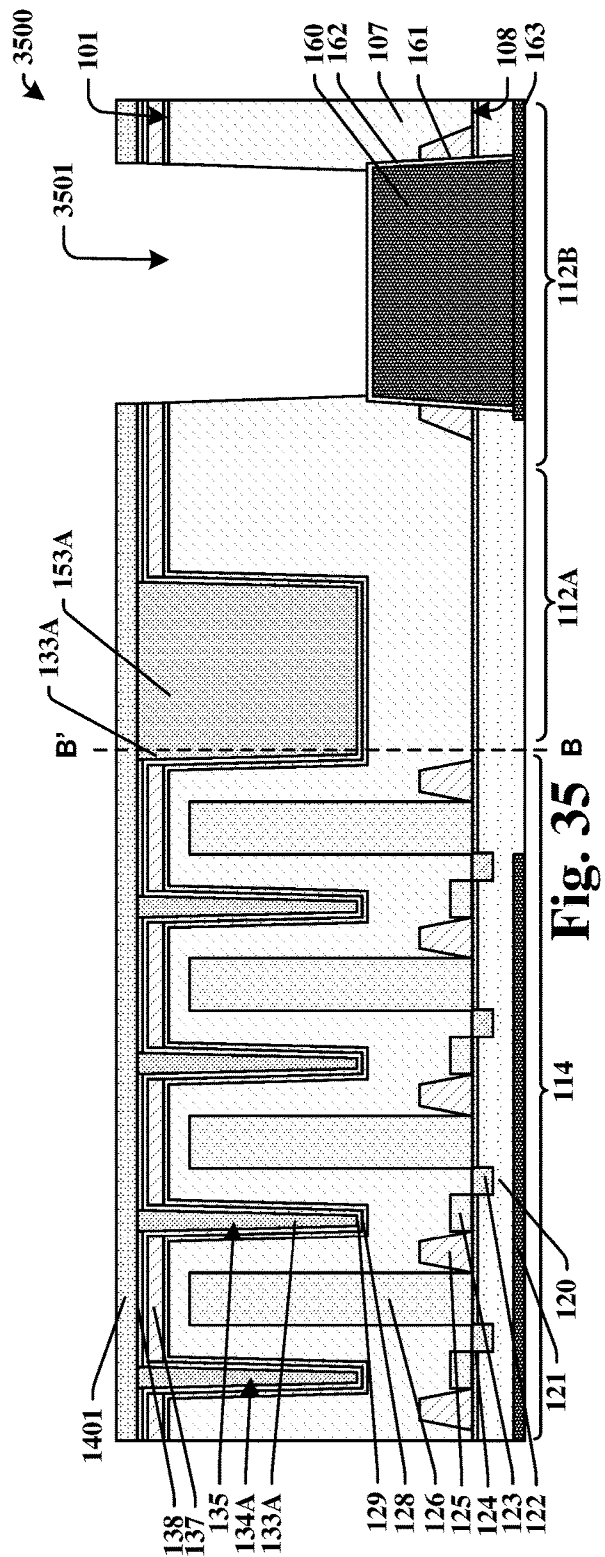
Figure 36:
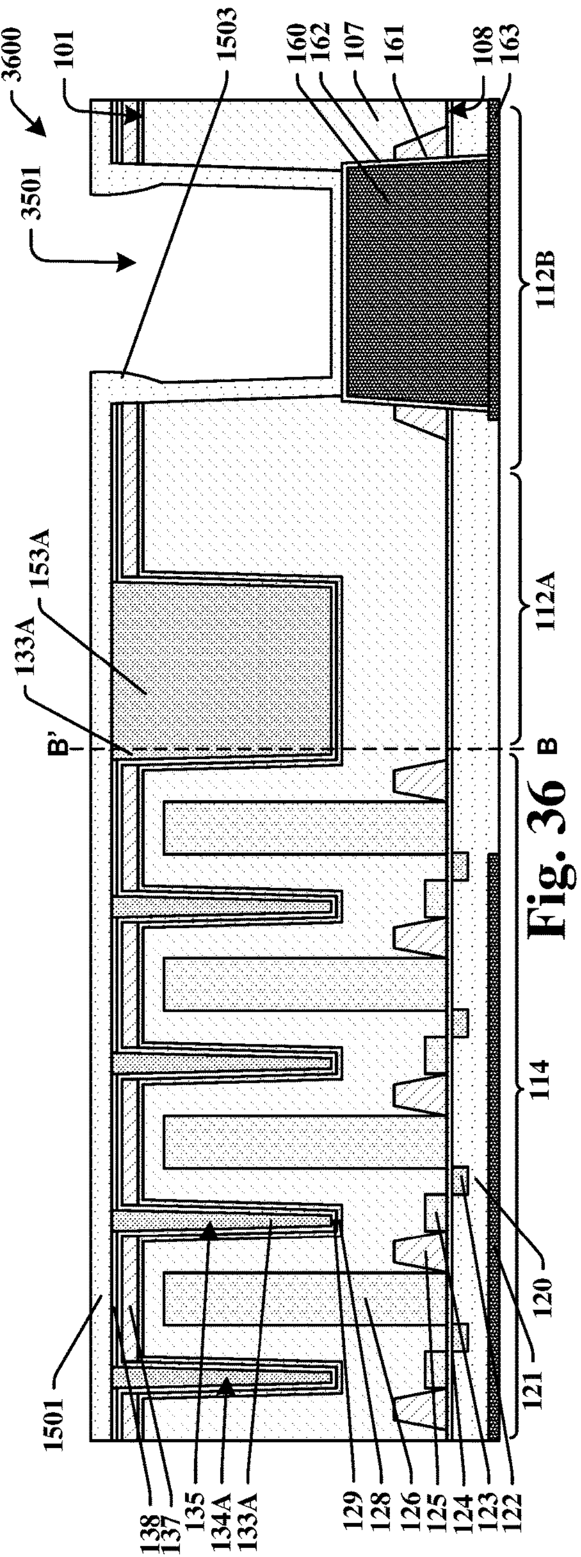

The process continues with act 6513, forming a back side TSV opening and an inset on the back side. The inset may be formed within a dielectric on the back side of the semiconductor substrate and extends from the segment of the in-substrate metal grid to the TSV opening. The TSV opening extends into the semiconductor substrate but need not extend through the semiconductor substrate. The cross-sectional views 1400 and 1500 of FIGS. 14 and 15 provide one example. The cross-sectional views 3500 and 3600 of FIGS. 35 and 36 provide another example.

Figure 37:
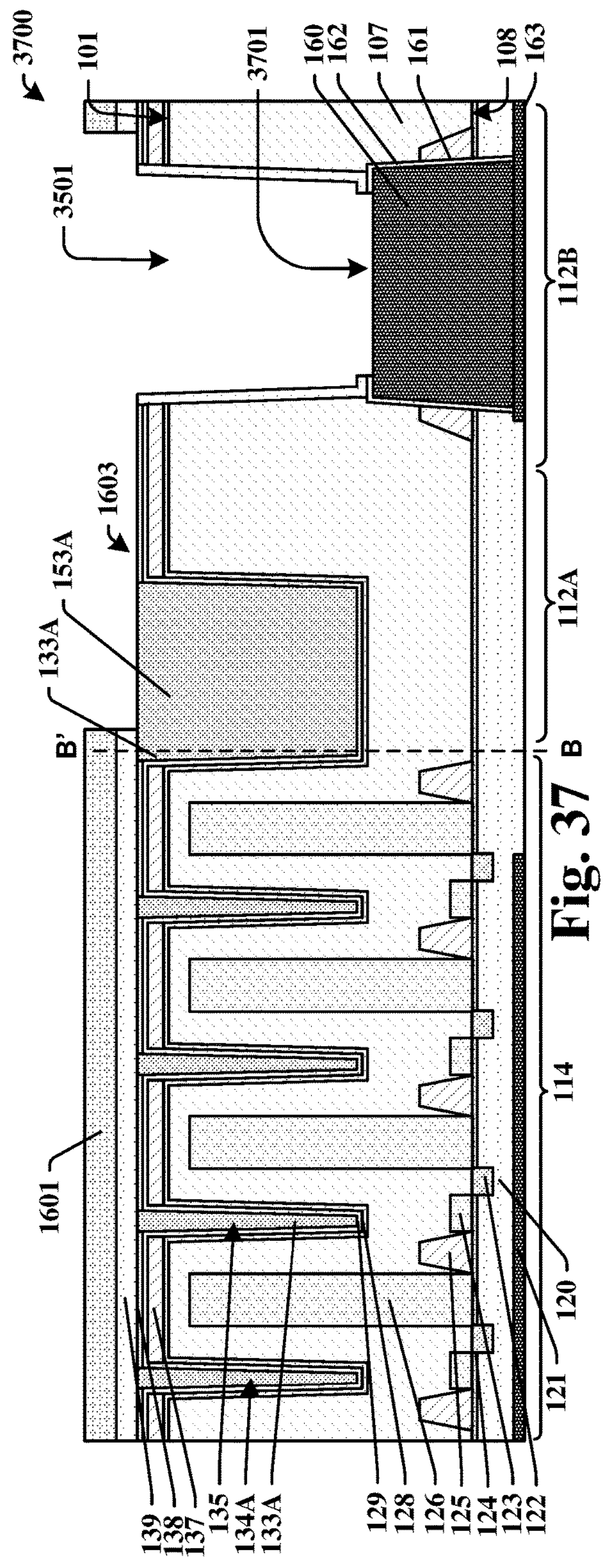

The process continues with act 6515 extending the back side TSV opening to communicate with a front side conductive structure. The cross-sectional view 1600 of FIG. 16 provides an example in which the front side conductive structure is the metal pad 163. The cross-sectional view 3700 of FIG. 37 provides another example in which the front side conductive structure is the front side TSV 160, which is coupled to the metal pad 163. The front side conductive structure may also be the heavily doped area 164, the vias 166, and the metal pad 163 shown in FIG. 2B.

Figure 38:
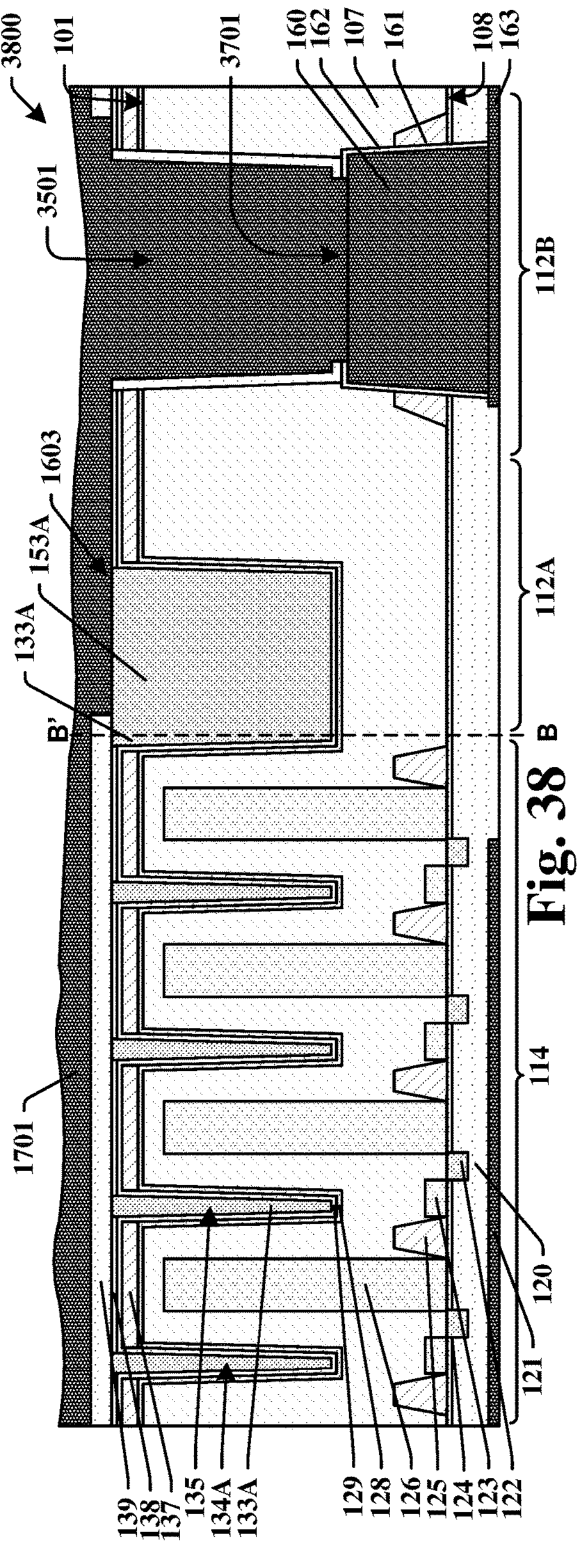
Figure 39:
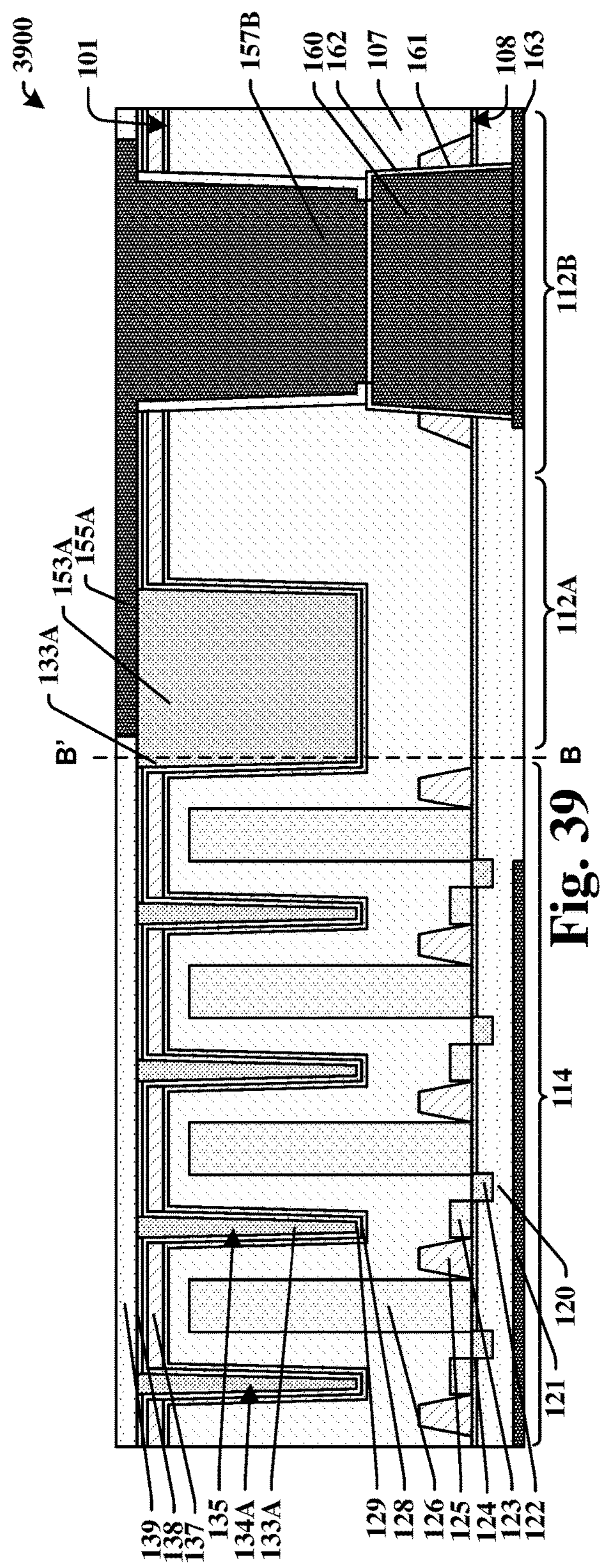
Figure 40:
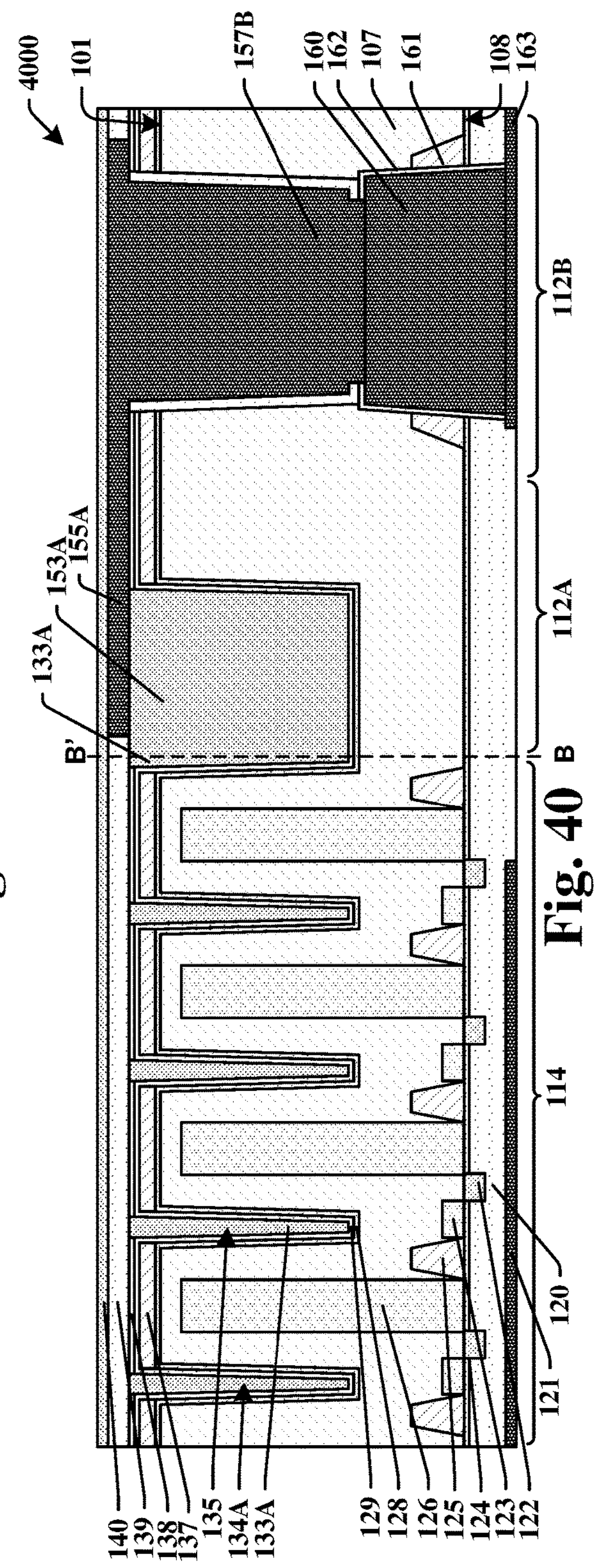

The process continues with act 6517 filling the inset and the back side TSV opening with conductive material to form a conductive bridge and a back side TSV. The back side TSV is coupled to the front side conductive structure. The conductive bridge couples the back side TSV to the in-substrate metal grid. The processing may include depositing conductive material and planarizing. The cross-sectional views 1700 and 1800 of FIGS. 17 and 18 provide one example. The cross-sectional views 3800 and 3900 of FIGS. 38 and 39 provide another example.

The process continues with act 6519, forming a contact pad coupled to the front side conductive structure. The cross-sectional views 2100-3100 of FIGS. 21-31 provide an example. The contact pad may be a back side contact pad and is directly coupled to the in-substrate metal grid through the front side conductive structure, the back side TSV, and the conductive bridge.

Figure 66:
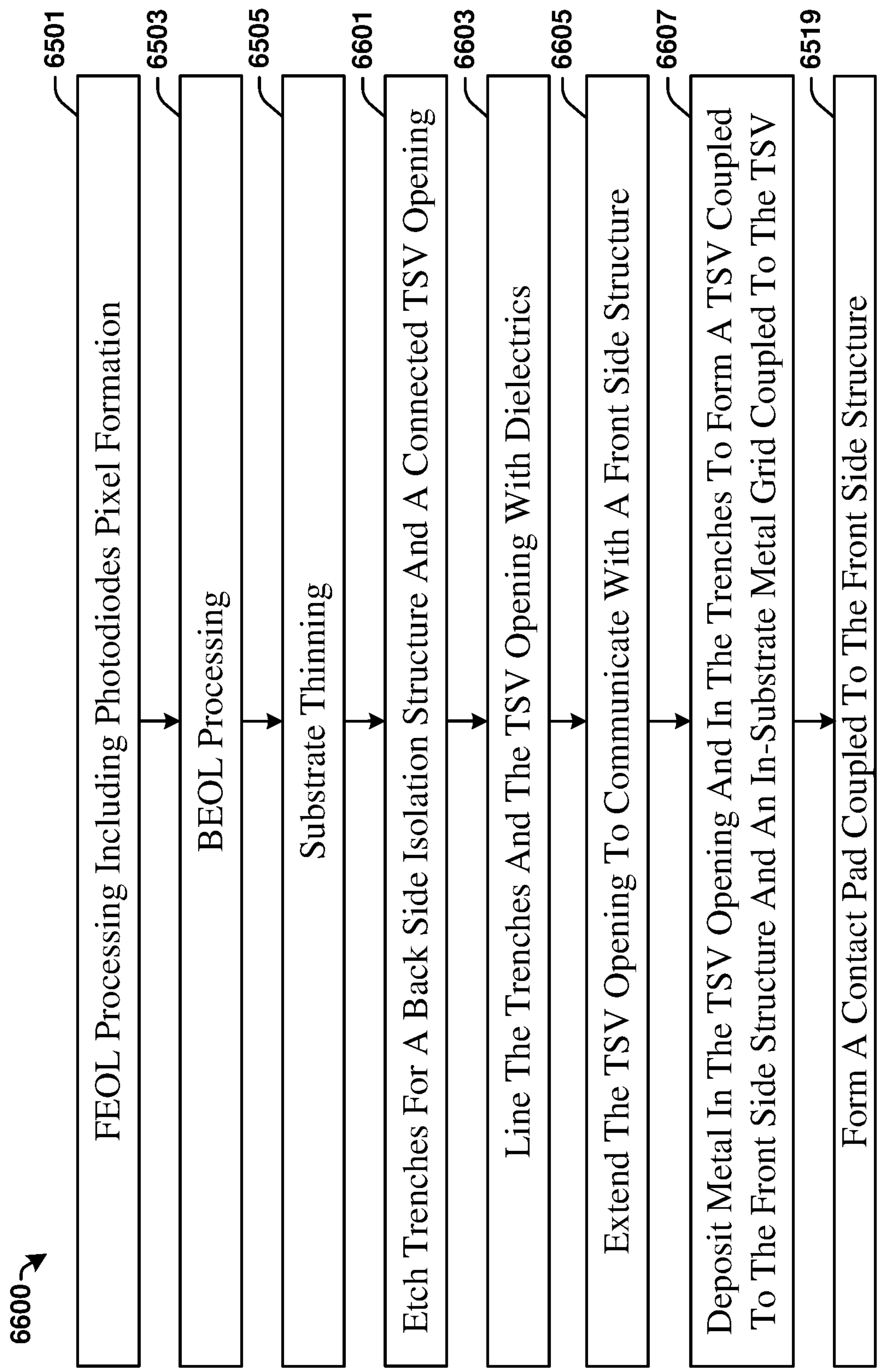

FIG. 66 presents a flow chart for a process 6600 according to the present disclosure which may be used to form the IC device 100C of FIGS. 3A-3D, the IC device 100D of FIG. 4, the IC device 100E of FIG. 5, or another IC device. While the process 6600 of FIG. 66 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 6600 begins with acts 6501, 6503, and 6505 which may be the same as for the process 6500. The process 6600 continues with act 6601, etching trenches for a back side isolation structure and a back side TSV opening. In process 6600, the trenches for the back side isolation structure and the TSV opening may be etched simultaneously and the trenches for the back side isolation structure extend to intersect the TSV opening. The layout of the trenches for the back side isolation structure and the TSV opening may corresponds with the layout of the in-substrate metal grid 133C and the back side TSVs 135C illustrated in FIG. 3D. The cross-sectional view 4100 of FIG. 41 provides one example in which the TSV opening is deeper than the trenches, which may be facilitated by the TSV opening being wider than the trenches are broad. The cross-sectional view 5300 of FIG. 53 provides another example in which the difference in depths may be reduced or eliminated through the use of a front side TSV or other structure that allows the back side TSV to be shorter.

The process continues with act 6603, depositing one or more dielectric layers that line both the trenches and the back side TSV opening. The dielectric layers may include one or more high-κ dielectric layers. The cross-sectional view 4200 of FIG. 42 provides one example. The cross-sectional view 5400 of FIG. 54 provides another example.

The process continues with act 6605, extending the back side TSV opening to communicate with a front side conductive structure. The cross-sectional views 4300 and 4400 of FIGS. 43 and 44 provide an example in which a non-conformally deposited thick dielectric layer provides a mask for this etch and the etch brings the TSV opening into direct communication with a metal pad on the front side. The cross-sectional views 4700 and 4800 of FIGS. 47 and 48 provide an example in which photolithography provides the mask for this etch and the etch brings the TSV opening into direct communication with the front side metal pad. FIGS. 55 and 56 provide an example in which a non-conformally deposited thick dielectric layer provides a mask for this etch and the etch brings the TSV opening into communication with a front side TSV or like structure that is itself coupled to the front side metal pad. The cross-sectional views 5700 and 5800 of FIGS. 57 and 58 provide an example in which photolithography provides the mask for this etch and the etch brings the TSV opening into communication with a front side TSV or like structure that is itself coupled to the front side metal pad.

Figure 49:
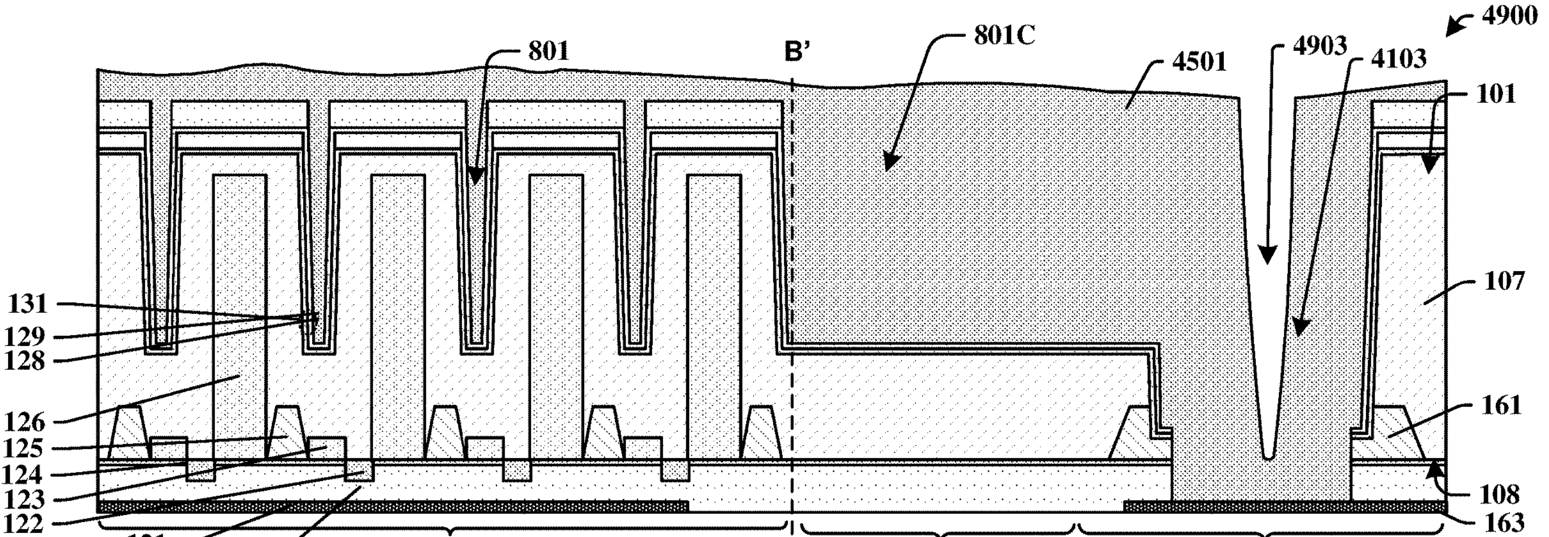
FIGS. 49-52 are a series of cross-sectional view illustrations exemplifying a variation on the method of FIGS. 41-46.
Figure 50:
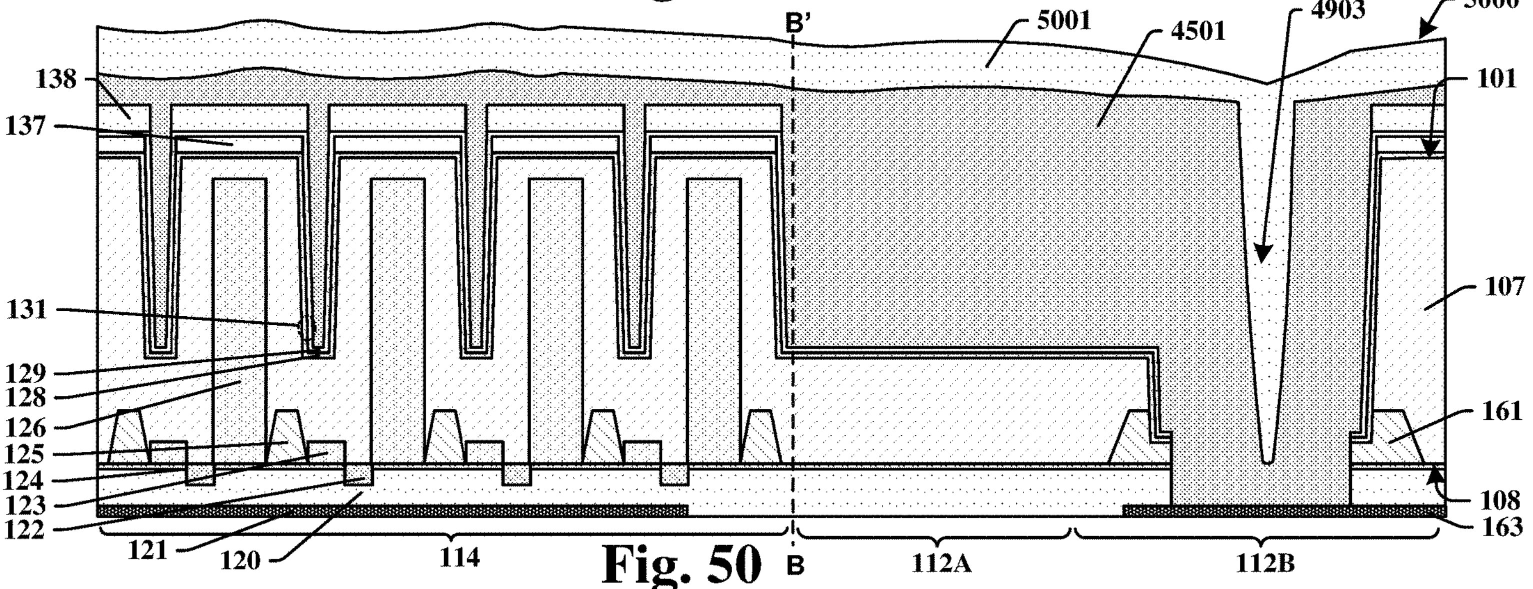

The process continues with act 6607 depositing metal in the trenches and the back side TSV opening to form a back side TSV and an in-substrate metal grid with a segment intersecting the back side TSV. This may include depositing the conductive material and planarizing. The cross-sectional views 4300 and 5500 of FIGS. 43 and 55 provide examples in which the metal completely fills the trenches and the back side TSV opening. The cross-sectional view 4900 of FIG. 49 provides an example in which the metal forms the back side TSV but incompletely fills the back side TSV opening. A void in the metal be filled as shown by the cross-sectional views 5000 and 5100 of FIGS. 50 and 51. In all of these cases, the in-substrate metal grid is coupled to the front side conductive structure through the back side TSV.

The process continues with act 6519, forming a contact pad coupled to the front side conductive structure. This may be the same as in the process 6500.

Figure 67:
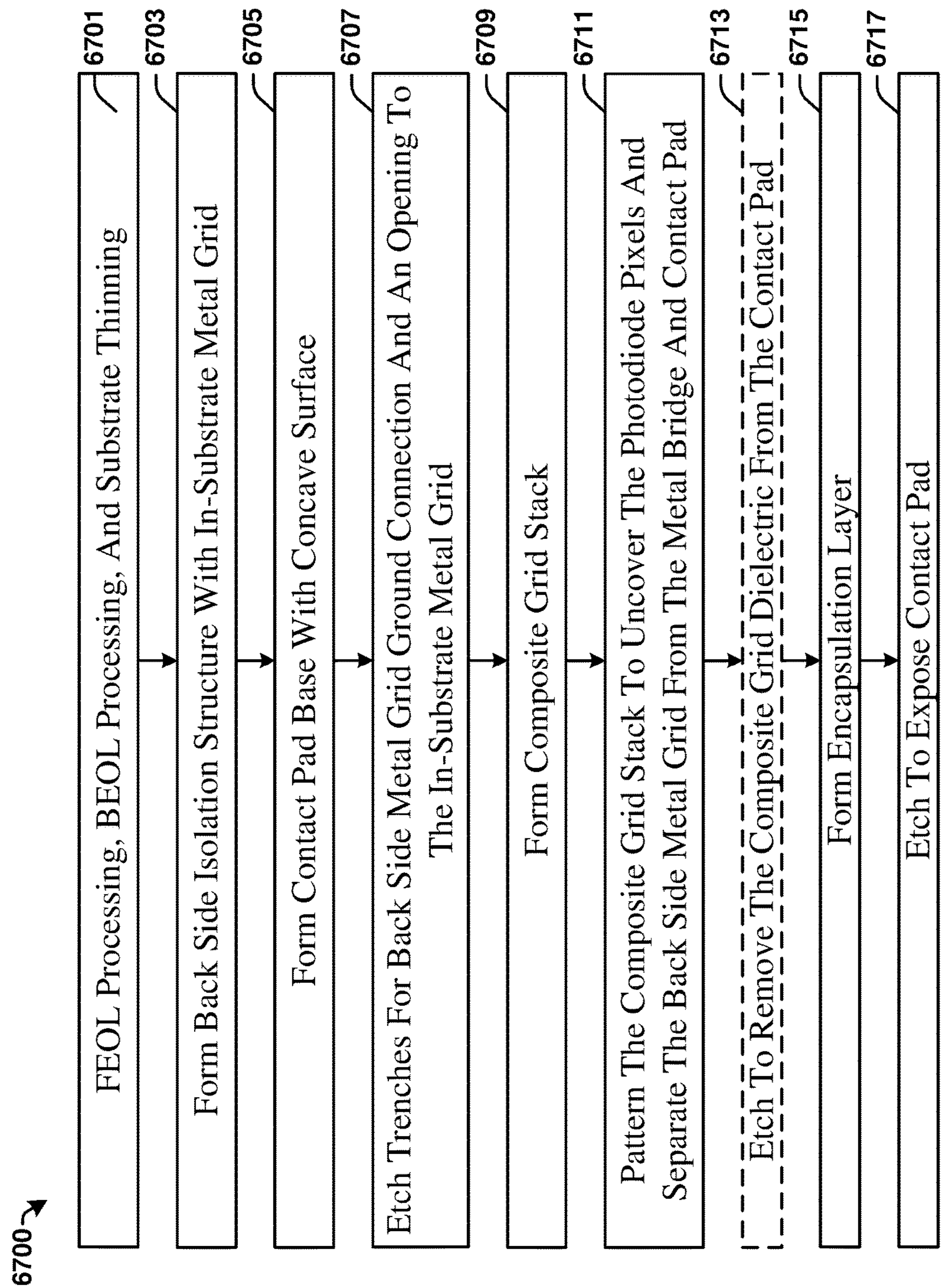

FIG. 67 presents a flow chart for a process 6700 according to the present disclosure which may be used to form the IC device 100F of FIGS. 6A-6D or a like IC device according to the present teachings. While the process 6700 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

Figure 59:
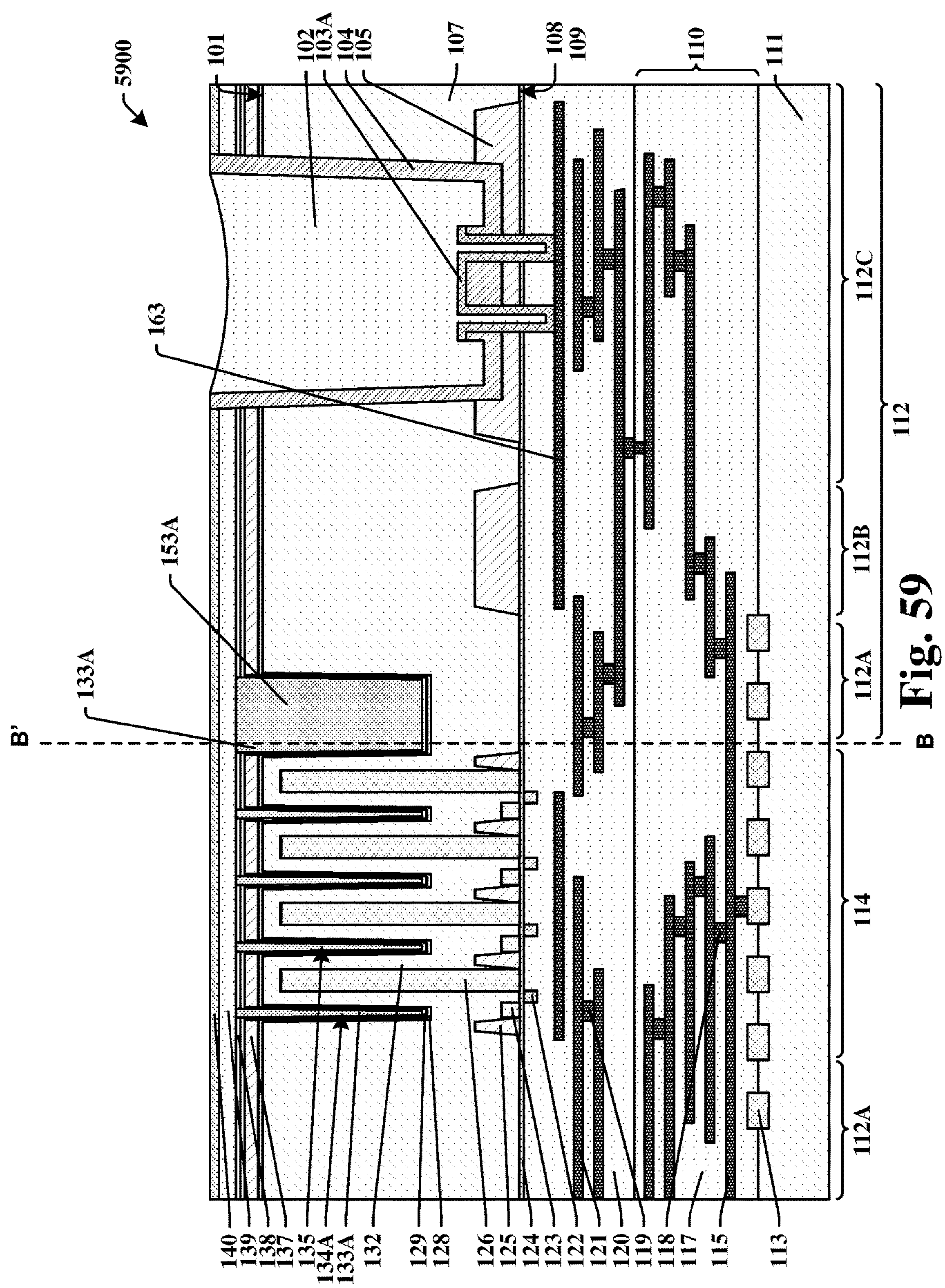
FIGS. 59-64 are a series of cross-sectional view illustrations exemplifying a variation on the method of FIGS. 7A, 7B, and 8-33.

The process 6700 begins with act 6701, FEOL processing including the processing that forms photodetector pixels, BEOL processing that forms a metal interconnect, and substrate thinning. These may be the same act 6501, 6503, and 6505 of the process 6500. The process 6700 continues with act 6703, forming a back side isolation structure include an in-substrate metal grid, and act 6703, forming a contact pad base with a concave surface. The cross-sectional view 5900 of FIG. 59 provides an example of the resulting structure. The back side isolation structure may be formed the same way as in the process 6500 or the process 6600 excluding those aspect of those processes that form the back side TSV.

Act 6705 is forming a contact pad base with a concave surface. The contact pad base may be formed as shown by the cross-sectional views 2100-3100 of FIGS. 21-31. The contact pad base with a concave surface may be formed with fewer process steps, but the cited process steps may also contribute to the formation of contact pads unrelated to biasing the in-substrate metal grid.

The process 6700 continues with act 6707, etching trenches for grounding the back side metal grid and an opening through which a segment of the in-substrate metal grid is exposed. The etching may take place in a peripheral region away from the photodetector pixels. These openings may be etched simultaneously. The cross-sectional view 6000 of FIG. 60 provides an example.

The process 6700 continues with act 6709, depositing a composite grid stack. A base layer of the composite grid stack is a metal. A portion of the metal deposits in the trenches to form a grounding structure. Another portion deposits in the opening through which the in-substrate metal grid is exposed to form a via. Additional portions of the metal layer form a contact pad on the concave surface and a conductive bridge extending laterally from the contact pad on the back side and coupling the contact pad to the via and from the via to the in-substrate metal grid. The cross-sectional view 6100 of FIG. 61 provides an example.

Figure 62:
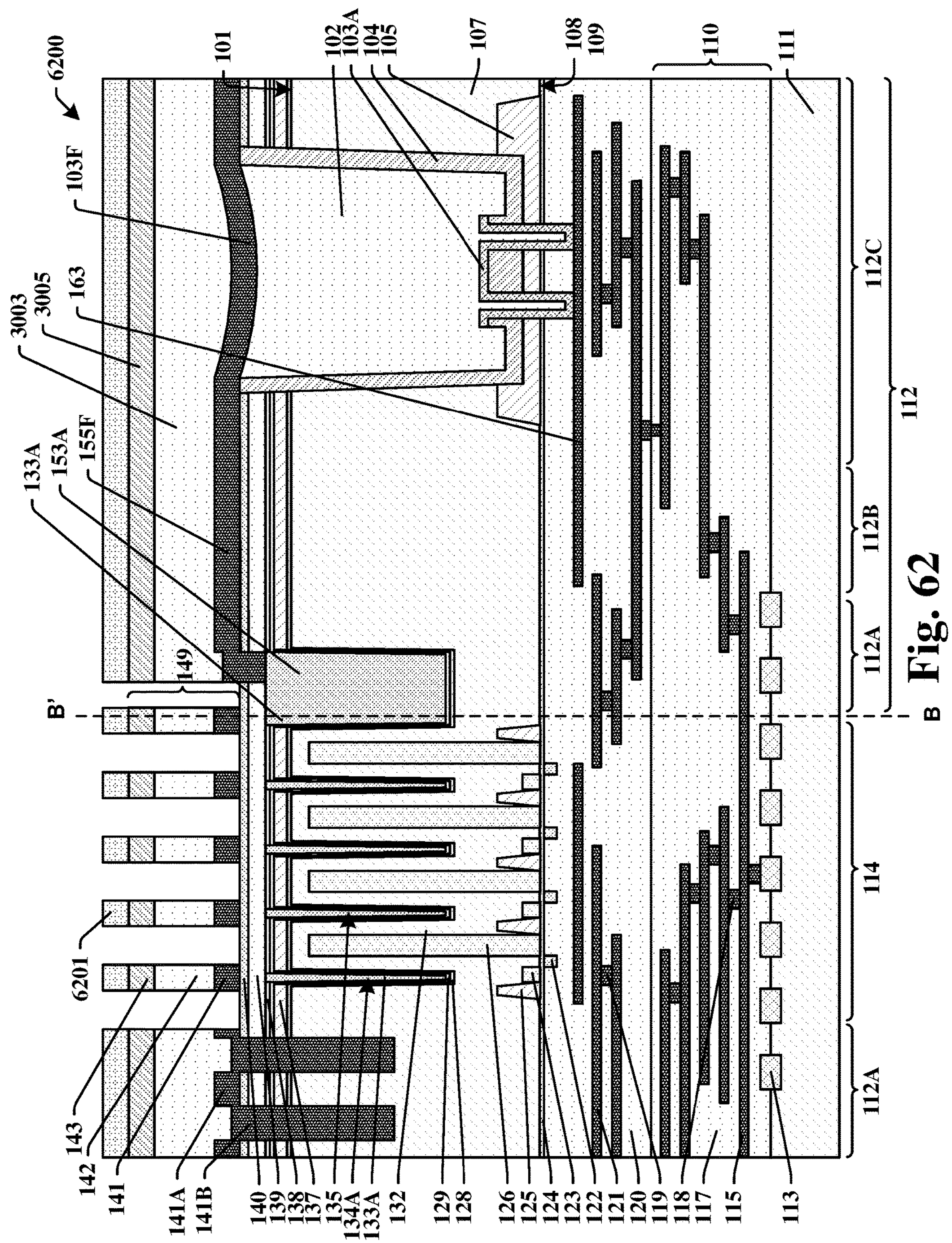

Act 6711 is patterning the composite grid from the composite grid stack. The patterning also separates the composite grid from the structure that includes the via, the contact pad, and the conductive bridge. The cross-sectional view 6200 of FIG. 62 provides an example.

Act 6713 is an optional step of removing the composite grid dielectric and etch stop layer from the contact pad. The cross-sectional view 6300 of FIG. 63 provides an example. This step is optional in that the contact pad may be subsequently exposed without this separate step.

Figure 64:
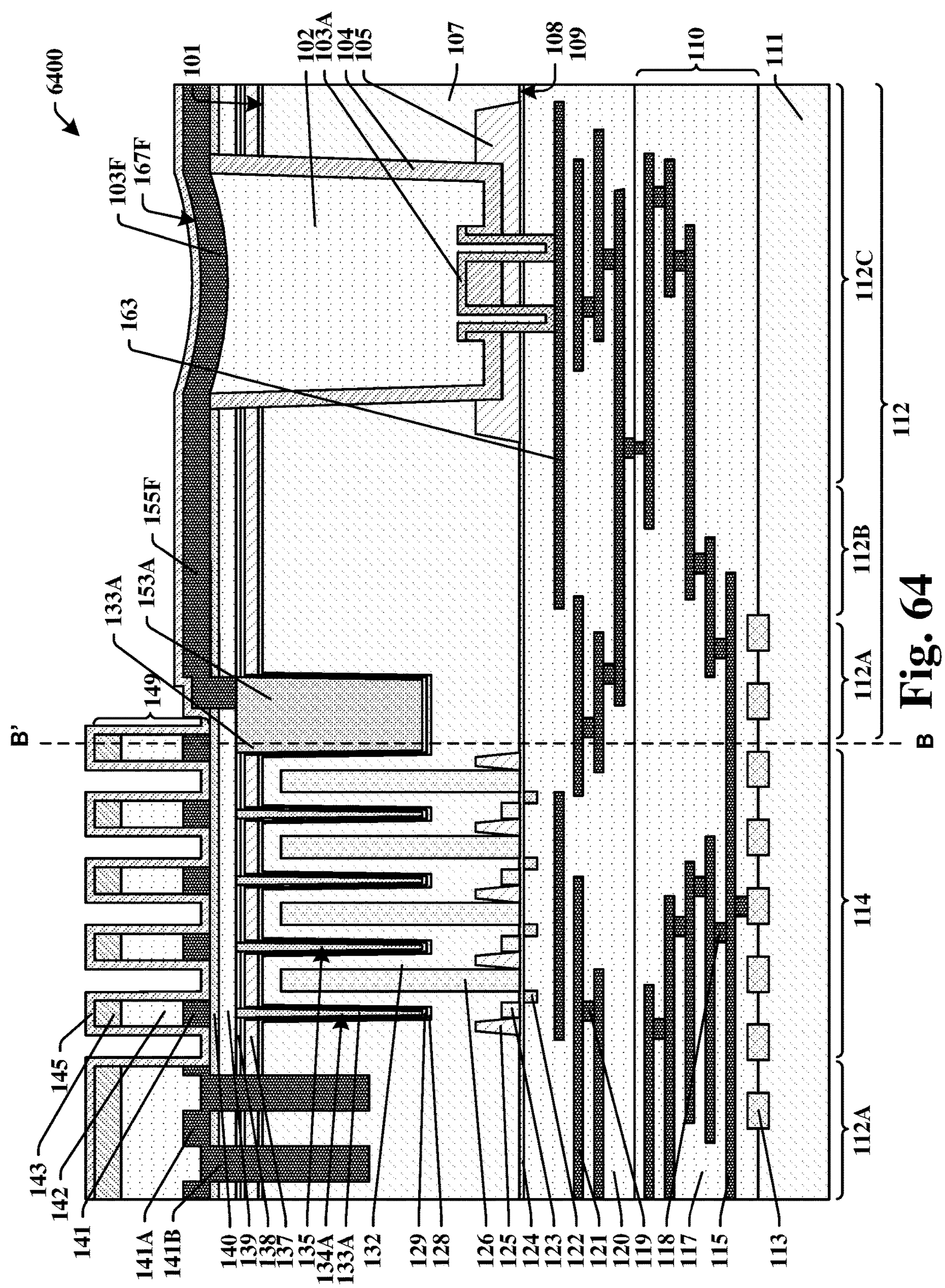

Act 6715 is forming an encapsulation layer over the composite grid and the contact pad. The cross-sectional view 6400 of FIG. 64 provides an example. Act 6717 is etching to expose the contact pad. FIGS. 6A-6D provide an example of the resulting structure.

Figure 68:
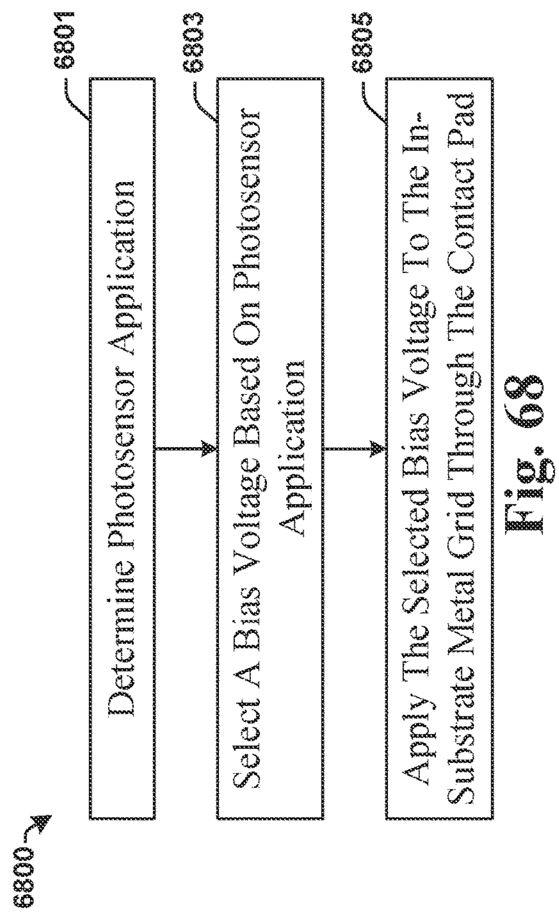
FIGS. 68-71 are flow charts of methods of operation according to various aspects of the present teachings.

FIG. 68 provides a flow chart of a process 6800 that may be applied using an image sensing IC device according to the present disclosure. The process begins with act 6801, determining an application in which the photosensor will be used. Act 6803 is selecting a bias voltage for an in-substrate metal grid based on that application. The selection may be made based on a tradeoff between quantum efficiency against crosstalk that is appropriate for the application. The selection provides a predetermined bias voltage. Act 6805 is applying the predetermined bias voltage to the in-substrate metal grid through a contact pad that is directly coupled to the in-substrate metal grid. In some embodiments, the contact pad is coupled to hardware that provides the predetermined bias voltage.

Figure 69:
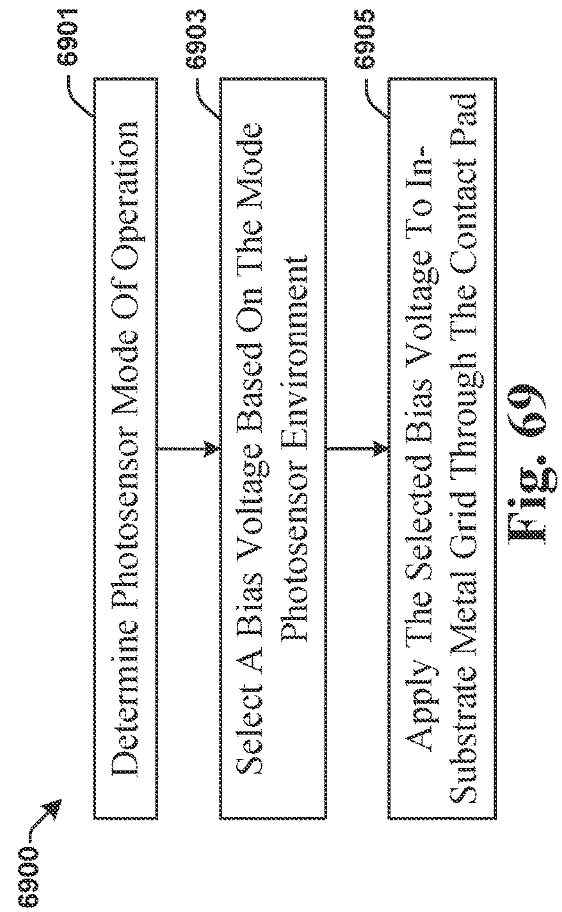

FIG. 69 provides a flow chart of a process 6900 that may be applied using an image sensing IC device according to the present disclosure. The process begins with act 6901, determining a mode of operation for the photo sensor. In some embodiments, the mode of operation is selected dynamically. In some embodiments, the mode of operation is selected by a user. Act 6903 is selecting a bias voltage for an in-substrate metal grid based on that mode of operation. Act 6905 is applying the selected bias voltage to the in-substrate metal grid through a contact pad that is directly coupled to the in-substrate metal grid. In some embodiments, the contact pad is coupled to hardware configured to provide a plurality of discrete voltages.

Figures 70, 71:
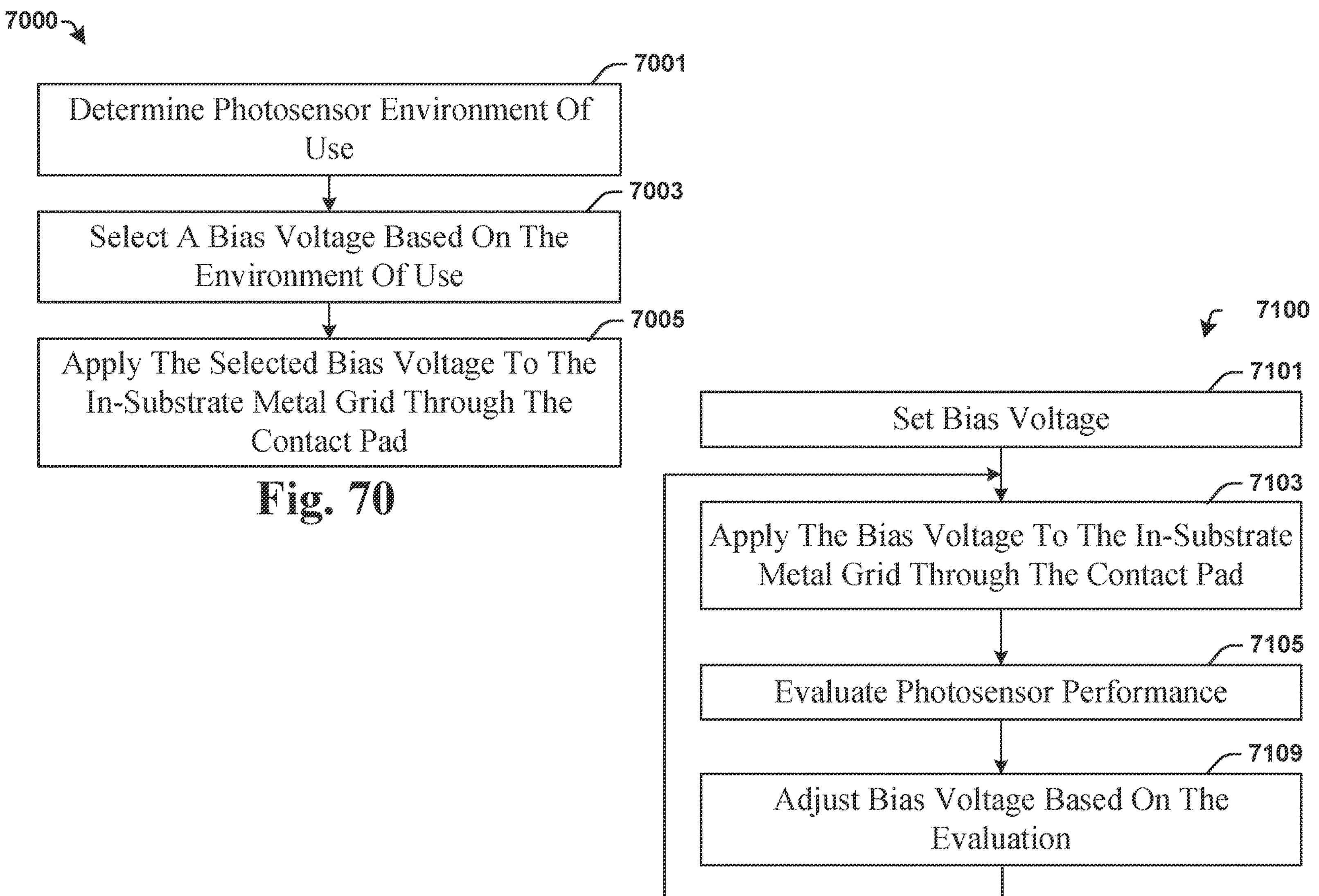

FIG. 70 provides a flow chart of a process 7000 that may be applied using an image sensing IC device according to the present disclosure. The process begins with act 7001, determining an environment of use for the photosensor. In some embodiments, the environment of use is determined by a sensor. In some embodiments, the sensor is a temperature sensor. Act 7003 is selecting a bias voltage for an in-substrate metal grid based on the environment of use. Act 7005 is applying the selected bias voltage to the in-substrate metal grid through a contact pad that is directly coupled to the in-substrate metal grid.

FIG. 71 provides a flow chart of a process 7100 that may be applied using an image sensing IC device according to the present disclosure. The process 7100 uses feedback control to regulate the bias voltage on an in-substrate metal grid. The process begins with act 7101, selecting and initial bias voltage. The process continues with act 7103, applying the bias voltage to the in-substrate metal grid. Act 7105 is evaluating the performance of the photosensor. In some embodiments, this includes obtaining a measurement related to quantum efficiency and obtaining a measurement related to crosstalk. Act 7109 is adjusting the bias voltage selection based on the evaluation. The process then repeats with act 7103, applying the adjusted bias voltage.

Some aspects of the present teachings relate to an image sensor. The image sensor includes a semiconductor substrate having a front side, a back side, a pixel region, and a peripheral region. Photodetector pixels are arranged in an array within the pixel region. A back side isolation structure extends into the back side and between the photodetector pixels. The back side isolation structure includes an in-substrate metal grid and a dielectric liner separating the in-substrate metal grid from the semiconductor substrate. There is a contact pad in the peripheral region. One or more conductive structures couple the in-substrate metal grid directly to the contact pad.

Some aspects of the present teachings relate to an image sensor. The image sensor includes a semiconductor substrate having a front side, a back side, a pixel region, and a peripheral region. Photodetector pixels are arranged in an array within the pixel region. A back side isolation structure extends into the back side and between the photodetector pixels. The back side isolation structure includes an in-substrate metal grid and a dielectric liner separating the in-substrate metal grid from the semiconductor substrate. There is a contact pad in the peripheral region. The in-substrate metal grid is coupled to the contact pad so that a voltage on the in-substrate metal grid is continuously variable with a voltage on the contact pad.

Some aspects of the present teachings relate to a method that includes providing a semiconductor substrate including a front side, a back side, a pixel region, a peripheral region, and an array of photodetector pixels within the pixel region. A back side isolation structure is formed on the back side and includes a metal grid that extends into the semiconductor substrate between photodetector pixels in the array. A contact pad coupled to the metal grid is formed on the back side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing a semiconductor substrate including a front side, a back side, a pixel region, a peripheral region, and photodetector pixels in an array within the pixel region;

forming a back side isolation structure including a metal grid with segments extending into the semiconductor substrate between the photodetector pixels;

forming a dielectric layer, wherein the dielectric layer is over the metal grid;

forming an opening in the dielectric layer, wherein the metal grid is exposed through the opening; and depositing a metal layer, wherein depositing the metal layer fills the opening and simultaneously creates a contact pad on the back side, a via intersecting the metal grid, and a conductive bridge extending from the via to the contact pad on the back side;

wherein the metal grid is electrically isolated from the semiconductor substrate and electrically coupled to the contact pad.

2. The method of claim 1, wherein depositing the metal layer creates a back side metal grid over the metal grid.

3. The method of claim 2, wherein the back side metal grid has an elevation over the back side greater than or equal to the contact pad.

4. The method of claim 2, further comprising, forming a second opening, wherein the second opening extend through the dielectric layer, the semiconductor substrate is exposed through the second opening, depositing the metal layer fills the second opening to create a ground bar, and the back side metal grid is electrically connected to the semiconductor substrate through the ground bar.

5. The method of claim 4, wherein the second opening extends into the semiconductor substrate.

6. The method of claim 1, wherein forming the back side isolation structure comprises etching trenches in the semiconductor substrate from the back side and filling the trenches.

7. The method of claim 1, wherein the metal grid comprises aluminum or tungsten.

8. The method of claim 1, wherein the metal layer comprises aluminum, tungsten or copper.

9. The method of claim 1, wherein the contact pad is formed opposite an unused contact pad proximate the front side.

10. A method of manufacturing an image sensing integrated circuit device, the method comprising:

providing a semiconductor substrate including a first side, a second side, a pixel region, and a peripheral region;

forming photodiodes in an array in the pixel region;

thinning the semiconductor substrate from the second side;

forming a grid of trenches in the second side, wherein the grid comprises segments that extend between adjacent photodiodes in the array;

filling the trenches, wherein filling the trenches comprises depositing a conductive material in the trenches so that the conductive material forms an in-substrate metal grid;

forming a dielectric layer over the in-substrate metal grid; and forming an opening in the dielectric layer, wherein the in-substrate metal grid is exposed through the opening; and depositing a metal layer, wherein depositing the metal layer fills the opening and simultaneously creates a via intersecting the in-substrate metal grid, a contact pad on the second side, a conductive bridge extending from the via to the contact pad on the second side, and a back side metal grid over the dielectric layer in the pixel region, wherein the back side metal grid is formed above the in-substrate metal grid.

11. The method of claim 10, wherein:

the in-substrate metal grid extends over the second side; and the conductive bridge is above the in-substrate metal grid on the second side.

12. The method of claim 10, wherein the in-substrate metal grid extends into the peripheral region.

13. The method of claim 12, via is in the peripheral region.

14. The method of claim 12, further comprising:

depositing a second dielectric layer over the metal layer; and patterning the second dielectric layer together with the metal layer, wherein patterning defines the back side metal grid from the metal layer.

15. The method of claim 10, wherein the conductive bridge and the contact pad are a continuous structure having a homogeneous composition.

16. The method of claim 10, wherein in-substrate metal grid is electrically isolated from the semiconductor substrate.

17. The method of claim 10, wherein the contact pad is formed opposite an unused contact pad proximate the first side.

18. A method of manufacturing an image sensing integrated circuit device, the method comprising:

providing a semiconductor substrate including a first side, a second side, a pixel region, and a peripheral region;

forming photodetector pixels in an array in the pixel region;

thinning the semiconductor substrate from the second side;

forming an isolation structure that extends between adjacent pairs of the photodetector pixels and comprises an in-substrate metal grid; and forming a dielectric layer over the isolation structure;

forming a first opening in the dielectric layer, wherein the in-substrate metal grid is exposed through the opening; and depositing a metal layer, wherein depositing the metal layer fills the first opening and simultaneously creates, a contact pad in the peripheral region on the second side, a via intersecting the in-substrate metal grid, and a conductive bridge extending from the via to the contact pad, wherein the in-substrate metal grid is coupled to the contact pad so that a voltage on the in-substrate metal grid is continuously variable with a voltage on the contact pad; and the in-substrate metal grid is electrically isolated from a ground voltage of the semiconductor substrate.

19. The method of claim 18, wherein the coupling between the in-substrate metal grid and the contact pad bypasses the first side.

20. The method of claim 18, further comprising:

forming a second opening extending through the dielectric layer, wherein the semiconductor substrate is exposed in the second hole opening; and depositing the metal layer fills the second opening and creates ground bars in the second opening.

* * * * *